(12) United States Patent
Azegami et al.

(10) Patent No.: US 6,404,224 B1
(45) Date of Patent: Jun. 11, 2002

(54) CHAIN-CONNECTED SHIFT REGISTER AND PROGRAMMABLE LOGIC CIRCUIT WHOSE LOGIC FUNCTION IS CHANGEABLE IN REAL TIME

(75) Inventors: Kengo Azegami; Koichi Yamashita, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/338,596

(22) Filed: Jun. 23, 1999

Related U.S. Application Data

(62) Division of application No. 08/768,098, filed on Dec. 16, 1996.

(30) Foreign Application Priority Data

Dec. 19, 1995 (JP) ............................................. 7-330872
Nov. 19, 1996 (JP) ............................................. 8-308458

(51) Int. Cl.$^7$ ............................................. H03K 19/173
(52) U.S. Cl. ............................. 326/38; 326/39; 326/41
(58) Field of Search ............................. 326/37–39, 41, 326/40

(56) References Cited

U.S. PATENT DOCUMENTS

| | | | |
|---|---|---|---|
| 4,975,932 A | 12/1990 | Matsushima et al. | ......... 377/81 |
| 5,132,993 A | 7/1992 | Nishiura et al. | ............... 377/79 |
| 5,159,616 A | 10/1992 | Douglas et al. | ................ 377/79 |
| 5,426,378 A * | 6/1995 | Ong | ............................. 326/38 |
| 5,426,379 A * | 6/1995 | Trimberger | ................... 326/39 |
| 5,600,263 A * | 2/1997 | Trimberger et al. | .......... 326/41 |
| 5,646,544 A * | 7/1997 | Iadanza | ....................... 326/38 |
| 5,760,602 A * | 6/1998 | Tan | ............................. 326/38 |

* cited by examiner

*Primary Examiner*—Michael Tokar
*Assistant Examiner*—Steven S. Paik
(74) *Attorney, Agent, or Firm*—Arent Fox Kintner Plotkin & Kahn, PLLC

(57) ABSTRACT

A shift register having a plurality of circuit cells successively connected in a chain formation is proposed. Each of the circuit cells includes a first inversion gate, a first transmission gate, connected to an output of the first inversion gate, being switched by a clock, and a second inversion gate connected to an output of the first transmission gate. The circuit cell further includes a first P-channel transistor, connected between an output of the second inversion gate and an input of the first inversion gate, being switched by the clock, a second transmission gate, connected to the output of the second inversion gate, being switched by an inversion clock, and a second P-channel transistor, connected to the output of the first transmission gate, being switched by the inversion clock. In the shift register, the plurality of circuit cells are successively connected such that the input of the first inversion gate of the circuit cell is connected to an output of a second transmission gate of a former-stage circuit cell, and the output of the first inversion gate of the circuit cell is connected to an output of a second P-channel transistor of the former-stage circuit cell.

25 Claims, 59 Drawing Sheets

FIG.18
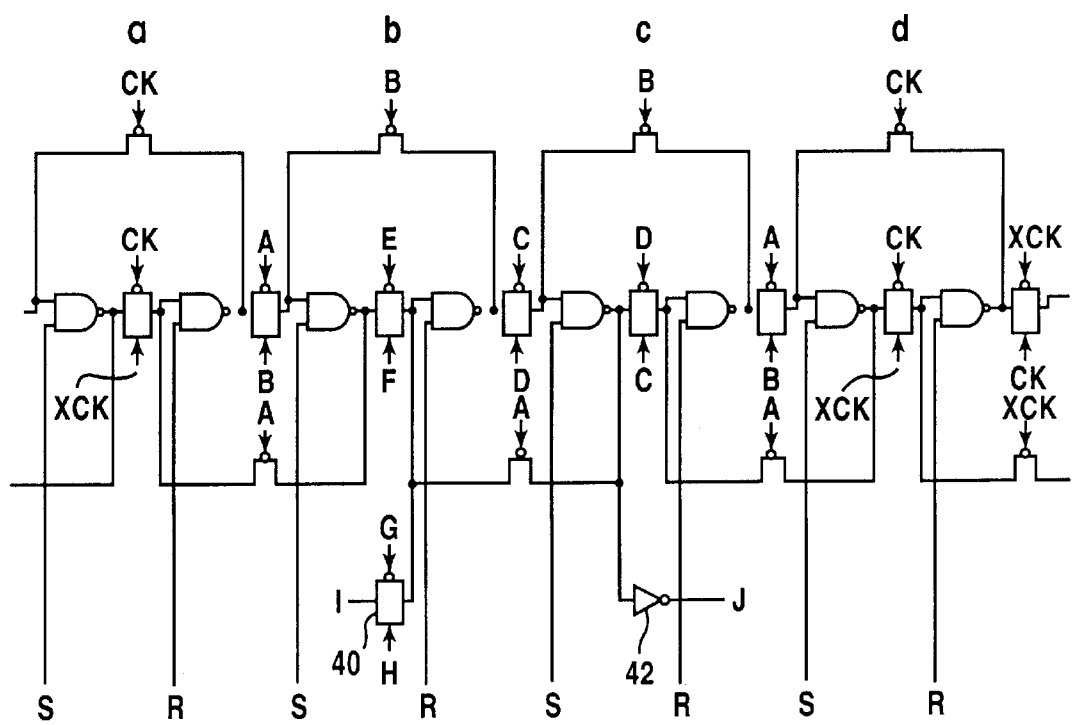
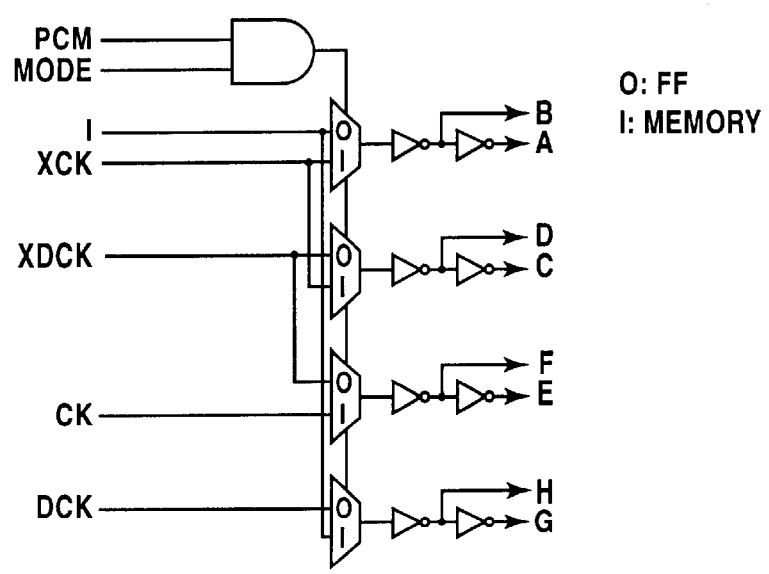
O: FF
I: MEMORY

FIG.19
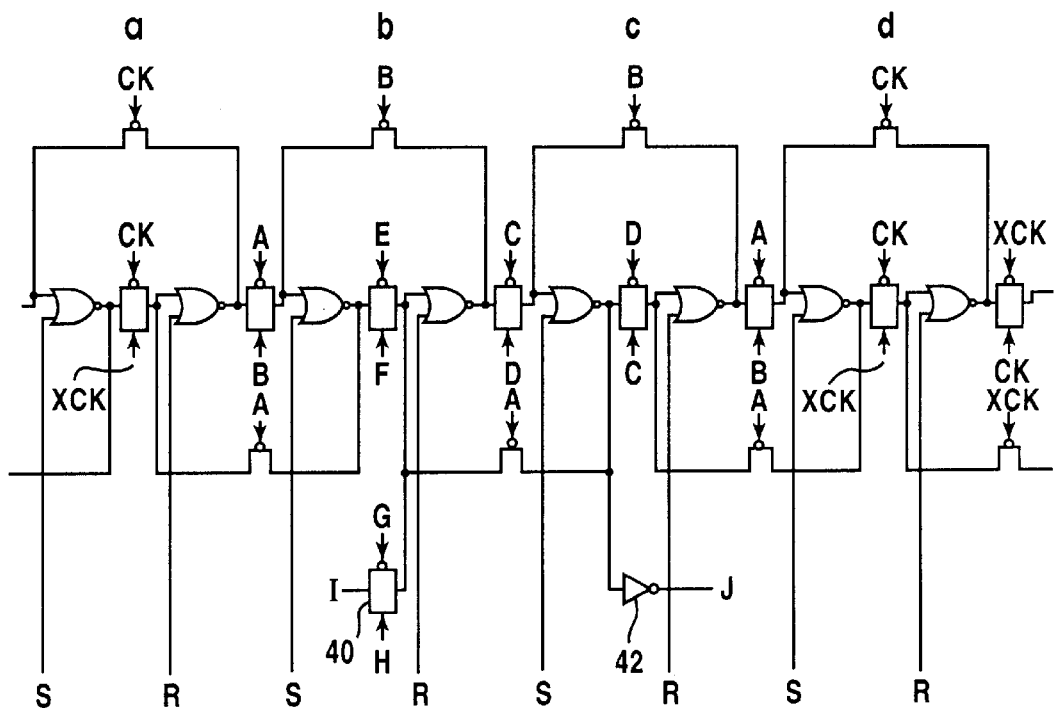
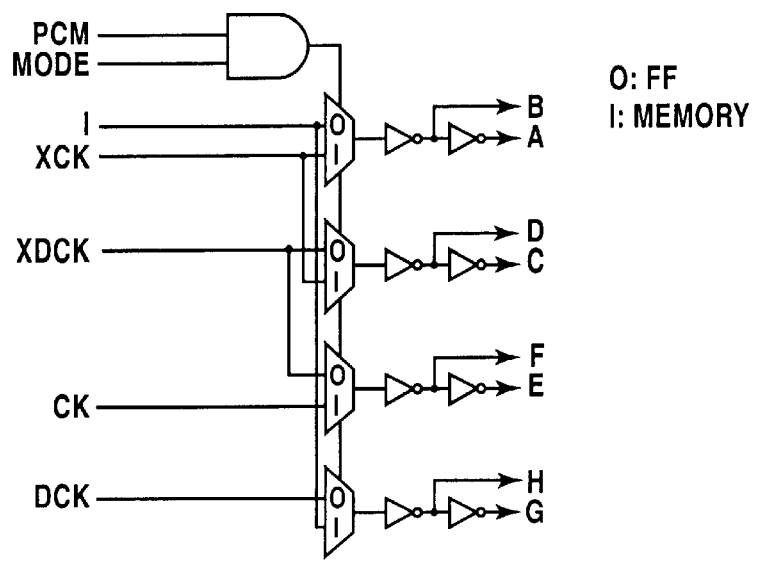
O: FF
I: MEMORY

CHAIN-CONNECTED SHIFT REGISTER AND PROGRAMMABLE LOGIC CIRCUIT WHOSE LOGIC FUNCTION IS CHANGEABLE IN REAL TIME

This application is a divisional application filed under 37 CFR §1.53(b) of patent application Ser. No. 08/768,098, filed Dec. 16, 1996.

BACKGROUND OF THE INVENTION

1. Field of the Invention

The present invention generally relates to a shift register and a programmable logic circuit, and more particularly, to a chain-connected shift register and a programmable logic circuit using the chain-connected shift register which may be constructed with an extremely small size.

The present invention is further directed to a programmable logic circuit and a programmable-logic-circuit system constructed with a plurality of programmable logic circuits, whose logic functions are changeable during a circuit operation. Therefore, a number of realizable logic circuits in the programmable logic circuit may be significantly increased.

2. Description of the Related Art

For a programmable logic circuit, for example, a field programmable gate array (FPGA) is commonly well known. FIG. 1 shows a block diagram of a typical configuration example of the field programmable gate array (FPGA). The FPGA has a plurality of logic cells, each of which may program a desired logic circuit, and a plurality of wires which can flexibly connect the plurality of logic cells to each other. By providing configuration data describing a configuration of the logic circuit into each logic cell, a large number of logic circuits may be flexibly provided. For methods of storing the configuration data, at present, the following three types of FPGA are used.

I. SRAM-program-type FPGA

The configuration data is stored in a SRAM memory cell. Functions of the logic circuit may be repeatedly changed. When manufacturing the FPGA, there is no need for a specific process technique.

II. Nonvolatile-memory-program-type FPGA

The configuration data is stored in a nonvolatile memory such as an EEPROM or a flash memory. In the same way as the SRAM-program-type FPGA, functions of the logic circuit may be repeatedly changed. However, when manufacturing the FPGA, there is a need for a specific process technique.

III. Antifuse-program-type FPGA

According to the configuration data, conditions of switches (anti fuses) provided on an LSI chip are permanently determined. After programing is finished, functions of the logic circuit may not be changed. When manufacturing the FPGA, there is a need for a specific process technique.

Further, by flexibly connecting and combining a plurality of programmable logic circuits, a still further large number of logic circuits may be constructed, which are referred to as a programmable-logic-circuit system.

In addition, recently, in order to carry out a logic operation test of the large number of logic circuits on a circuit board which is in practical use, a hardware emulator is developed. In the hardware emulator, a plurality of FPGAs are connected to each other in a programed condition, and the large number of logic circuits are constructed. As compared to a software simulator operable in a work station, the hardware emulator is operable at a high speed more than 100 times the operation speed of the software simulator. Therefore, the hardware emulator may be widely used for developing a microprocessor, etc.

In the SRAM-program-type FPGA, the configuration data is commonly serially loaded into a configuration memory. Therefore, in general, the configuration memory is constructed with a shift register.

Further, the shift register may be commonly constructed by connecting a plurality of D-type flip-flops in series. FIG. 2 shows a schematic diagram of a typical CMOS-D-type flip-flop. In the D-type flip-flop, by connecting an inverter INV and a transmission gate TG in a ring formation, a closed loop is formed. An input signal provided to an input terminal IN is transmitted to an output terminal OUT through a master-slave latch constructed with two closed loops. The D-type flip-flop shown in FIG. 2 has 16 MOS transistors. Therefore, a prior-art shift register constructed with such D-type flip-flops requires a relatively large area on an LSI chip.

Particularly, since the SRAM-program-type FPGA requires hundreds of thousands of stages of shift registers in order to store the configuration data, an extremely large area of the FPGA chip is used for the configuration memory constructed with the shift registers. In general, performance of the FPGA is evaluated by an equivalent gate number per unit area (evaluation index indicating a number of gates corresponding to realizable maximum logic circuits). Therefore, to improve performance of the FPGA, there is a need for miniaturizing a size of the configuration memory constructed with the shift register, and for reducing a ratio of a memory area to an overall chip area.

For miniaturizing the shift register, it is well known that it is advantageous to use a chain-latch-structure shift register. FIG. 3 shows a schematic diagram of a prior-art chain-latch-structure shift register. FIG. 4 shows an illustration for explaining an operation of the prior-art chain-latch-structure shift register shown in FIG. 3.

In FIG. 4, a signal provided to a terminal K, when a switch C is turned on and switches E, F are turned off, passes an inverter D and transmits to an output terminal of the inverter D. After that, when the switch C is turned off and the switches E, F are turned on, a value of the provided signal is held in a closed loop A. After the value in the closed loop A stabilizes and is fixed, the switch C is turned on and the switches E, F are turned off again, and also, switches H and I are turned on. At this time, until an output value of an inverter G changes, it is necessary to operate a switch H and fix an output of an inverter J. If the switch I is turned before the output of the inverter J is fixed, a value to be held in a closed loop B may be lost by a value which has been held in a closed loop A'.

There is the following disadvantage in the above-discussed prior-art chain-latch-structure shift register.

When the above-discussed chain-latch-structure shift register is practically constructed, dispersion in operation performance may occur due to performance of the switches constructing the shift register, wire-load capacitance, timing of a supplied clock, etc. Therefore, it is difficult to obtain a stable operation in that shift register.

Further, in the prior-art programmable logic circuit, there is the following disadvantage.

In general, for methods of constituting the flip-flop using the logic cell in the programmable logic circuit, the following two methods are known:

I. Individual Flip-flop Type

In the logic cell, the flip-flop is individually provided in addition to a programmable function unit. Input and output of the flip-flop are controlled by the configuration data.

II. Program Feedback Type

In the programmable function unit provided in the logic cell, a feedback path is provided. When a connecting instruction is produced from the configuration data, the flip-flop is established.

In both the types, a number of the realizable flip-flops in the programmable logic circuit is determined by a number of the logic cells. Therefore, to increase the number of the realizable flip-flops, it is required to increase the number of the logic cells. However, this requirement causes the chip area of the programmable logic circuit to increase.

In addition, in the prior-art programmable logic circuit and the prior-art programmable-logic-circuit system, before the circuit operation is started, the configuration data is loaded into the configuration memory to determine logic functions of the programmable function unit. After the configuration data is loaded, the programmable logic circuit is operative according to the logic functions determined by the configuration data until all configuration data-in the programmable logic circuit is changed.

Namely, the logic functions programmed in the programmable logic circuit are fixed until the operation according to the logic functions is finished. Therefore, to increase the-realizable logic functions (or corresponding gate number) in the programmable logic circuit and the programmable-logic-circuit system, it is required to enlarge a size of the logic cell and to increase the number of logic cells. In this case, these requirements also cause the chip area of the programmable logic circuit to increase.

SUMMARY OF THE INVENTION

It is an object of the present invention to provide a small-sized shift register. Using the shift register, a circuit constructed with a large number of shift registers, for example, a configuration memory in a programmable logic circuit, may be miniaturized.

It is another object of the present invention to provide a programmable logic circuit in which a number of realizable flip-flops may be increased.

It is still another object of the present invention to provide a programmable logic circuit and a programmable-logic-circuit system. In the circuit and system, configuration data in the configuration memory may be changed during operation of the circuit and system. Also, a portion of the programmable logic circuit may be flexibly initialized. Therefore, a number of realizable logic circuits (corresponding to a substantially realizable gate number) in the programmable logic circuit and the programmable-logic-circuit system can be increased. As a result, cost of the programmable logic circuit and the programmable-logic-circuit system may be extremely reduced.

This permits the disadvantages described above to be eliminated.

The object described above is achieved by a shift register having a plurality of circuit cells successively connected in a chain formation, each of the circuit cells comprising: a first inversion gate; a first transmission gate, connected to an output of the first inversion gate, being switched by a clock; a second inversion gate connected to an output of the first transmission gate; a first P-channel transistor, connected between an output of the second inversion gate and an input of the first inversion gate, being switched by the clock; a second transmission gate, connected to the output of the second inversion gate, being switched by an inversion clock; and a second P-channel transistor, connected to the output of the first transmission gate, being switched by the inversion clock; wherein the plurality of circuit cells are successively connected such that the input of the first inversion gate of the circuit cell is connected to an output of a second transmission gate of a former-stage circuit cell, and the output of the first inversion gate of the circuit cell is connected to an output of a second P-channel transistor of the former-stage circuit cell.

According to the above-discussed shift register, a transmission time for passing through a main signal path is less than that for passing through a feedback circuit. Therefore, operation timing in the chain-latch-structure shift register may be stabilized.

By using the above-discussed chain-latch-structure shift register, a number of gates and a chip area for constituting the shift register may be reduced to less than half of those of a prior-art shift register. Further, in a programmable logic circuit using a large number of shift registers for a memory, a chip area for the memory may be reduced, and a number of realizable logic circuits for the chip area may be increased.

The object described above is also achieved by the shift register mentioned above, further comprising a clock supplying circuit for supplying the clock and the inversion clock, the clock supplying circuit having a first buffer circuit buffering an input clock and producing the clock and a second buffer circuit inverting the input clock and producing the inversion clock, wherein as least one of the first buffer circuit and the second buffer circuit has an inverter whose transistor parameter is adjusted so that a driving ability on a P-channel transistor side is substantially equal to or larger than that on an N-channel transistor side.

The object described above is also achieved by the shift register mentioned above, further comprising a clock supplying circuit for supplying the clock and the inversion clock, the clock supplying circuit having a first buffer circuit buffering an input clock to produce the clock and a second buffer circuit inverting the input clock to produce the inversion clock, wherein as least one of the first buffer circuit and the second buffer circuit has an inverter in which a number of P-channel transistors is substantially larger than that of N-channel transistors.

According to the above-discussed shift register, the driving ability on the P-channel transistor side is substantially larger than that on the N-channel transistor side. Therefore, in the clock output of the clock supplying circuit, a rising time of the clock edge may be substantially the same as a falling time thereof. By the above-discussed conditions, a stable operation of the chain-latch-structure shift register may be positively carried out.

The object described above is also achieved by the shift register mentioned above, further comprising a state setting circuit, connected to one input terminal of a first NAND gate and one input terminal of a second NAND gate, for setting a state in the circuit cell.

The object described above is also achieved by the shift register mentioned above, further comprising a state setting circuit, connected to one input terminal of a first NOR gate and one input terminal of a second NOR gate, for setting a state in the circuit cell.

According to the above-discussed shift register, by the state setting circuit, the internal state in the chain-latch-structure shift register may be flexibly set.

The object described above is also achieved by the shift register mentioned above, wherein each of the circuit cells further comprises a data output terminal, and the shift register further comprises a decoder circuit, connected to the data output terminals of the circuit cells, producing one data set from the data output terminals according to a control input signal.

According to the above-discussed shift register, by providing the control signal to the decoder circuit, an output according to the logic function determined by the memory data is obtained. Namely, with the decoder circuit and the shift register, a desired logic circuit may be constructed.

The object described above is also achieved by the shift register mentioned above, further comprising a clock control circuit connected to clock input terminals of the first and second transmission gates and the first and second P-channel transistors of selected ones of the circuit cells, the clock control circuit supplying the clock and the inversion clock to the clock input terminals in a-first mode, and supplying a given signal to selected ones of the clock input terminals so as to isolate the part of the circuit cells from the remaining circuit cells and supplying a signal to the remaining clock input terminals in a second mode, wherein in the second mode, the selected ones of the circuit cells are operable as a flip-flop.

The object described above is also achieved by a programmable logic circuit having a configuration memory being providing with configuration data, and at least one logic cell operating with a desired logic function according to the configuration data, the configuration memory including a shift register which has a plurality of circuit cells successively connected in a chain formation, each of the circuit cells comprising: a first inversion gate; a first transmission gate, connected to an output of the first inversion gate, being switched by a clock; a second inversion gate connected to an output of the first transmission gate; a first P-channel transistor, connected between an output of the second inversion gate and an input of the first inversion gate, being switched by the clock; a second transmission gate, connected to the output of the second inversion gate, being switched by an inversion clock; and a second P-channel transistor, connected to the output of the first transmission gate, being switched by the inversion clock; wherein the plurality of circuit cells are successively connected such that the input of the first inversion gate of the circuit cell is connected to an output of a second transmission gate of a former-stage circuit cell, and the output of the first inversion gate of the circuit cell is connected to an output of a second P-channel transistor of the former-stage circuit cell.

According to the above-discussed shift register and the programmable logic circuit, by the given signal to selected ones of the circuit cells in the chain-latch-structure shift register, the selected ones of the circuit cells are operable as a flip-flop. Therefore, when the above-discussed shift register is applied to the configuration memory of the programmable logic circuit, a part of the configuration memory may be used for a flip-flop. As a result, a number of realizable flip-flops in the logic cell may be increased.

The object described above is also achieved by the programmable logic circuit mentioned above, wherein each of the first and second inversion gates has one of a NAND gate and a NOR gate, and a state of the circuit cell is set by supplying a given signal from one of the NAND gate and the NOR gate to the circuit cell.

According to the above-discussed programmable logic circuit, the state of the circuit cell in the logic cell may be flexibly set.

The object described above is also achieved by a programmable logic circuit programming a desired circuit function according to configuration data, the programmable logic circuit comprising a plurality of partial circuits, wherein during operation of the programmable logic circuit, when a control signal is applied to at least one partial circuit in the programmable logic circuit, a circuit function previously realized in the at least one partial circuit is changed to another circuit function without influencing an operation of other partial circuits in an operating condition.

The object described above is also achieved by a programmable-logic-circuit system programming a desired circuit function according to configuration data, the programmable-logic-circuit system comprising a plurality of second partial circuits which respectively include programmable logic circuits, wherein during operation of the programmable-logic-circuit system, when a control signal is applied to at least one second partial circuit in the programmable-logic-circuit system, a circuit function previously realized in the at least one second partial circuit is changed to another circuit function without influencing an operation of other second partial circuits in an operating condition.

According to the above-discussed programmable logic circuit and programmable-logic-circuit system, when the programmable logic circuit or the programmable-logic-circuit system is in an operating condition, the circuit function programed in at least one partial circuit may be changed without influencing the operation of other partial circuits in the operating condition. By changing of the circuit function, the logic function, the connection function, and the data input-and-output function may be changed. Accordingly, a number of programmable circuits may be increased larger than that physically determined by a number of gates.

The object described above is also achieved by the programmable logic circuit mentioned above, further comprising at least one configuration-data server providing configuration data to at least one of the partial circuits through one of a dedicated wire line and a programmable wire line.

The object described above is also achieved by the programmable-logic-circuit system mentioned above, further comprising at least one configuration-data server providing configuration data to at least one of the second partial circuits through one of a dedicated wire line and a programmable wire line.

According to the above-discussed programmable logic circuit and programmable-logic-circuit system, the configuration-data server for supplying the configuration data is included, and the configuration data is provided to the partial circuits through the dedicated wire line or the programmable wire line. Therefore, the configuration data may be efficiently provided to the partial circuits, and, thus, circuit configurations of the programmable logic circuit and the programmable-logic-circuit system may be simplified.

The object described above is also achieved by the programmable logic circuit mentioned above, wherein at least one of the partial circuits comprises a storage device storing a plurality of configuration data, wherein when the plurality of configuration data are switched by an external control signal, a previously programed circuit function in the partial circuit is instantaneously changed to another circuit function.

The object described above is also achieved by the programmable-logic-circuit system mentioned above, wherein at least one of the second partial circuits comprises a storage device storing a plurality of configuration data, wherein when the plurality of configuration data are switched by an external control signal, a previously programed circuit function in the second partial circuit is instantaneously changed to another circuit function.

According to the above-discussed programmable logic circuit and programmable-logic-circuit system, the partial circuit includes the storage circuit storing a plurality of configuration data. Therefore, by switching the configuration data, the circuit function realized in the partial circuit may be instantaneously changed.

The object described above is also achieved by the programmable logic circuit mentioned above, further comprising an interface connecting to the programmable logic circuit at least one external configuration-data server which provides configuration data to at least one of the plurality of partial circuits.

The object described above is also achieved by the programmable-logic-circuit system mentioned above, further comprising an interface connecting to the programmable-logic-circuit system at least one external configuration-data server which provides configuration data to at least one of the plurality of second partial circuits.

According to the above-discussed programmable logic circuit and programmable-logic-circuit system, the interface for connecting the configuration-data server is provided. Therefore, since the configuration-data server may be provided outside of the programmable logic circuit and the programmable-logic-circuit system, the programmable logic circuit and the programmable-logic-circuit system may be simplified. Further, for the configuration-data server, a large size and high performance device such as a personal computer is usable.

The object described above is also achieved by the programmable logic circuit mentioned above, further comprising a control device selecting a given partial circuit from the plurality of partial circuits through one of a dedicated wire line and a programmable wire line, and selectively changing a circuit function of the given partial circuit to another circuit function.

The object described above is also achieved by the programmable-logic-circuit system mentioned above, further comprising a control device selecting a given second partial circuit from the plurality of second partial circuits through one of a dedicated wire line and a programmable wire line, and selectively changing a circuit function of the given second partial circuit to another circuit function.

According to the above-discussed programmable logic circuit and programmable-logic-circuit system, the control device selectively changing the circuit function of the given partial circuit is provided. The control device is connected to the partial circuit through the dedicated wire line or the programmable wire line. Therefore, when the programmable logic circuit is in an operating condition, only the circuit function of the given partial circuit may be efficiently changed.

The object described above is also achieved by the programmable logic circuit mentioned above, further comprising an interface connecting to the programmable logic circuit an external control device which selects a given partial circuit from the plurality of partial circuits and selectively changes a circuit function of the given partial circuit to another circuit function.

The object described above is also achieved by the programmable-logic-circuit system mentioned above, further comprising an interface connecting to the programmable-logic-circuit system an external control device which selects a given second partial circuit from the plurality of second partial circuits and selectively changes a circuit function of the given second partial circuit to another circuit function.

According to the above-discussed programmable logic circuit and programmable-logic-circuit system, the interface for connecting the control device is provided. Therefore, since the control device may be provided outside of the programmable logic circuit and the programmable-logic-circuit system, the programmable logic circuit and the programmable-logic-circuit system may be simplified. Further, for the control device, a large size and high performance device such as a personal computer is usable.

The object described above is also achieved by the programmable logic circuit mentioned above, wherein the logic cell comprises an output-data holding circuit for holding output data of the logic cell, wherein when the programmable logic circuit is operating and when a programed circuit function in the logic cell-is being changed, the output data of the circuit cell is held by the output-data holding circuit so as to prevent from influencing other partial circuits in an operating condition.

According to the above-discussed programmable logic circuit, when the circuit function realized in the logic cell is changed, the output of the logic cell is held by the output-data holding circuit. Therefore, even when the circuit function of the given logic cell is changed, it is prevented from influencing the operation of other logic cells in an operating condition.

The object described above is also achieved by the programmable logic circuit mentioned above, wherein the shift register comprises a chain-latch-structure shift register.

According to the above-discussed programmable logic circuit, the shift register in the configuration memory is constructed with the chain-latch-structure shift register. Therefore, the programmable logic circuit may be miniaturized.

The object described above is also achieved by the programmable logic circuit mentioned above, wherein the second configuration data supplied to the memory controller is generated based on an output signal from another logic cell.

According to the above-discussed programmable logic circuit, the configuration data supplied to the memory controller is generated based on the output signal produced from another logic cell. Therefore, since it is unnecessary to externally supply the configuration data, by a self-control operation, a number of programmable circuits in the programmable logic circuit may be increased larger than the number of programmable circuits physically determined by the number of gates.

Other objects and further features of the present invention will be apparent from the following detailed description when read in conjunction with the accompanying drawings.

BRIEF DESCRIPTION OF THE DRAWINGS

FIG. 18 shows a modification of the second embodiment of the shift register according to the present invention shown in FIG. 16;

FIG. 19 shows another modification of the second embodiment of a shift register according to the present invention shown in FIG. 16;

FIG. 32A shows a basic configuration of the I/O module, and FIG. 32B shows a configuration of the I/O module including memory units;

FIG. 34A shows a basic configuration example, FIG. 34B shows a configuration example of a switch part including a memory unit; and FIG. 34C illustrates an close up of a switch shown in FIG. 34A.

DETAILED DESCRIPTION OF THE PREFERRED EMBODIMENTS

Figure 5:
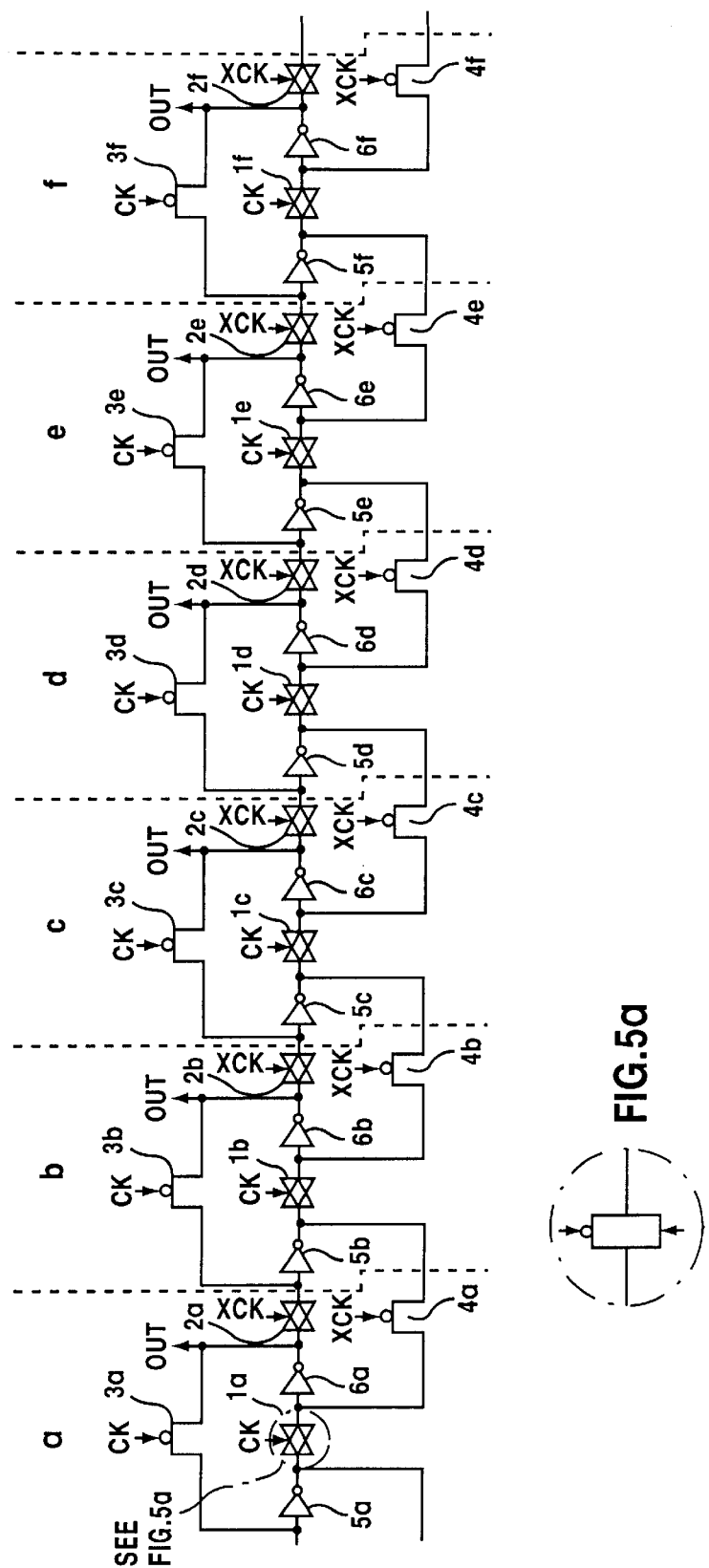
FIG. 5 shows a schematic diagram of a first embodiment of a shift register according to the present invention.
Figure 5A:
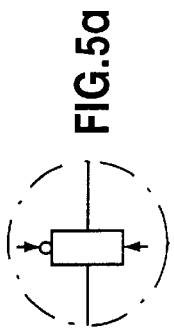
Figure 6:
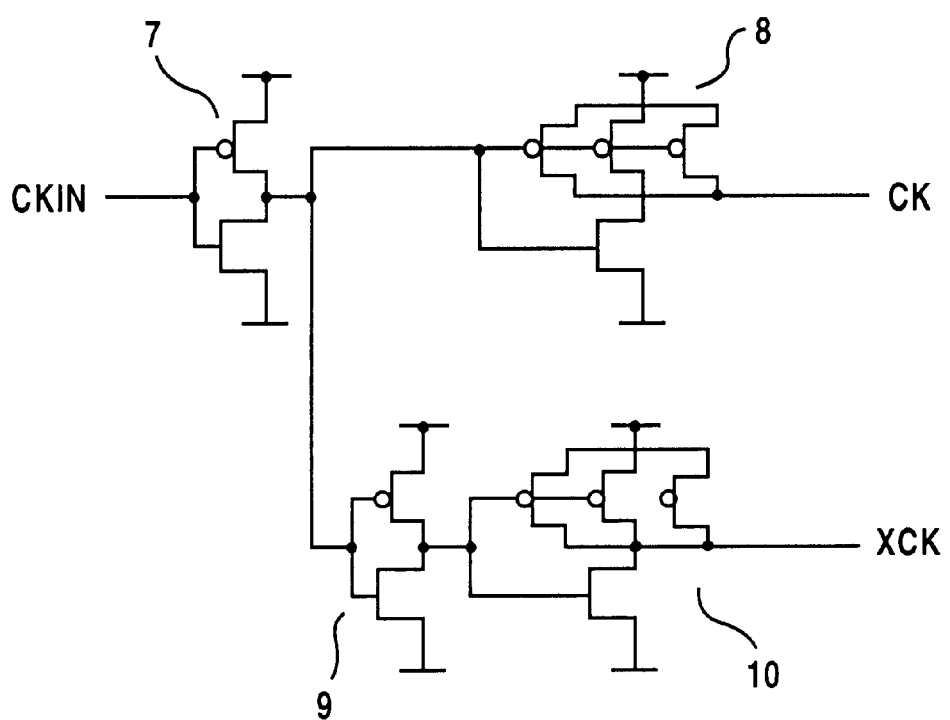
FIG. 6 shows a schematic diagram of a clock supplying circuit in the shift register shown in FIG. 5.

First, a description will be given of a first embodiment of a shift register according to the present invention. FIG. 5 shows a schematic diagram of the first embodiment of the shift register according to the present invention. FIG. 6 shows a schematic diagram of a clock supplying circuit in the shift register shown in FIG. 5.

The shift register shown in FIG. 5 has a chain-latch structure, and a portion of the shift register is shown in FIG. 5. In the shift register shown in FIG. 5, circuit cells a to f are connected in series. A flip-flop may be constructed with one circuit cell and a portion of the adjacent circuit cell. In the shift register according to the present invention, for switches in a main signal path, transmission gates 1a to 1f, 2a to 2f are provided. Further, for switches in feedback loops, P-channel MOS transistors 3a to 3f, 4a to 4f are provided.

In each circuit cell, the transmission gates 1a to 1f and the P-channel transistors 3a to 3f are provided with a clock CK, and the transmission gates 2a to 2f and the P-channel transistors 4a to 4f are provided with a clock XCK (given by inverting the clock CK). Therefore, when the transmission gates 1a to 1f and the P-channel transistors 3a to 3f are set to be conductive, the transmission gates 2a to 2f and the P-channel transistors 4a to 4f are set to be non-conductive, namely, these two groups are exclusively operative.

In the above-discussed configuration, a transmission delay of each of the transmission gates 1a to 1f, 2a to 2f is less than that of each of the P-channel transistors 3a to 3f, 4a to 4f. Therefore, a transmission time through each main signal path is less than that through the feedback circuit. By the above-discussed configuration, operation timings in the chain-latch-structure shift register may be adjusted to stable conditions.

The clocks CK, XCK are supplied from the clock supplying circuit shown in FIG. 6. In FIG. 6, an input clock is inverted by an inverter 7, and an output of the inverter 7 is divided into two signals. One signal is inverted again by an inverter 8 to produce the clock CK. The other signal is doubly inverted by inverters 9, 10 to produce the clock XCK.

The inverter is commonly constructed with a P-channel transistor and an N-channel transistor. However, since a driving ability of the N-channel transistor is larger than several times that of the P-channel transistor, a sharp transition may not be obtained at a rising edge of an output waveform of the clock. In the inventor's experiment, it was found that the above-discussed problem may be resolved by substantially enlarging the driving ability of the P-channel transistor as compared to the N-channel transistor.

For achieving the above-discussed resolving method, in a custom LSI, in order to increase the driving ability of the P-channel transistor, a large sized P-channel transistor may be used. In a gate array, since formed transistors have the same size, a number of the P-channel transistors in the inverters 8, 10 are increased as compared to a number of the N-channel transistors, as shown in FIG. 6.

When the driving ability of the P-channel transistor is represented by Dp and the driving ability of the N-channel transistor is represented by Dn, it is preferred that a ratio of the number of the P-channel transistors and that of the N-channel transistors be substantially larger than Dn/Dp. An absolute number of respective transistors depends on a number of loads (a number of switches) to which the clock of the clock supplying circuit is connected. When the above-discussed conditions are satisfied, the rising edge of the output waveform may transit sharply, and, thus, the clocks CK, XCK may have substantially symmetric waveforms.

As discussed above, in the shift register according to the present invention, for the switch circuit, the transmission gates and the P-channel transistors are used, and the clocks CK, XCK having substantially the symmetric waveforms are provided from the clock supplying circuit to the respective switches. Therefore, a rising time and a falling time of the output of the switch in the circuit cell may be substantially equal to each other.

Further, in the feedback loop, different kinds of transmission gates and the P-channel transistors are used, and a signal transmission time is properly adjusted. In the above-discussed conditions, in the gate array as well as the custom LSI, a stable and positive operation of the chain-latch-structure shift register may be obtained.

Figure 2:
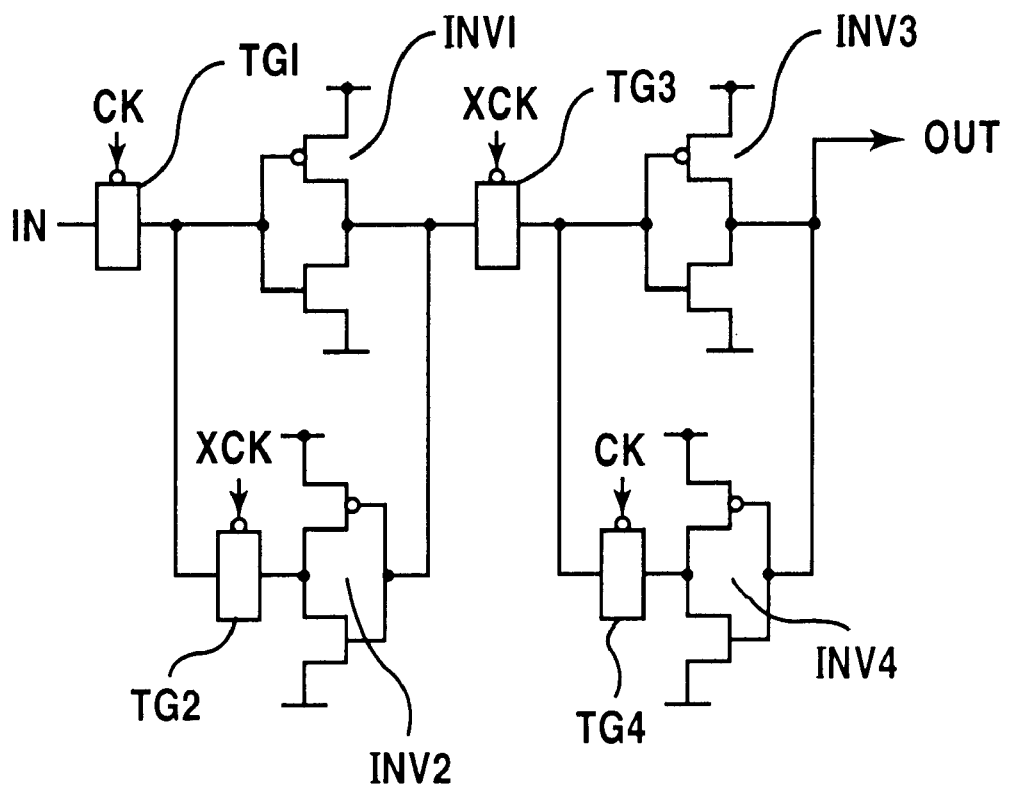
FIG. 2 shows a schematic diagram of a typical CMOS-D-type flip-flop.
Figure 3:
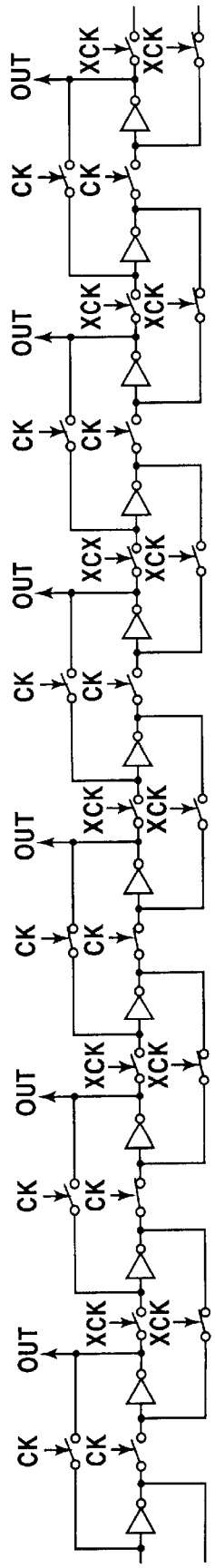
FIG. 3 shows a schematic diagram of a prior-art chain-latch-structure shift register.
Figure 4:
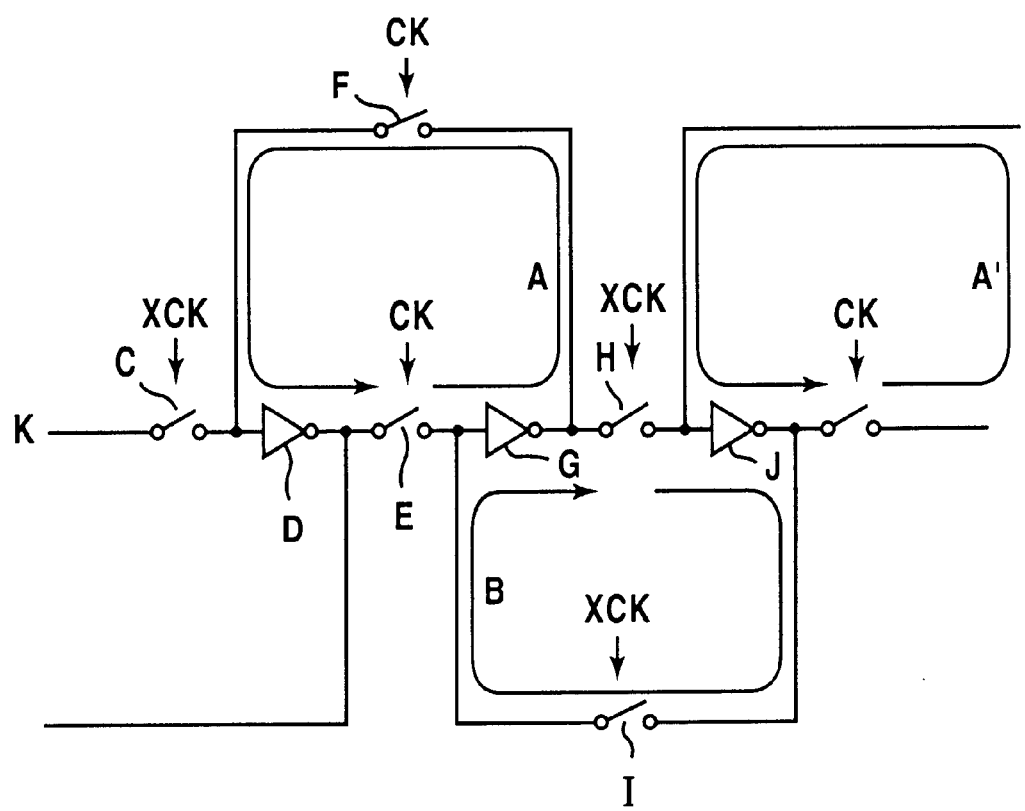
FIG. 4 shows an illustration for explaining an operation of the prior-art chain-latch-structure shift register shown in FIG. 3.

In the shift register according to the present invention, one flip-flop may be constructed with a number of gates less than approximately half of that of the prior-art flip-flop shown in FIG. 2. Therefore, a number of gates and a chip area constituting the shift register may be also reduced to less than half of the prior-art one. Further, in the programmable logic circuit using a large number of shift register stages for the memory, a chip area for the memory may be reduced, and a number of programmable-logic-circuit gates per chip area may be increased.

Figure 7:
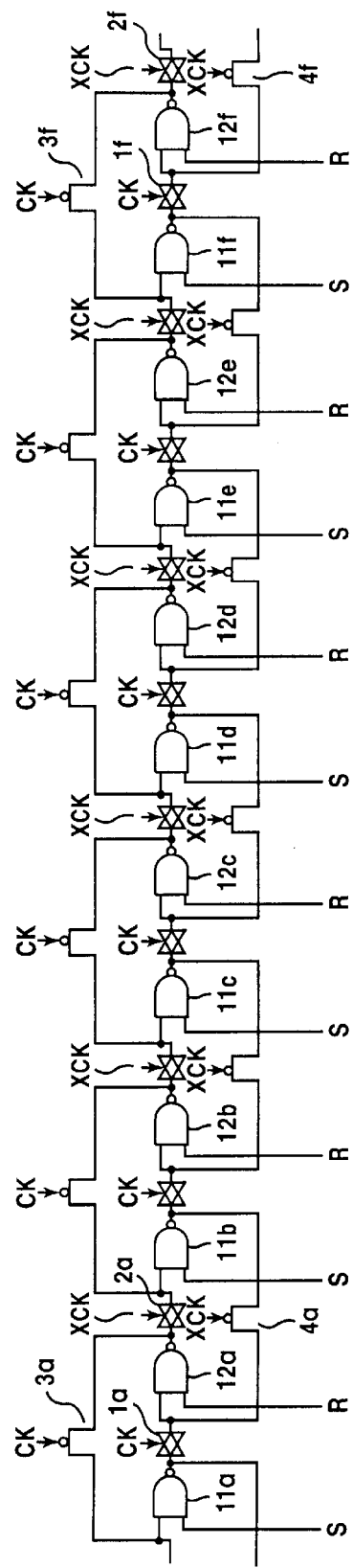
FIG. 7 shows a schematic diagram of a modification of the first embodiment of the shift register according to the present invention shown in FIG. 5.

FIG. 7 shows a schematic diagram of a modification of the first embodiment of the shift register according to the present invention shown in FIG. 5. In the shift register shown in FIG. 7, as compared to the shift register shown in FIG. 5, instead of the inverters 5a to 5f, 6a to 6f, NAND gates 11a to 11f, 12a to 12f are used. In this circuit, when other inputs S and R of the NAND gates 11a to 11f, 12a to 12f are provided with logic "1", respective NAND gates 11a to 11f, 12a to 12f are operative as inverters. In this case, the shift register shown in FIG. 7 is operative in the same way as the shift register shown in FIG. 5.

On the other hand, when the other inputs S and R of the NAND gates 11a to 11f, 12a to 12f are provided with logic "0", the respective outputs of the NAND gates 11a to 11f, 12a to 12f are fixed to logic "1". Therefore, by flexibly setting the other inputs S and R of the NAND gates, values held in the closed loops may be set to be desired values.

Figure 8:
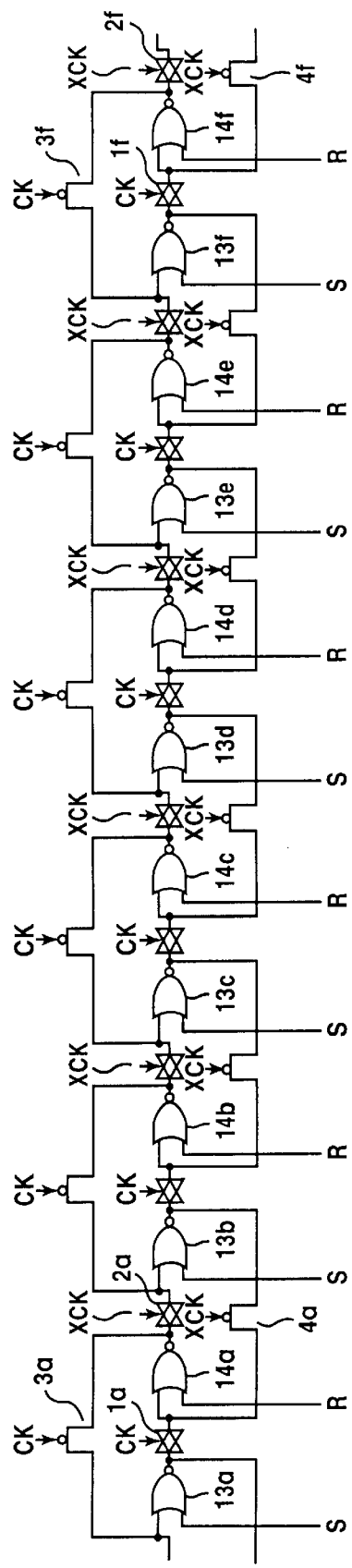
FIG. 8 shows a schematic diagram of another modification of the first embodiment of the shift register according to the present invention shown in FIG. 5.

FIG. 8 shows a schematic diagram of another modification of the first embodiment of the shift register according to the present invention shown in FIG. 5. In the shift register shown in FIG. 8, as compared to the shift register shown in FIG. 5, instead of the inverters 5a to 5f, 6a to 6f, NOR gates 13a to 13f, 14a to 14f are used. In this circuit, when other inputs S and R of the NOR gates 13a to 13f, 14a to 14f are provided with logic "0", respective NOR gates 13a to 13f, 14a to 14f are operative as inverters. In this case, the shift register shown in FIG. 8 is operative in the same way as the shift register shown in FIG. 5.

On the other hand, when the other inputs S and R of the NOR gates 13a to 13f, 14a to 14f are provided with logic "1", the respective outputs of the NOR gates 13a to 13f, 14a to 14f are fixed to logic "0". Therefore, by flexibly setting the other inputs S and R of the NOR gates, values held in the closed loops may be set to be desired values.

Figure 9:
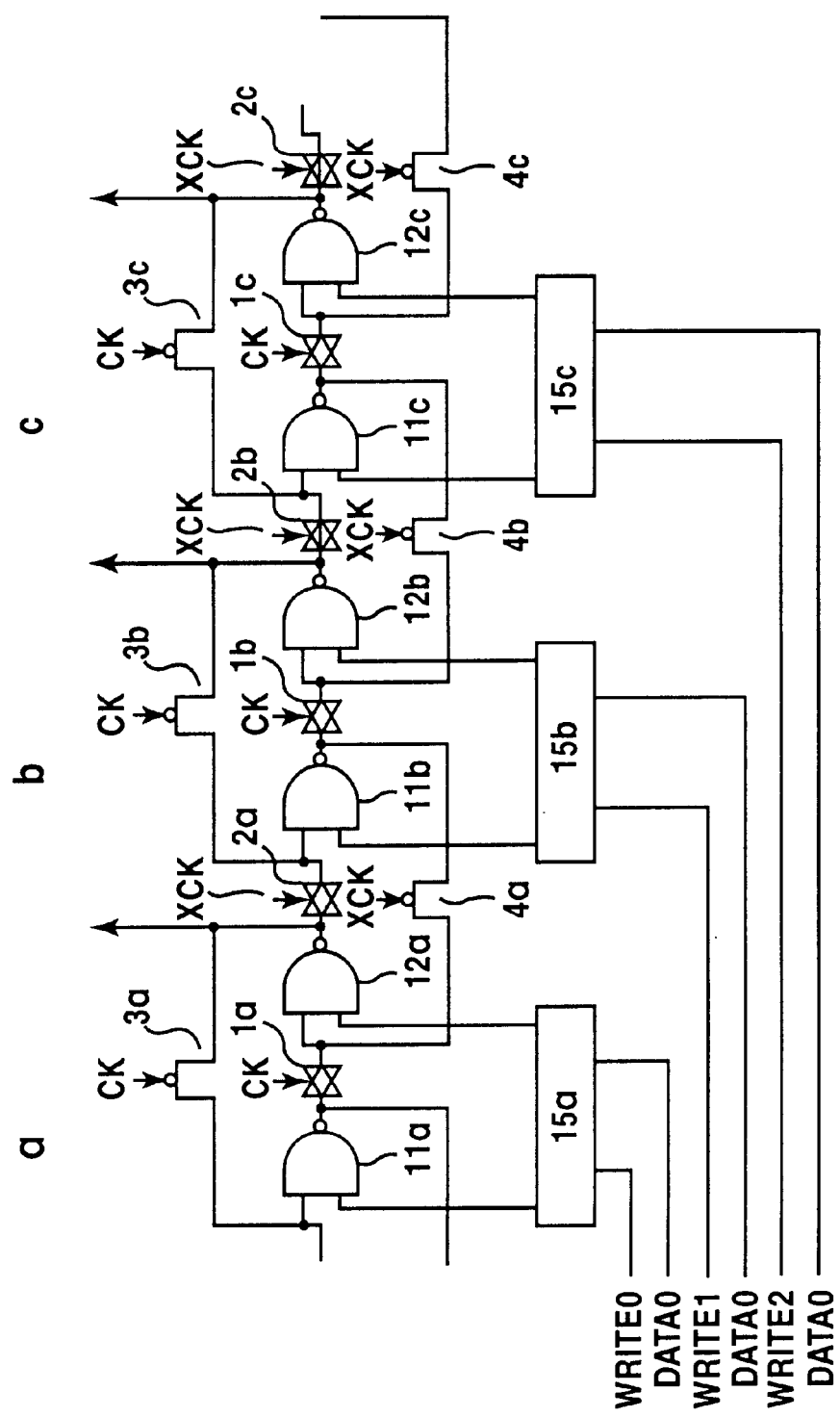
FIG. 9 shows a configuration example of a shift register having a state-setting circuit according to the present invention.

FIG. 9 shows a configuration example of a shift register having a state-setting circuit according to the present invention. The state-setting circuit may set the state of the shift register to a desired state. In FIG. 9, in addition to the circuit cells a to c of the shift register shown in FIG. 7, state-setting circuits 15a to 15c are respectively connected. The state-setting circuits 15a to 15c may change the states of the chain latches according to a combination of input signals WRITE, DATA.

Figure 10:
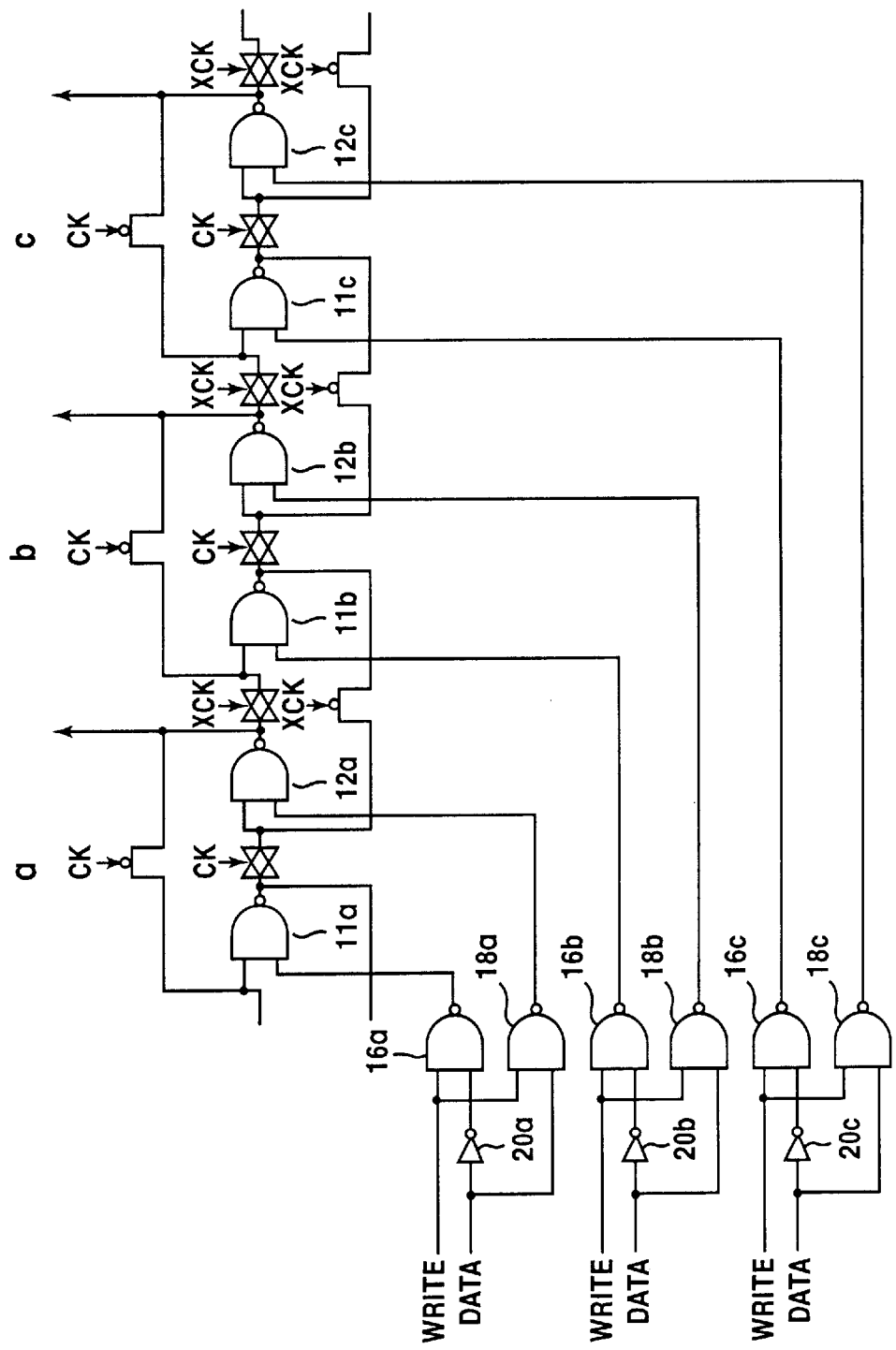
FIG. 10 shows a configuration example of the state-setting circuits shown in FIG. 9.

FIG. 10 shows a configuration example of the state-setting circuits shown in FIG. 9. The state-setting circuits 15a to 15c are constructed with NAND gates 16a to 16c, 18a to 18c, and inverters 20a to 20c. For example, in the logic cell a, when the input signal WRITE is logic "0", regardless of the value of the input signal DATA, both the outputs of the NAND gates 16a, 18a are set to be logic "1". In this case, the NAND gates 11a, 12a are operative as inverters.

On the other hand, when the input signal WRITE is logic "1", the outputs of the NAND gates 16a, 18a are set to be (logic "1", logic "1") or (logic "1", logic "0") according to the input signal DATA. In the former case, the output of the NAND gate 11a in the logic cell a is set to be logic "1", and in the latter case, the output of the NAND gate 12a is set to be logic "1".

Figure 11:
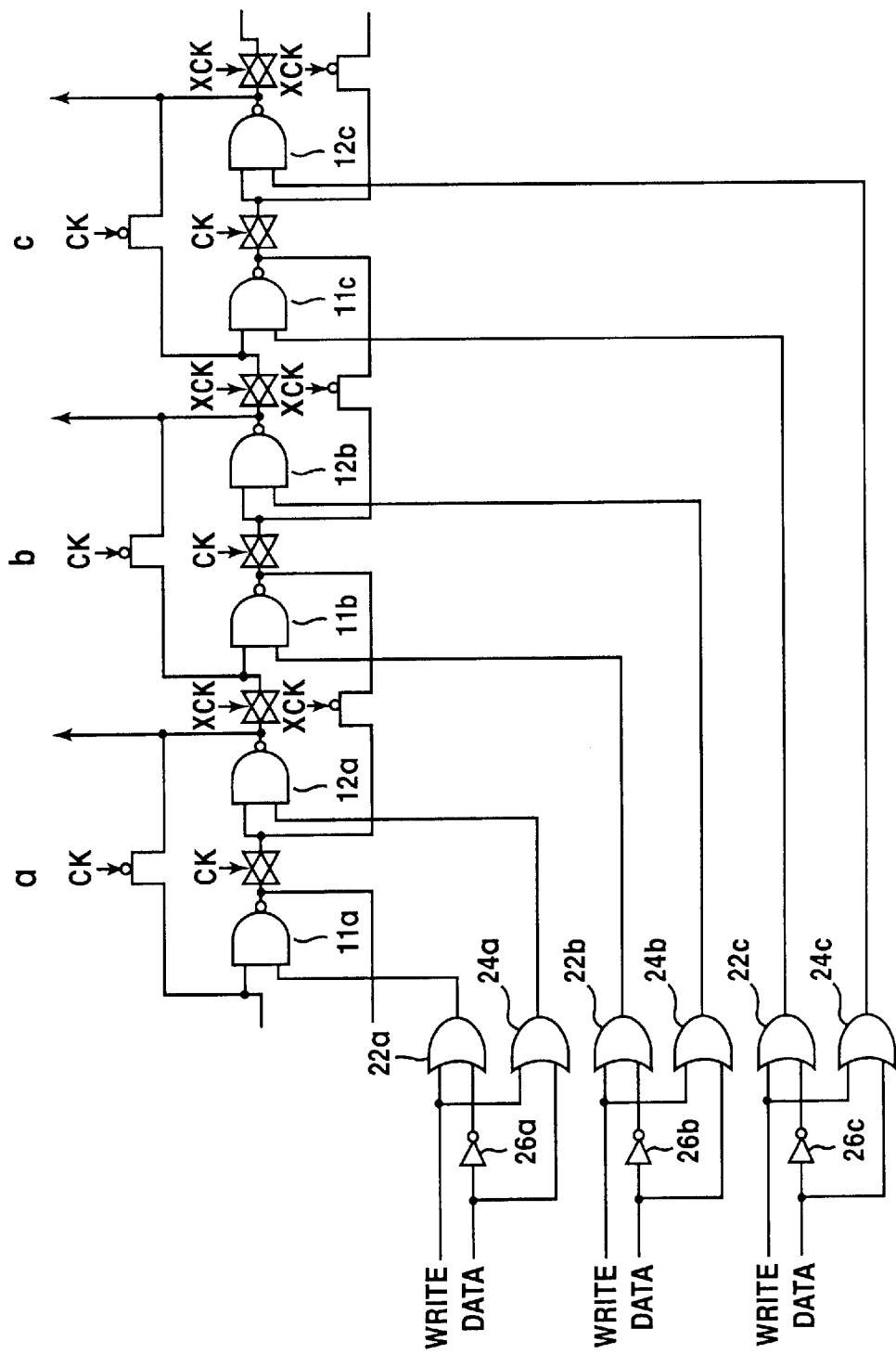
FIG. 11 shows another configuration example of the state-setting circuits shown in FIG. 9.

FIG. 11 shows another configuration example of the state-setting circuits shown in FIG. 9. The state-setting circuits 15a to 15c are constructed with OR gates 22a to 22c, 24a to 24c, and inverters 26a to 26c. For example, in the logic cell a, when the input signal WRITE is logic "1", regardless of the value of the input signal DATA, both the outputs of the OR gates 22a, 24a are set to be logic "1". In this case, the NAND gates 11a, 12a are operative as inverters.

On the other hand, when the input signal WRITE is logic "1", the outputs of the OR gates 22a, 24a are set to be (logic "0", logic "1") or (logic "1", logic "0") according to the input signal DATA. In the former case, the output of the NAND gate 11a in the logic cell a is set to be logic "1", and in the latter case, the output of the NAND gate 12a is set to be logic "1".

The state-setting circuit is not limited to the above-discussed configuration. Namely, if the state-setting circuit has a function of operating both the NAND gates 11a, 12a or a function of fixing at least one of the outputs of the NAND gates 11a, 12a, the state-setting circuit may have a variety of circuit configurations.

Further, to the shift register shown in FIG. 8, the same state-setting circuits may be provided. In this case, a typical state-setting circuit may be constructed with a combination of an AND gate and an inverter, or a combination of a NOR gate and an inverter.

Figure 12:
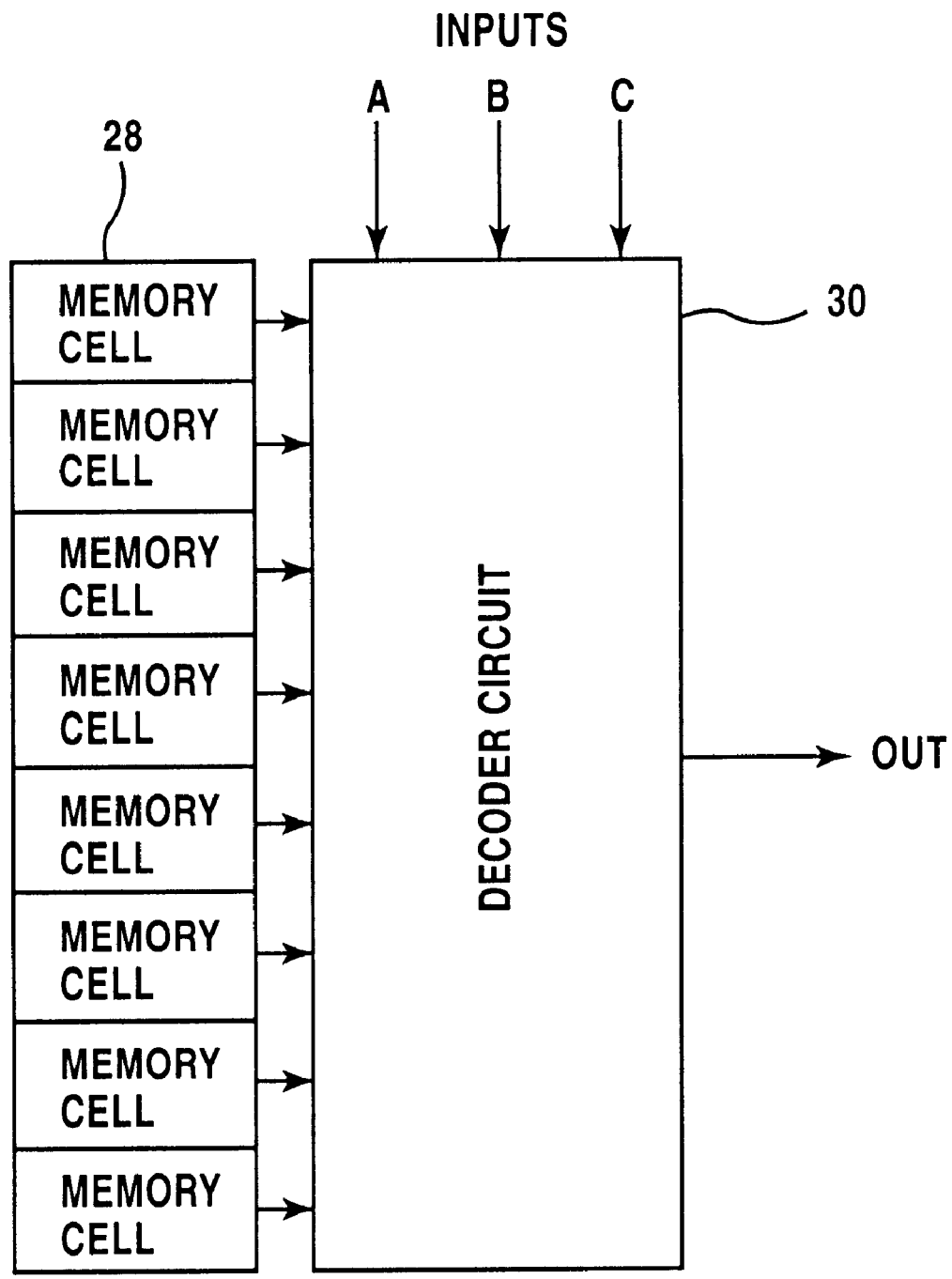
FIG. 12 shows an application example of the shift register according to the present invention to a look-up table.

FIG. 12 shows an application example of the shift register according to the present invention to a look-up table. In FIG. 12, the shift register is used for a RAM 28, each circuit cell of the shift register being defined as a memory cell. Outputs of the respective memory cells are connected to a decoder circuit 30. By a combination of the decoder circuit 30 and the RAM 28, a 3-input programmable function unit (look-up table) may be established. Namely, when the inputs A, B, C are provided, an output according to a logic function determined by memory data is produced.

Figure 13:
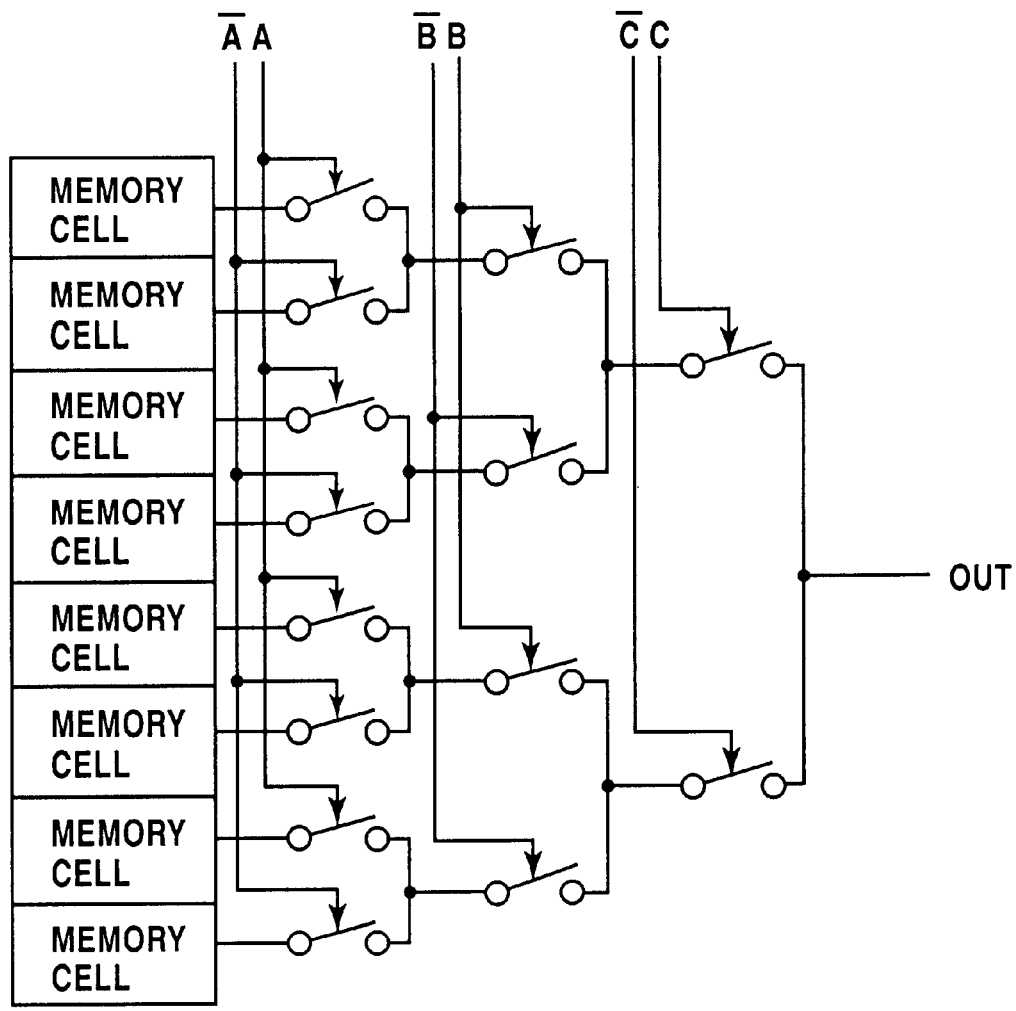
FIG. 13 shows a configuration example of a decoder circuit shown in FIG. 12.

FIG. 13 shows a configuration example of the decoder circuit shown in FIG. 12. Each of inputs A, B, C of the decoder circuit is respectively provided as complementary signals. The decoder circuit shown in FIG. 13 is constructed with 3-stage groups of switches which are controlled by the inputs A, B, C, and a first-state group of switches controlled by the inputs A, /A are connected to the respective memory cells. By a combination of the inputs A, B, C, one of 8 memory data cells is selected. In the above-discussed configuration, a 3-input combination logic circuit may be realized.

Figure 14:
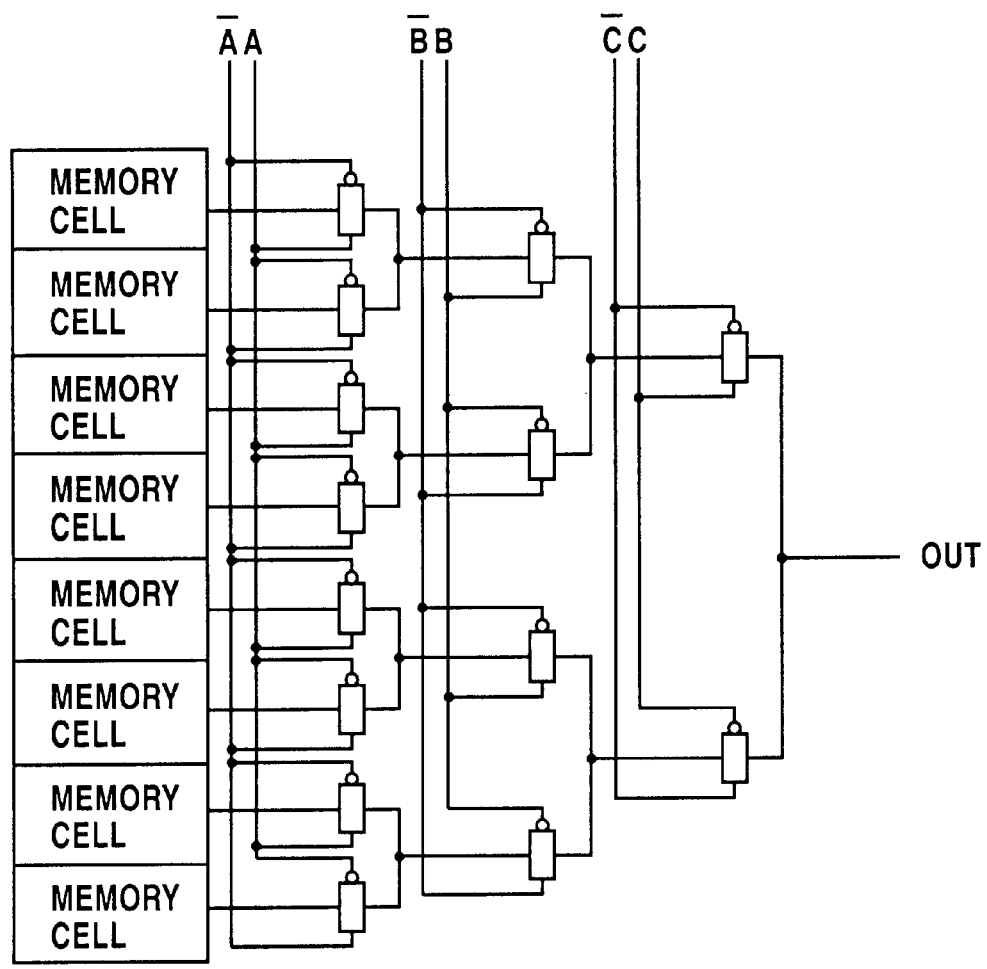
FIG. 14 shows another configuration example of the decoder circuit shown in FIG. 12.

FIG. 14 shows another configuration example of the decoder circuit shown in FIG. 12. In the decoder circuit shown in FIG. 14, as compared to the decoder circuit shown in FIG. 13, the respective switches are constructed with transmission gates. A look-up table shown in FIG. 14 is also operative in the same way as the circuit shown in FIG. 13.

Next, a description will be given of a second embodiment of the shift register according to the present invention. In the prior-art programmable logic circuit, the flip-flop is constructed with a flip-flop which is previously provided in the logic cell, or is constructed by providing a feedback path in the logic cell. Therefore, a number of realizable flip-flops are previously determined, and, thus, it is difficult to further increase the number of flip-flops in the logic cell. In the present invention, by using the above-discussed shift register for the configuration memory in the programmable logic circuit, a portion of the shift register may be used as flip-flops.

Figure 15:
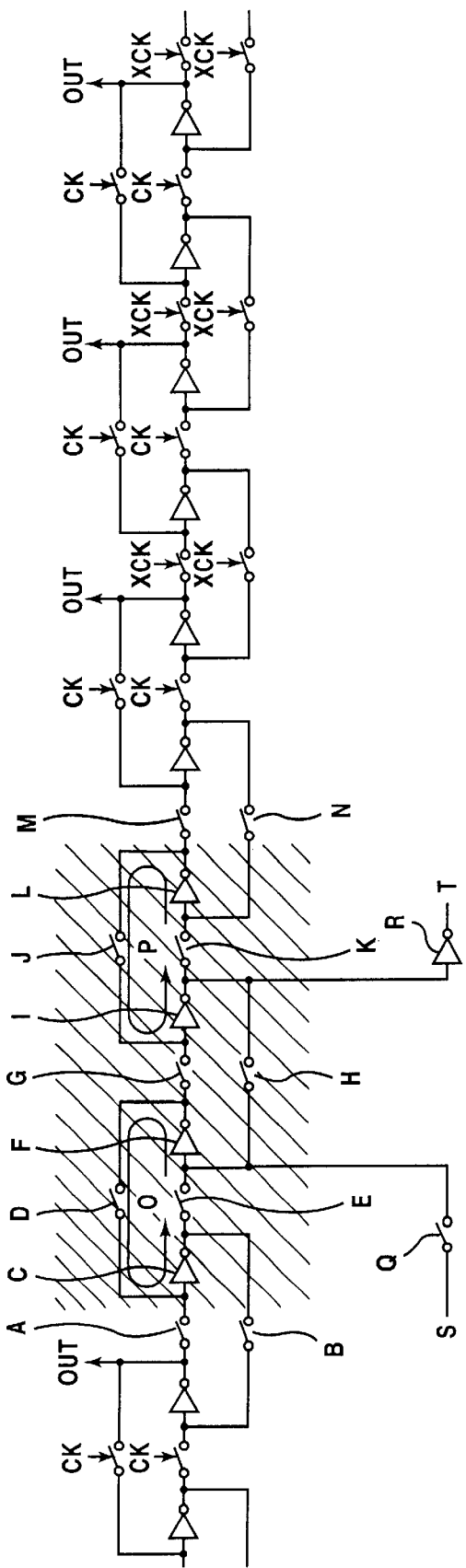
FIG. 15 shows a model diagram of a second embodiment of the shift register according to the present invention, in which a portion of the chain-latch structure may be used for flip-flops.

FIG. 15 shows a model diagram of the second embodiment of the shift register according to the present invention, in which a portion of the chain-latch structure may be used for a flip-flop. In FIG. 15, for example, hatched circuit cells may be used for a flip-flop. Further, to the circuit cells to be used for the flip-flop, a switch Q and an inverter R are connected. When selected ones of the circuit cells are used for the flip-flop, switches A, B, M, N are turned off, and, thus, the circuit cells to be used for the flip-flop are isolated from the remaining circuit cells. By this isolation, when the selected ones of the circuit cells are operative as a flip-flop, the configuration data held in the remaining circuit cells is prevented from being influenced from the flip-flop operation.

In the case where the hatched circuit cell is used for the flip-flop, control timing of the switches H, G is set such that when the switch H is turned off, a feedback loop O is connected to a feedback loop P only through the switch G (the switch G is turned on). Switches D, J are always turned on, and, thus, outputs of active circuits F, L are always transmitted to input terminals of inverters C, I.

A group of switches Q, K and a group of switches E, G are exclusively controlled each other. An applied signal to an input terminal S, when the switches Q, K are turned on and the switches E, G are turned off, is transmitted to an output terminal of an inverter F, and is further transmitted to an output terminal of the inverter C.

Subsequently, when the switches Q, K are turned off and the switches E, G are turned on, an input and output state of the inverters F, C are held in the closed loop O. Next, when the switches Q, K are turned on and the switches E, G are turned off again, the signal held in the closed loop O is transmitted to the closed loop P, and is produced from an output terminal T.

As discussed above, by providing a given signal to a portion of the circuit cells of the chain-latch-structure shift register, the portion of the circuit cells may be operative as a flip-flop. Therefore, by using the shift register for the configuration memory in the programmable logic circuit, a portion of the configuration memory may be used for the flip-flop, and, thus, a number of realizable flip-flops in the logic cell may be increased. As a result, an equivalent gate number of the programmable logic circuit may be significantly increased.

Figure 16:
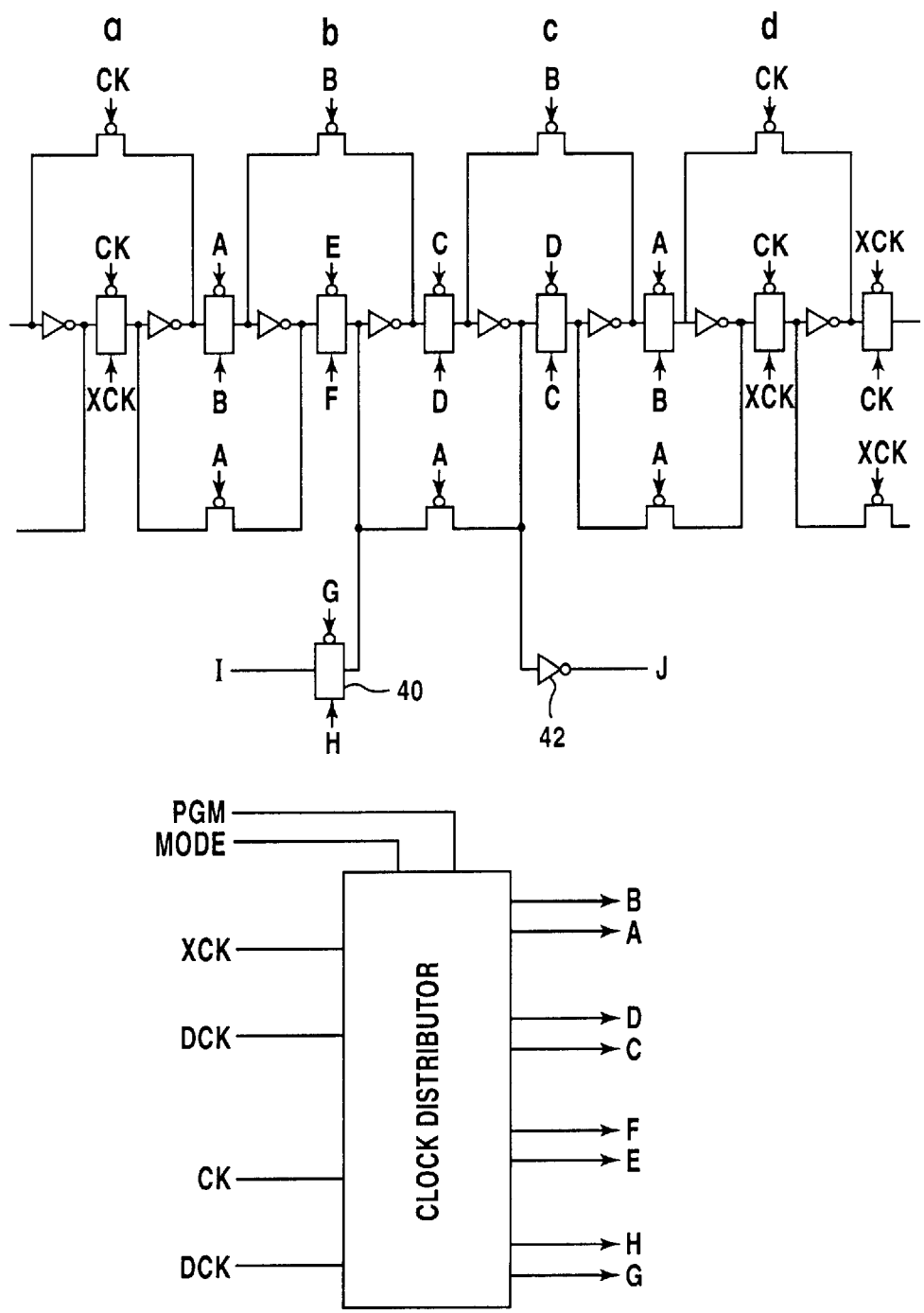
FIG. 16 shows a detailed configuration example of the embodiment of the shift register shown in FIG. 15.

FIG. 16 shows a detailed configuration example of the embodiment of the shift register shown in FIG. 15. In the shift register shown in FIG. 16, in the same way as the shift register shown in FIG. 5, for switches, transmission gates and P-channel MOS transistors are used. Further, to a circuit cell b, a transmission gate 40 is connected, and to a circuit cell c, an inverter 42 is connected. Also, to the circuit cells b, c and a portion of a circuit cell a, instead of the clock supplying circuit shown in FIG. 6, a clock distributor is connected.

The clock distributor, when the circuit cells are not used for the flip-flop, supplies the clocks CK, XCK shown in FIG. 5 and FIG. 6 to the respective switches in the circuit cells. On the other hand, when the circuit cells are used for a D-type flip-flop, the clock distributor supplies clocks so as to isolate the circuit cells b, c from the remaining circuit, and supplies clocks DCK, XDCK for the D-type flip-flop.

Figure 17:
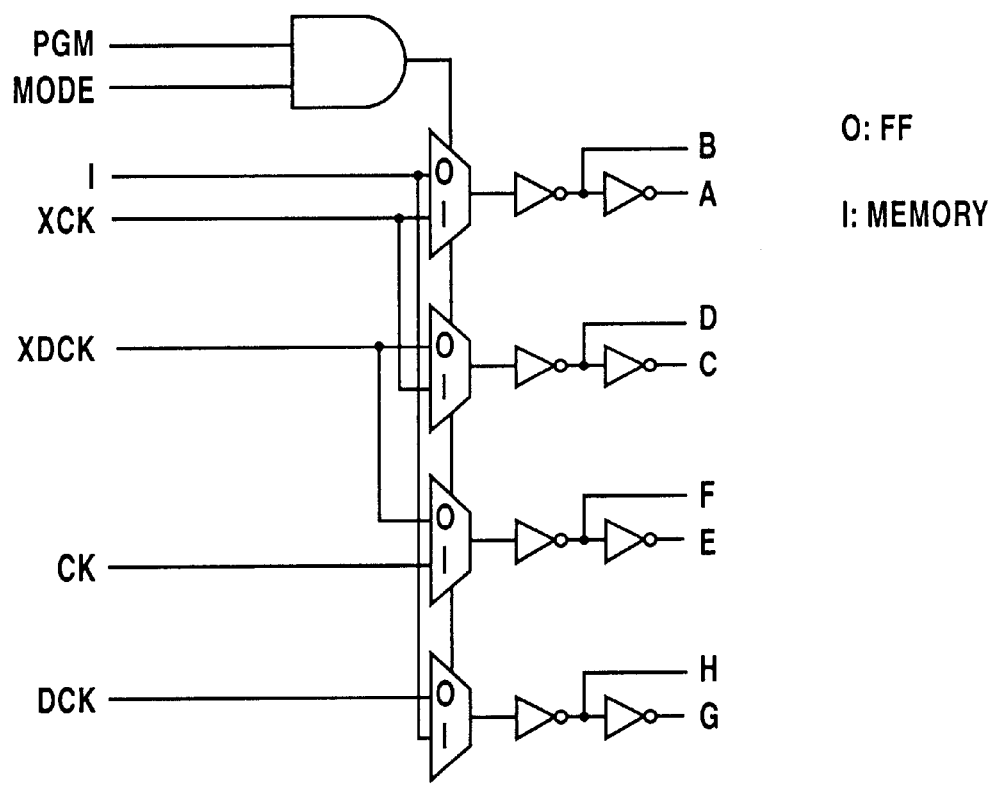
FIG. 17 shows a schematic diagram of a clock distributor shown in FIG. 16.

FIG. 17 shows a schematic diagram of the clock distributor shown in FIG. 16. The clock distributor includes a plurality of selectors. When the circuit cells are used for the shift register, the clocks CK, XCK for the shift register are selected and produced, and when selected ones of the circuit cells are used for the D-type flip-flop, the clocks DCK, XDCK for the D-type flip-flop are selected and produced. Whether the circuit cells are used for the shift register or the D-type flip-flop is determined by a combination of control signals PGM and MODE.

FIG. 18 shows a modification of the second embodiment of the shift register according to the present invention shown in FIG. 16. In the shift register shown in FIG. 18, for the switches, the transmission gates and the P-channel MOS transistors are used. Further, instead of the inverters, NAND gates are used. Also, in the circuit cells b, c, instead of the clock supplying circuit shown in FIG. 6, the clock distributor shown in FIG. 17 is provided.

The clock distributor is provided with the clock signals CK, XCK for the shift register, the clock signals DCK, XDCK for the D-type flip-flop, and the control signals PGM, MODE for selecting one of the two operation modes (shift register and D-type flip-flop modes).

In the shift register shown in FIG. 18, by supplying the given signals to the input terminals R, S of the NAND gates, in the same way as the shift registers shown in FIG. 10 and FIG. 11, a state of a portion of the shift register may be set to be a desired state. In the same principle, a state of the formed flip-flop may be also set to be a desired state.

FIG. 19 shows another modification of the second embodiment of the shift register according to the present invention shown in FIG. 16. In the shift register shown in FIG. 19, for the switches, the transmission gates and the P-channel MOS transistors are used, and instead of the inverters, NOR gates are used. Also, in the circuit cells b, c, instead of the clock supplying circuit shown in FIG. 6, the clock distributor shown in FIG. 17 is provided.

The clock distributor is provided with the clock signals CK, XCK for the shift register, the clock signals DCK, XDCK for the D-type flip-flop, and the control signals PGM, MODE for selecting one of the two operation modes (shift register and D-type flip-flop modes).

In the shift register shown in FIG. 19, by supplying the given signals to input terminals R, S of the NOR gates, a state of a portion of the shift register may be set to be a desired state. Further, a state of the formed flip-flop may be also set to be a desired state.

Figure 1:
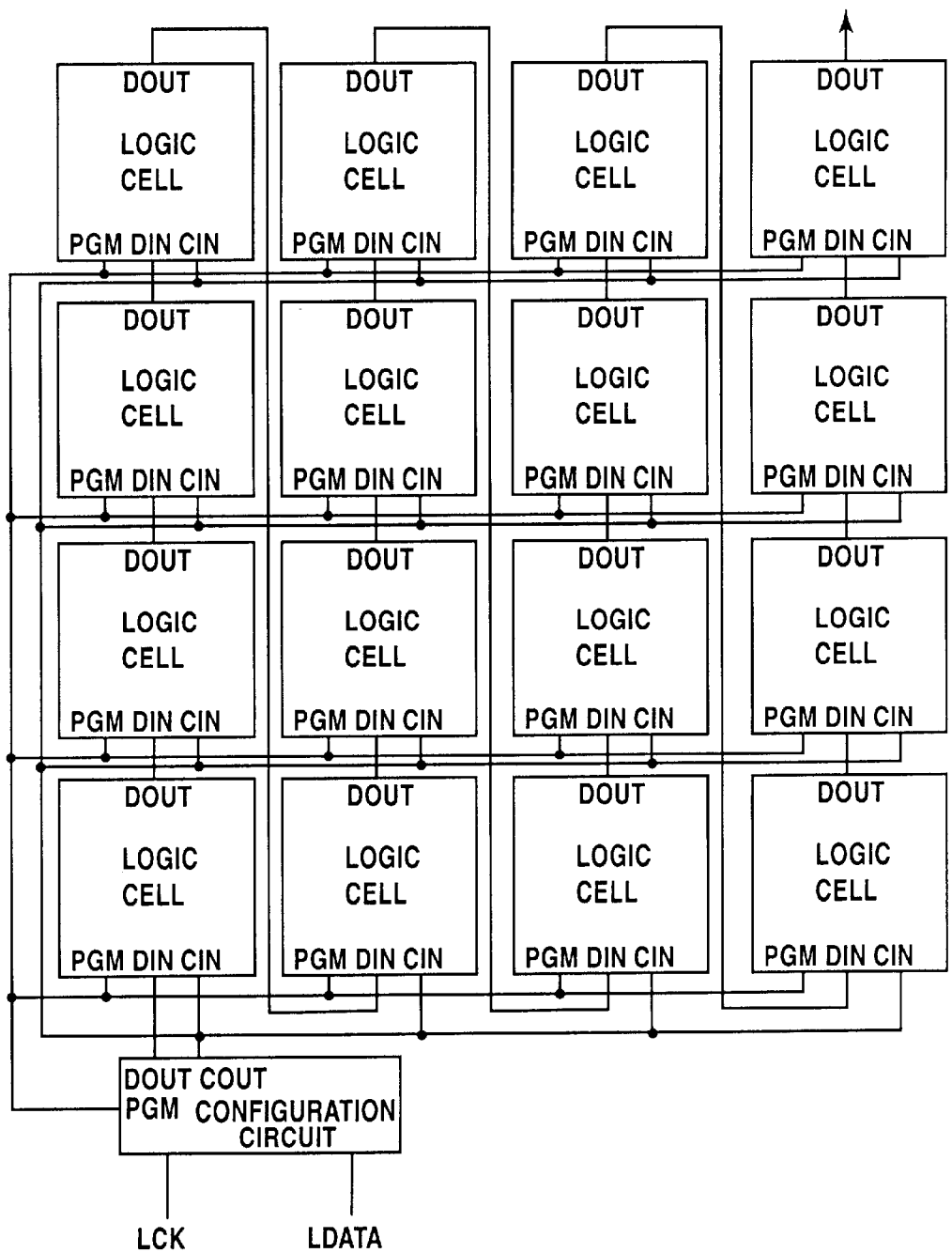
FIG. 1 shows a block diagram of a typical configuration example of a field programmable gate array (FPGA)

Next, a description will be given of a case where the shift register according to the present invention is applied to the configuration memory of the FPGA. The shift register according to the present invention is usable for the conventional FPGA shown in FIG. 1.

Figure 20:
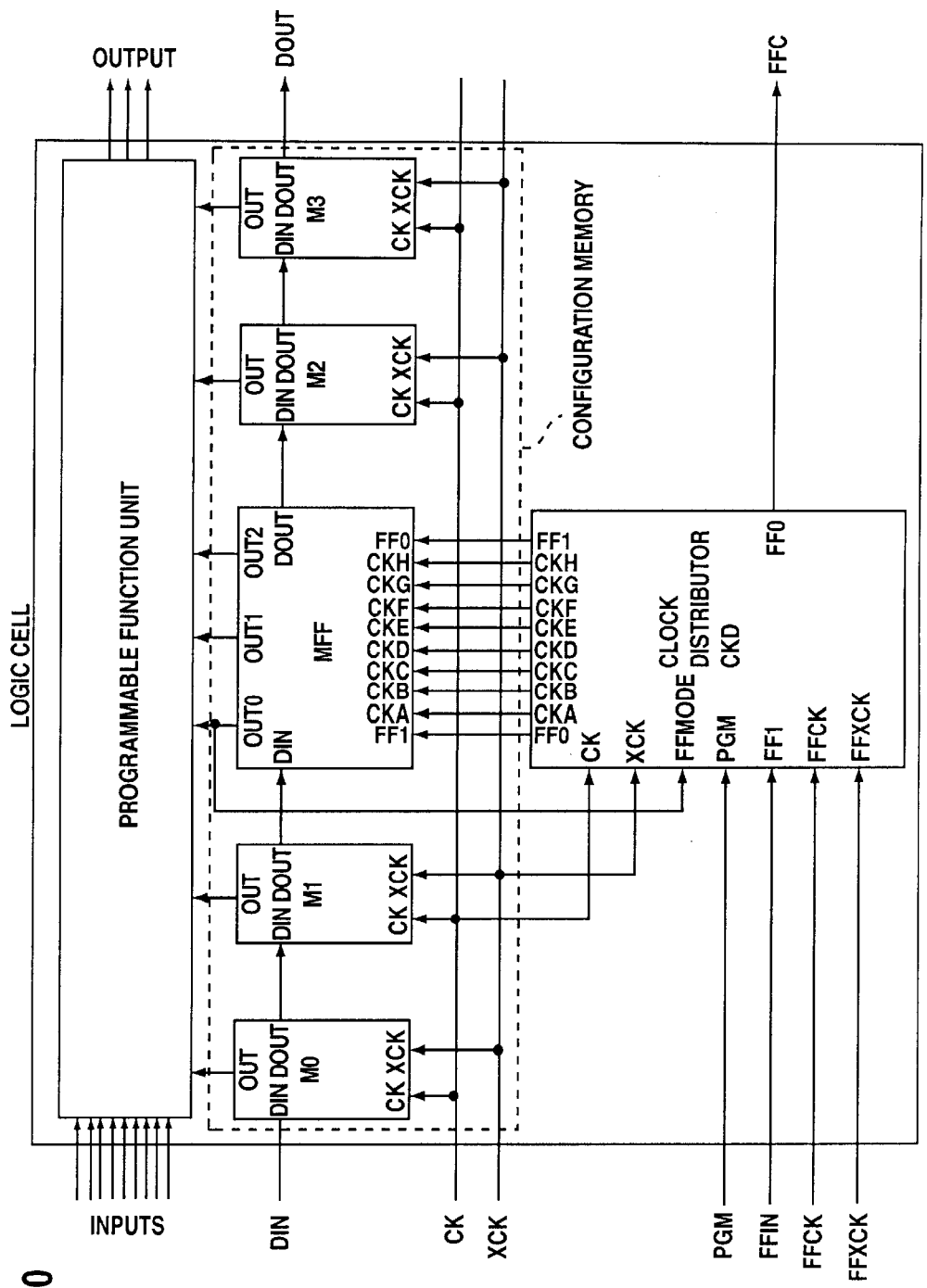
FIG. 20 shows a block diagram of a first embodiment of a programmable logic circuit according to the present invention.

FIG. 20 shows a block diagram of a first embodiment of a programmable logic circuit according to the present invention. A logic cell in the programmable logic circuit includes a programmable function unit and a configuration memory for determining a function of the programmable function unit. The programmable. function unit may include several flip-flops. The configuration memory is constructed with the shift register shown in FIG. 16. The shift register has circuit cells M0, M1, MFF, M2, M3. The circuit cells M0, M1, M2, M3 respectively have the same circuit configuration as that of the above-discussed circuit cell a. The circuit cell MFF has substantially the same circuit configuration as that of the circuit cell b, c shown in FIG. 16. Therefore, the circuit cell MFF is operable as a flip-flop.

A clock distributor CKD shown in FIG. 20 has substantially the same configuration as that of the clock distributor shown in FIG. 16. The clock distributor CKD is provided with the clocks CK, XCK for the shift register, clocks FFCK, FFXCK for the flip-flop, and control signals FFMODE, PGM. Further, to the clock distributor CKD shown in FIG. 20, data FFIN for the flip-flop may be provided, and from the clock distributor CKD, an output FFOUT of the flip-flop may be derived.

In FIG. 20, when the configuration data is loaded to the logic cell, the circuit cell MFF is operated as the shift register by an instruction of the control signal PGM. Therefore, the configuration data is loaded in an order of the circuit cells M0, M1, MFF, M2, M3. After the configuration data is loaded, according to the data, the function of the programmable function unit is determined.

At this time, an output OUT0 of the configuration data loaded in the circuit cell MFF is fed back to the clock distributor CKD as the control signal FFMODE. When the control signal FFMODE indicates that the circuit cell MFF is used for the flip-flop, the circuit cell MFF is controlled to operate as the flip-flop by the clock distributor CKD. In this case, as discussed previously, the circuit cell MFF is isolated from the remaining circuit cells M1, M1, M2, M3.

After the circuit cell MFF is set to be the flip-flop, the clocks FFCK, FFXCK for the flip-flop and the data FFIN for the flip-flop are provided through the clock distributor CKD. In this case, the data FFIN for the flip-flop may be also provided from the programmable function unit. Further, it is possible to provide the output FFOUT of the flip-flop to the programmable function unit.

As discussed above, in the programmable logic circuit according to the present invention, in addition to commonly usable flip-flops, a portion of the configuration memory may be used for the flip-flop. Therefore, a number of usable flip-flops may be extremely increased.

Figure 21:
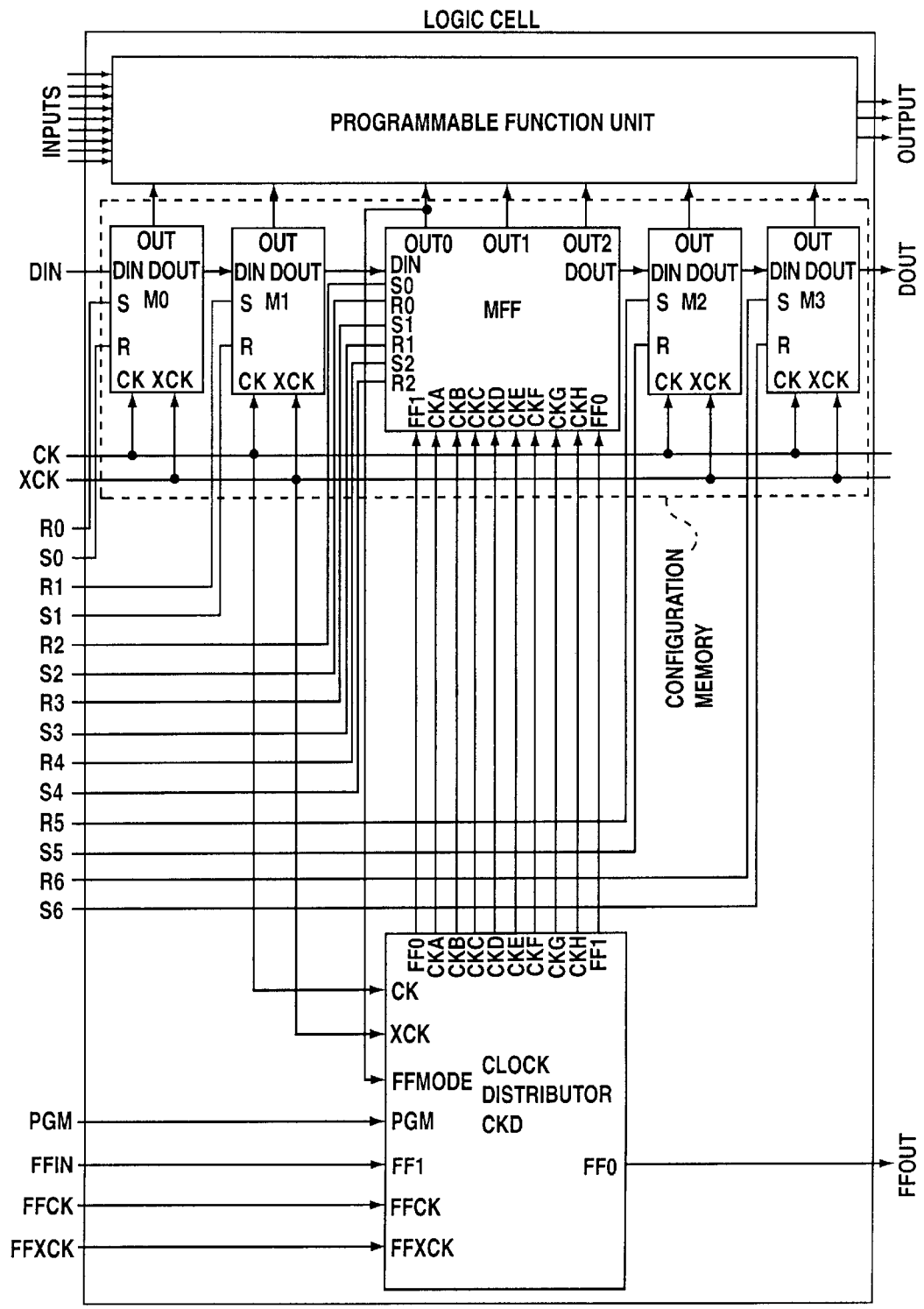
FIG. 21 shows a modification example of the logic cell of the programmable logic circuit shown in FIG. 20.

FIG. 21 shows a modification example of the logic cell of the programmable logic circuit shown in FIG. 20. The logic cell of the programmable logic circuit, in the same way as the logic cell shown in FIG. 20, includes the programmable function unit and the configuration memory for determining the function of the programmable function unit. In the logic cell shown in FIG. 21, the configuration memory is constructed with the shift register shown in FIG. 18 or FIG. 19. The shift register has the circuit cells M0, M1, MFF, M2, M3. Each of the circuit cells has input terminals S and R for setting a state of the circuit cell. Other circuits are the same as those of the logic cell shown in FIG. 20, and the circuit cell MFF is operable as the flip-flop in the same way as the circuit shown in FIG. 20.

Further, in the logic cell shown in FIG. 21, by setting optional values to the input terminals R0 to R6, S0 to S6, each circuit cell may be set to be a desired state.

Next, a description will be given of embodiments of a programmable logic circuit according to the present invention. In the prior-art programmable logic circuit, once the configuration data is loaded to the configuration memory, the loaded configuration data is fixed until the programmable logic circuit is used for another purpose.

However, as a programmable logic circuit size becomes large, there are a variety of internal circuits, and some of the internal circuits may be used only for a short time. It is inefficient for constructing the large-size circuit to hold such a short-usage-time circuit in the programmable logic circuit. In the programmable logic circuit according to the present invention, during operation of the programmable logic circuit, a part of the circuit (for example, selected ones of the logic cells) may be changed to a circuit having another circuit function. As a result, a number of realizable circuits may be significantly increased.

In the following, a description will be given of each circuit in the programmable logic circuit according to the present invention. First, a configuration of logic cells constituting the programmable logic circuit according to the present invention will be described.

Figure 22:
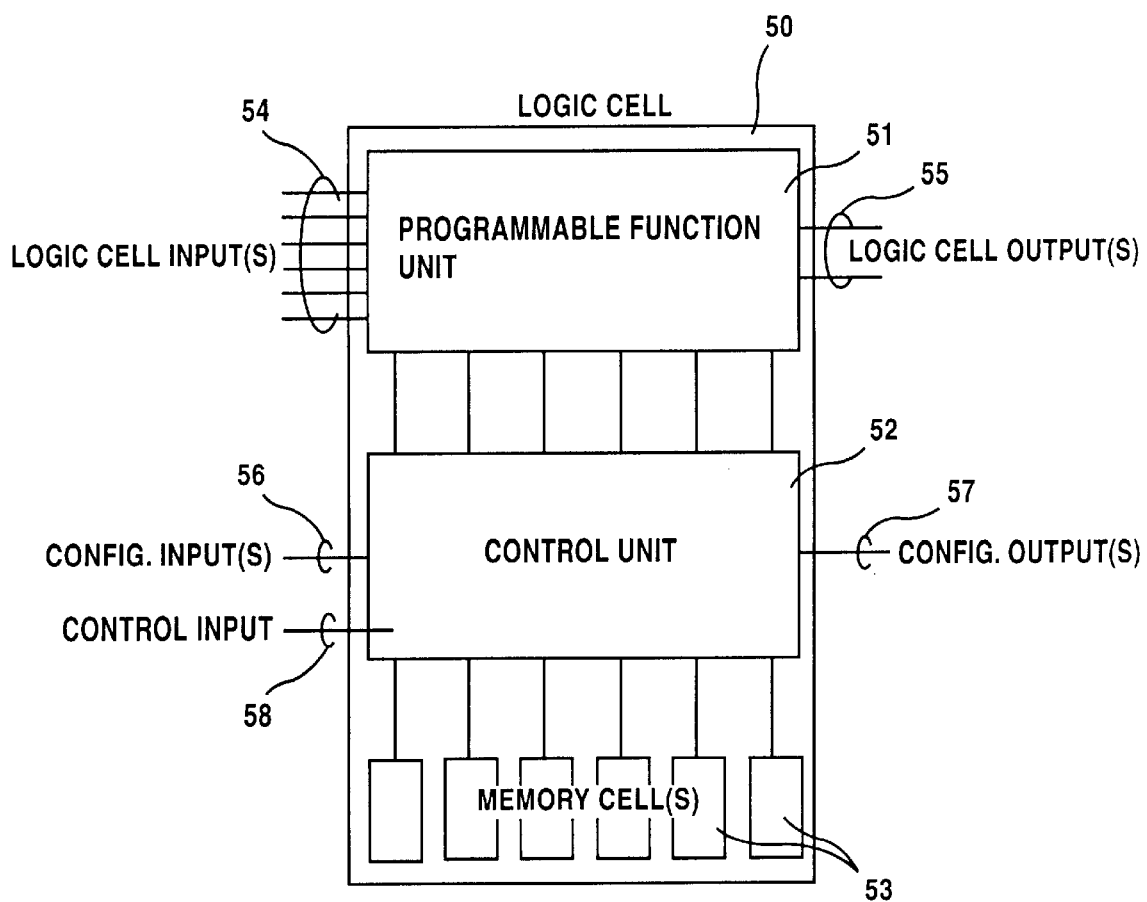
FIG. 22 shows a block diagram of a basic configuration of a logic cell constituting a programmable logic circuit according to the present invention.

FIG. 22 shows a block diagram of a basic configuration of the logic cell constituting the programmable logic circuit according to the present invention. In FIG. 22, a logic cell 50 is constructed with a programmable function unit 51, a control unit 52, and a configuration memory 53. In the configuration memory 53, a plurality of groups of configuration data are stored. The configuration data is written into a configuration-data input terminal 56 of the control unit 52, and can be read out from a configuration-data output terminal 57.

By a control input 58 of the control unit 52, one group of the configuration data stored in the configuration memory 53 is provided to the programmable function unit 51. At this time, in the programmable function unit 51, a logic circuit determined by the provided configuration data is programed. This programed logic circuit may include some flip-flops. An input signal 54 applied to the programmable function unit 51 is processed according to the programed logic circuit, and a processed signal is produced as an output signal 55.

Further, in the programmable logic circuit according to the present invention shown in FIG. 22, during the operation of the programmable logic circuit, by the control signal 58 of the control unit 52, a desired programmable function unit 51 which has already been programmed may be selected and may be dynamically provided with other configuration data again. After the other configuration data is overwritten in the selected programmable function unit 51, the selected programmable function unit 51 starts to operate as another logic circuit.

In the programmable logic circuit including a plurality of logic cells, a number of the logic cells operating substantially a the same time is not so large. Therefore, by dynamically re-programming the logic cell which is temporarily not being used into another logic circuit, a number of programmable circuits may be significantly increased.

Figure 23:
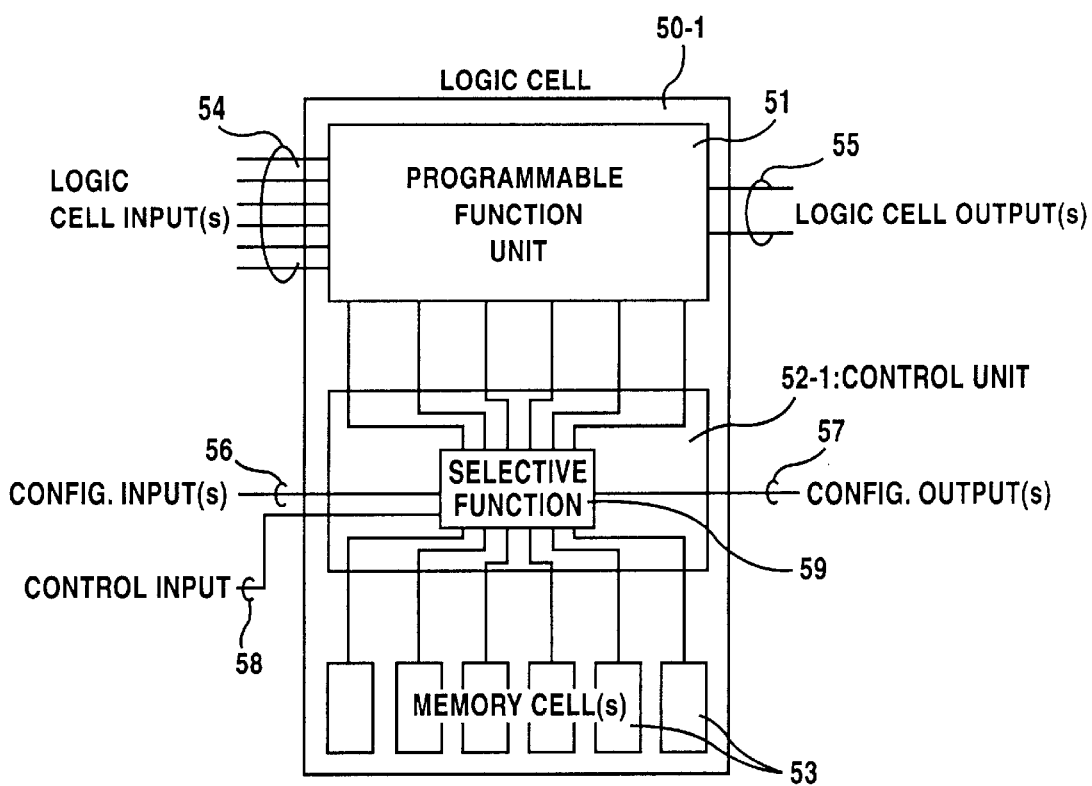
FIG. 23 shows one configuration example of the logic cell shown in FIG. 22.

FIG. 23 shows one configuration example of the logic cell 50 shown in FIG. 22. Elements in FIG. 23 which are the same as those of FIG. 22 are given the same reference numerals. In a logic cell 50-1 shown in FIG. 23, a control unit 52-1 includes a selective function part 59. The selective function part 59 selects one of the plurality of groups of configuration data by a control signal 58, and provides it to the programmable function unit 51. As discussed above, even when the programmable logic circuit is operating, the selective function part 59 is operable, and desired configuration data may be dynamically provided to the programmable function unit 51.

Further, in the programmable logic circuit shown in FIG. 22, the configuration data provided in the programmable function unit 51 is not limited to the configuration data stored in the configuration memory 53, but output signals of the other logic cells and externally provided signals may be used.

Figure 24:
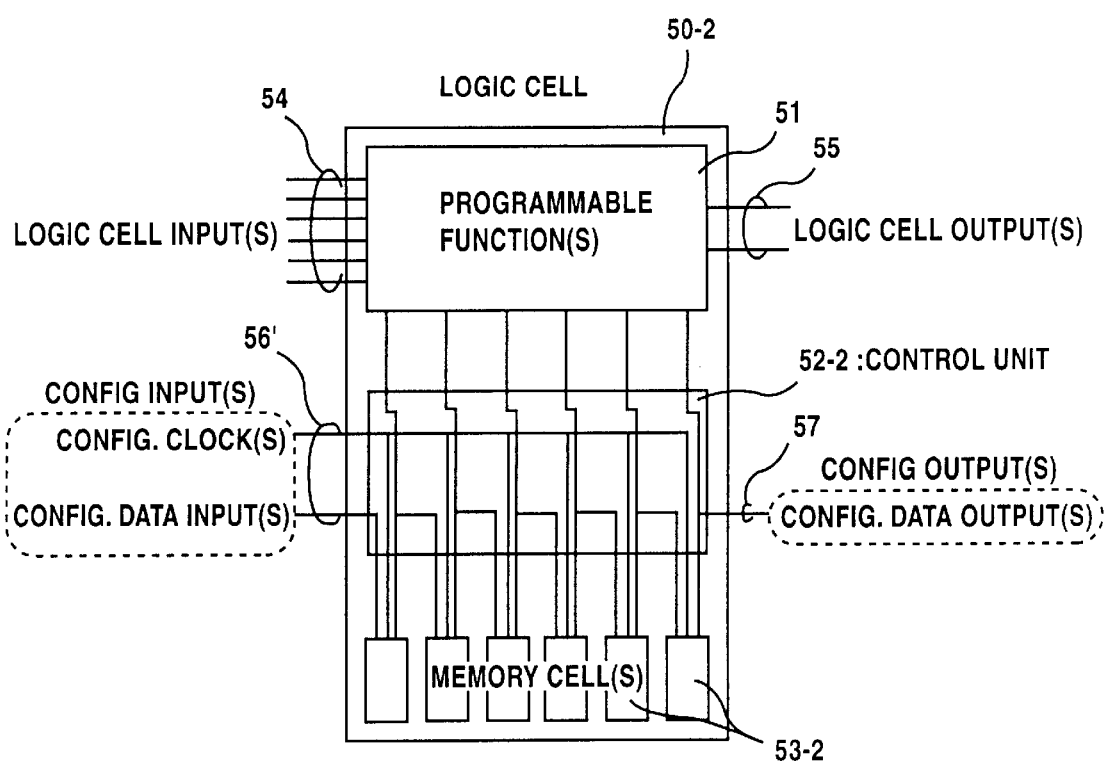
FIG. 24 shows another configuration example of the logic cell shown in FIG. 22.

FIG. 24 shows another configuration example of the logic cell 50 shown in FIG. 22. Elements in FIG. 24 which are the same as those of FIG. 22 are given the same reference numerals. In a logic cell 50-2 shown in FIG. 24, by a control unit 52-2, a configuration memory 53-2 is constructed with a plurality of memories connected in series. Namely, by a configuration clock provided to the control unit 52-2, the configuration data is serially transmitted to the configuration memory 53-2.

After the serial configuration data is set in the configuration memory 53-2, by a trigger signal (not shown), the serial configuration data is provided to the programmable function unit 51 in parallel. After that, new serial configuration data may be set in the configuration memory 53-2. When the previously set logic circuit in the programmable function unit 51 becomes unnecessary during operation of the programmable logic circuit, the prepared new configuration data is provided to the programmable function unit 51 by a trigger signal (not shown), and a new logic circuit starts in the programmable function unit 51.

Figure 25:
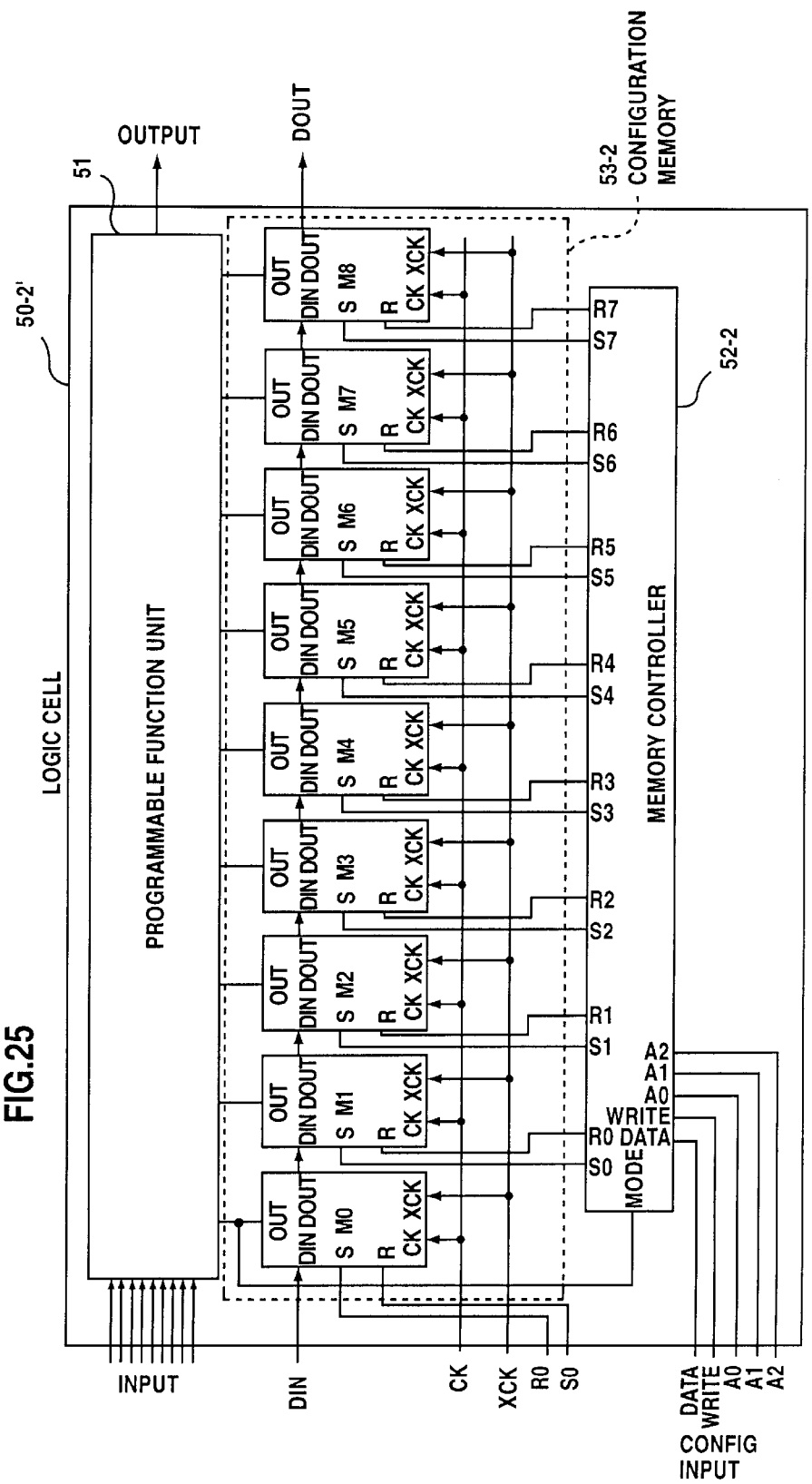
FIG. 25 shows a detailed configuration example of the logic cell 50-2 shown in FIG. 24.

FIG. 25 shows a detailed configuration example of the logic cell 50-2 shown in FIG. 24. In a logic cell 50-2' shown in FIG. 25, as compared to the logic cell 50-2 shown in FIG. 24, the configuration memory 53-2 is illustrated between the programmable function unit 51 and a memory controller 52-2 operable as the control unit. The configuration memory 53-2 is constructed with a shift register having circuit cells M0 to M8. Therefore, in the same way as the logic cell 50-2 shown in FIG. 24, serial configuration data DIN may be set in the configuration memory 53-2 by a clock CK.

Further, when the circuit cells M0 to M8 are constructed with the shift register shown in FIG. 7 or FIG. 8, each circuit-cell state may be set to a desired state by providing desired data from the memory controller 52-2 to the input terminals R and S of the respective circuit cells. Values of the input terminals R0 to R7, S0 to S7 of the circuit cells are determined by a signal provided to a configuration input of the memory controller 52-2. Namely, even after the configuration data is loaded into the configuration memory 53-2 (M0 to M8) and the logic function of the programmable function unit 51 is determined, when the signal provided to the configuration input is changed during operation of the programmable logic circuit, the logic function of the programmable function unit 51 may also be dynamically changed.

Next, a description will be given of another configuration example of the logic cell constituting the programmable logic circuit according to the present invention.

Figure 26:
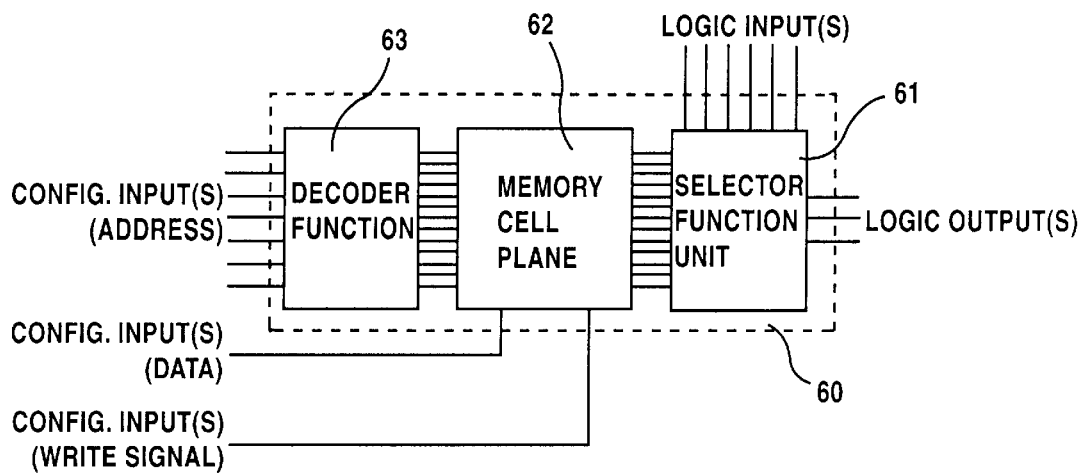
FIG. 26 shows a configuration example of a look-up-table-type logic cell constituting the programmable logic circuit according to the present invention.

FIG. 26 shows a configuration example of a look-up-table-type logic cell constituting the programmable logic circuit according to the present invention. A logic cell 60 shown in FIG. 26 is constructed with a selector function unit 61, a memory cell plane 62, and a decoder function unit 63. The selector function unit 61 corresponds to the decoder circuit 30 shown in FIG. 12, and the memory cell plane 62 corresponds to the memory cell 28 shown in FIG. 12, which constructs a look-up table. The decoder function unit 63 determines an address of the memory when writing the configuration data to the memory.

As compared to the logic cell shown in FIG. 22, the selector function unit 61, the memory cell plane 62, and the decoder function unit 63 respectively correspond to the programmable function unit 51, the configuration memory 53, and the control unit 52 shown in FIG. 22. Therefore, in the logic cell shown in FIG. 26, in the same way as the logic cell shown in FIG. 22, when the programmable logic circuit is operating, the logic function of the selector function unit 61 may be changed by changing the configuration data of the memory cell plane 62.

Figure 27:
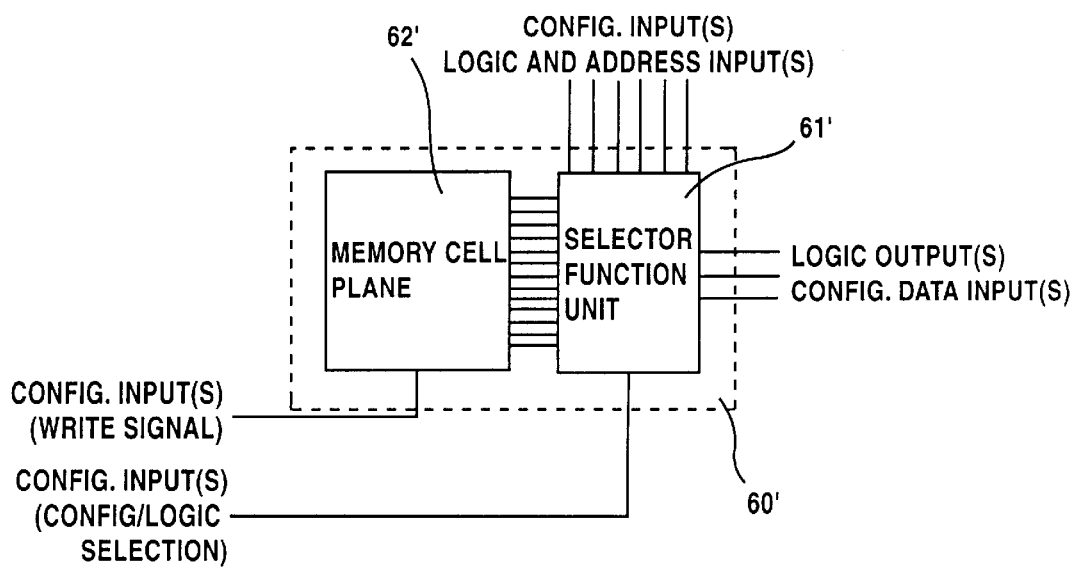
FIG. 27 shows a modification example of the logic cell shown in FIG. 26.

FIG. 27 shows a modification example of the logic cell shown in FIG. 26. A logic cell 60' shown in FIG. 27 is constructed with a selector function unit 61' and a memory cell plane 62'. In the logic cell 60', the function of the decoder function unit 63 shown in FIG. 26 is divided into the selector function unit 61' and the memory cell plane 62'.

Namely, in the logic cell 60', the configuration data is provided to the memory cell plane 62' through the selector function unit 61'. In this case, an address input for the memory cell plane 62' is also provided through the selector function unit 61!. Therefore, the logic cell 60' may have a simpler circuit configuration as compared to the logic cell 60 shown in FIG. 26, and may have the same dynamical re-programmable function.

Figure 28:
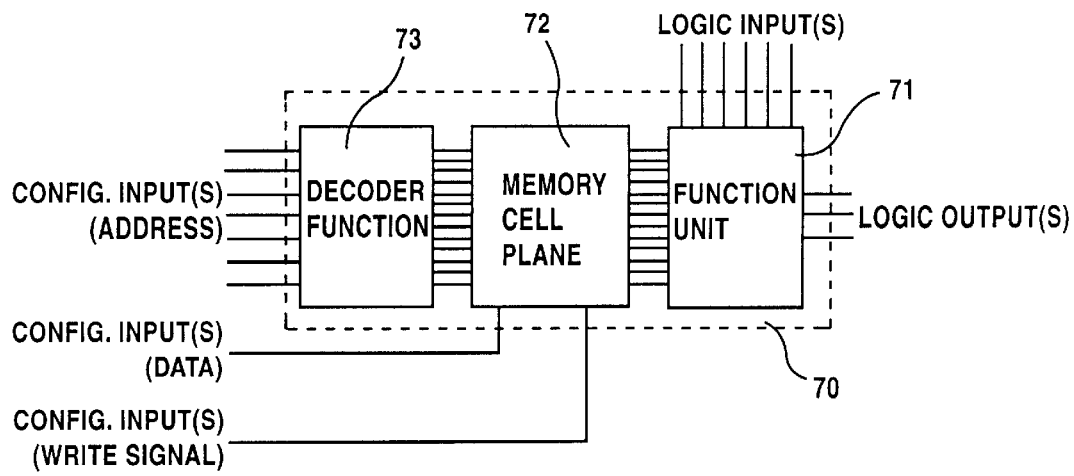
FIG. 28 shows another logic cell of the programmable logic circuit according to the present invention.

FIG. 28 shows another logic cell of the programmable logic circuit according to the present invention. A logic cell 70 shown in FIG. 28 is constructed with a programmable function unit 71, a memory cell plane 72, and a decoder function unit 73. Namely, the logic cell 70 has substantially the same configuration as that of the logic cell shown in FIG. 22. The programmable function unit 71 corresponds to the programmable function unit 51 shown in FIG. 22, and may be constructed with a logic-selection-type circuit or an AND-OR plane-type circuit (to be described in detail later). The memory cell plane 72 and the decoder function unit 73 respectively have substantially the same functions as those of the memory cell plane 62 and the decoder function unit 63 shown in FIG. 26. Therefore, the logic cell 70 may also have substantially the same dynamical re-programmable function.

Figure 29:
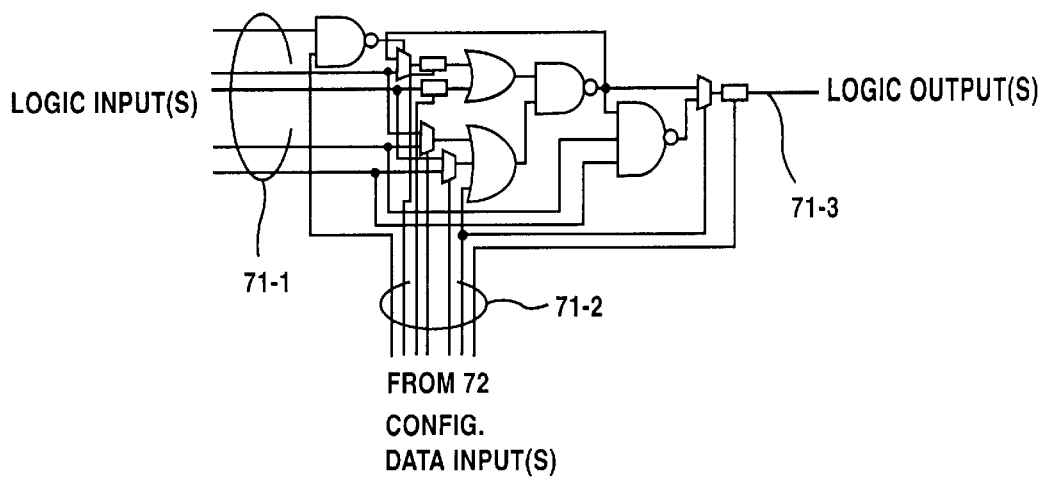
FIG. 29 shows an embodiment of a programmable function unit of the logic cell shown in FIG. 28.

FIG. 29 shows an embodiment of the programmable function unit 71 of the logic cell shown in FIG. 28. As shown in FIG. 29, the programmable function unit 71 may be constructed with logic gates such as NAND and OR, a feedback circuit, a gate circuit, a selection circuit, etc. In the programmable function unit 71 shown in FIG. 29, configuration data 71-2 from the memory cell plane 72 is provided to the selection circuit and the gate circuit to determine the logic function. An input signal 71-1 is processed by the programed logic function, and is produced as an output signal 71-3.

Figure 30:
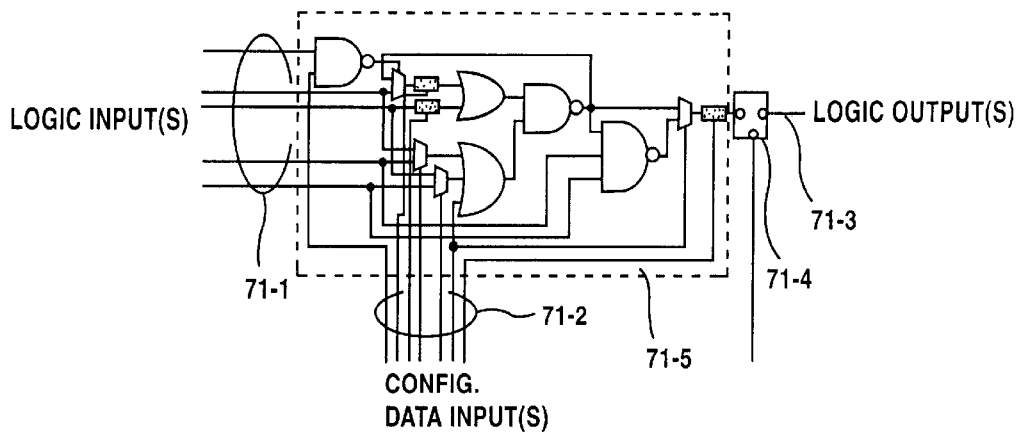
FIG. 30 and FIG. 31 show different modifications of the programmable function unit shown in FIG. 29.

FIG. 30 shows a modification of the programmable function unit 71 shown in FIG. 29. Elements in FIG. 30 which are the same as those of FIG. 29 are given the same reference numerals. In the programmable function unit 71 shown in FIG. 30, as compared to the programmable function unit 71 shown in FIG. 29, a latch circuit 71-4 is provided on the output side. Due to the latch circuit 71-4, during the logic cell is being re-programed, the output value of the logic cell is prevented from changing.

Further, in the above-discussed configuration, when the feedback path is properly set in a function unit part 71-5 and when the same control signal (which is inverted as necessary) as that for the feedback path is used for the latch circuit 71-4, a master-slave flip-flop may be constructed.

Figure 31:
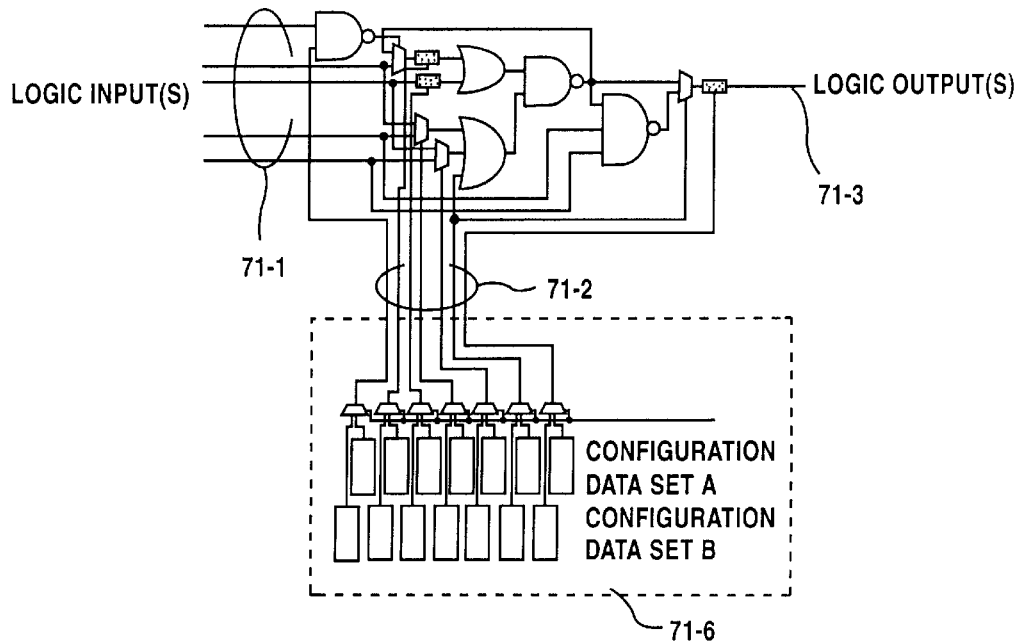

FIG. 31 shows another modification of the programmable function unit 71 shown in FIG. 29. Elements in FIG. 31 which are the same as those of FIG. 29 are given the same reference numerals. In the programmable function unit 71 shown in FIG. 31, as compared to the programmable function unit 71 shown in FIG. 29, a memory unit 71-6 storing two kinds of configuration data is provided to generate the configuration data 71-2.

The two kinds of configuration data are previously written in the memory unit 71-6. Therefore, the two kinds of configuration data may be instantaneously switched to each other. Accordingly, by switching the two kinds of configuration data as necessary, a logic circuit functionally larger than a physically determined logic circuit size may be realized. In this case, the configuration data in the unused side of the memory may be flexibly rewritten. Therefore, the functional circuit size further may be substantially increased.

Next, a description will be given of an I/O module constituting the programmable logic circuit according to the present invention.

Figure 32A:
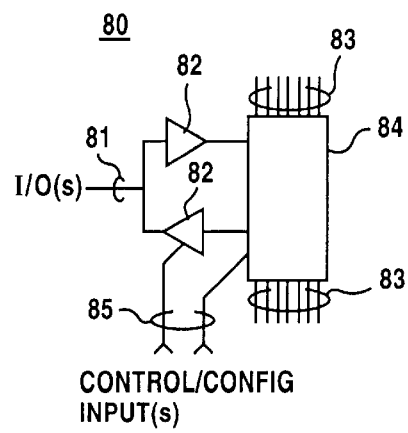
FIG. 32A and FIG. 32B show configuration examples of an I/O module constituting the programmable logic circuit according to the present invention.
Figure 32B:
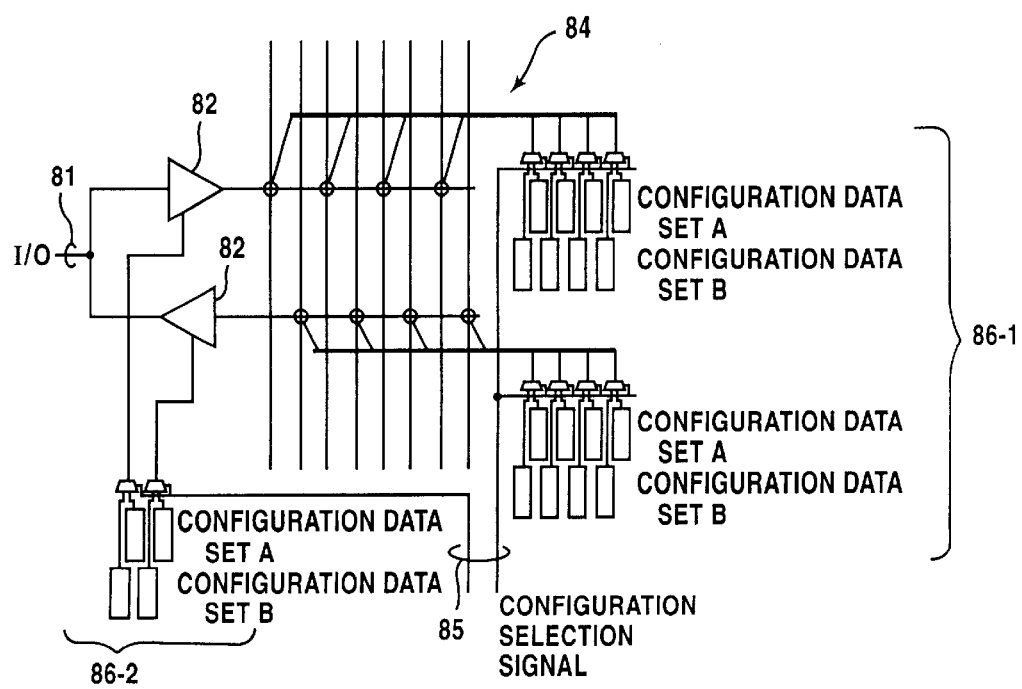

FIG. 32A and FIG. 32B show configuration examples of the I/O module constituting the programmable logic circuit according to the present invention. FIG. 32A shows a basic configuration of the I/O module, and FIG. 32B shows a configuration of the I/O module including memory units. An I/O module 80 shown in FIG. 32A is constructed with a terminal 81 for communicating with an external circuit, signal-waveform-reshaping-and-buffering circuits 82, groups of signal lines 83 connected to the logic cells and a bus between the logic cells, an I/O connection unit 84 flexibly connecting the groups of signals, and control/configuration input signals 85.

By the control/configuration input signals 85, even when the programmable logic circuit is operating, a connection structure of the I/O connection unit 84 and directions of the input-and-output signals may be changed. Also, it is possible to control only the output signal. In the above-discussed configuration of the I/O module, other circuits such as a flip-flop may be further provided.

The I/O module shown in FIG. 32B has memory units 86-1, 86-2 for the I/O connection unit 84 and the signal-waveform-reshaping-and-buffering circuits 82. Each of the memory units 86-1, 86-2, in the same way as the memory unit 71-6 of the logic cell shown in FIG. 31, has two kinds of configuration data. Therefore, the two kinds of configuration data may be instantaneously switched to each other. Accordingly, by switching the two kinds of configuration data as necessary, a logic circuit functionally larger than a physically determined logic circuit size may be realized.

Next, a description will be given of a switch box constituting the programmable logic circuit according to the present invention.

Figure 33:
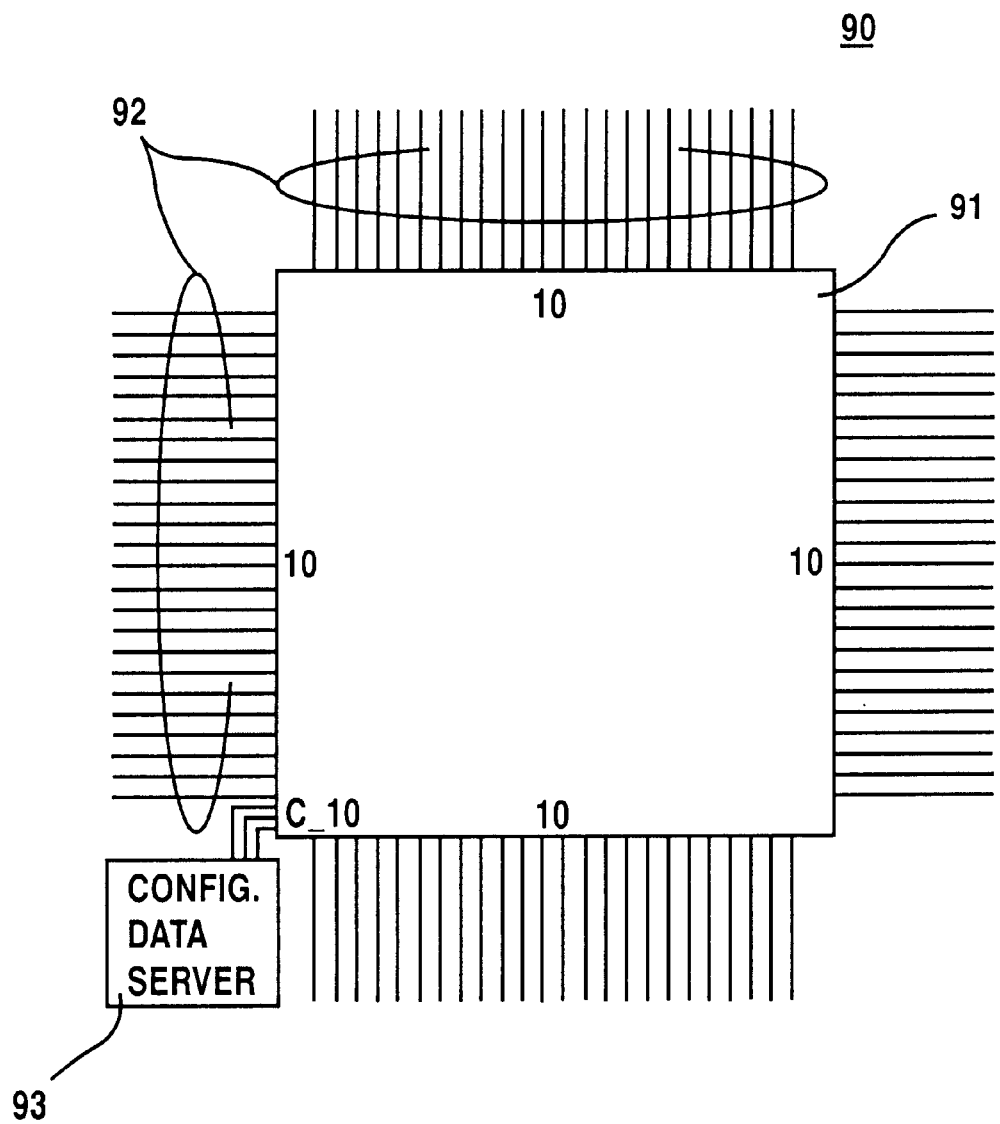
FIG. 33 shows a configuration example of a switch box constituting the programmable logic circuit according to the present invention.

FIG. 33 shows a configuration example of the switch box constituting the programmable logic circuit according to the present invention. The switch box is arranged between the respective logic cells, and flexibly connects between the logic cells. A switch box 90 is constructed with a switch box body 91, groups of signal lines 92, and a connection-structure configuration-data server 93.

Figure 34C:
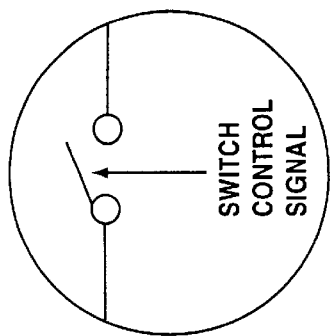
FIG. 34A, FIG. 34B, and FIG. 34C show configuration examples of the switch box shown in FIG. 33.
Figure 34B:
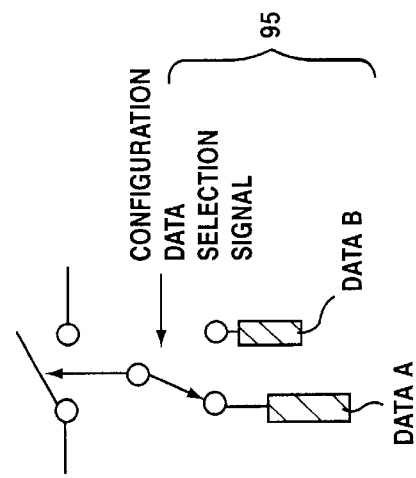
Figure 34A:
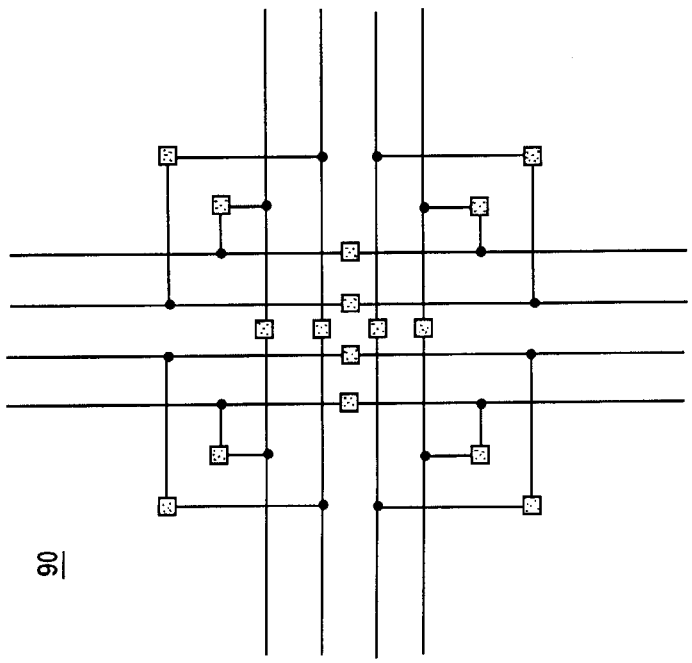

FIG. 34A, FIGS. 34B, and 34C show a configuration example of the switch box 90 shown in FIG. 33. FIG. 34A shows a basic configuration example, and FIG. 34B shows a configuration example of a switch part including a memory unit. In FIGS. 34A, and 34C in the switch box body 91, the groups of signal lines 92 are arranged so as to be connectable to each other by a plurality of switches as shown in FIG. 34C. These switches may be constructed using transmission gates or transistors. Further, these switches are controlled by the connection-structure configuration-data server 93. Therefore, by the connection-structure configuration-data server 93, even when the programmable logic circuit is operating, the connection structure of the switch box body 91 may be flexibly changed.

The switch part shown in FIG. 34B has a memory unit 95. The memory unit 95, in the same way as the memory unit 71-6 of the logic cell shown in FIG. 31, has two kinds of configuration data A, B. Therefore, the two kinds of configuration data may be instantaneously switched to each other. Accordingly, by switching the two kinds of configuration data as necessary, a logic circuit functionally larger than a physically determined logic circuit size may be realized.

Next, a description will be given of a variety of configuration examples of the programmable logic circuit according to the present invention.

Figure 35:
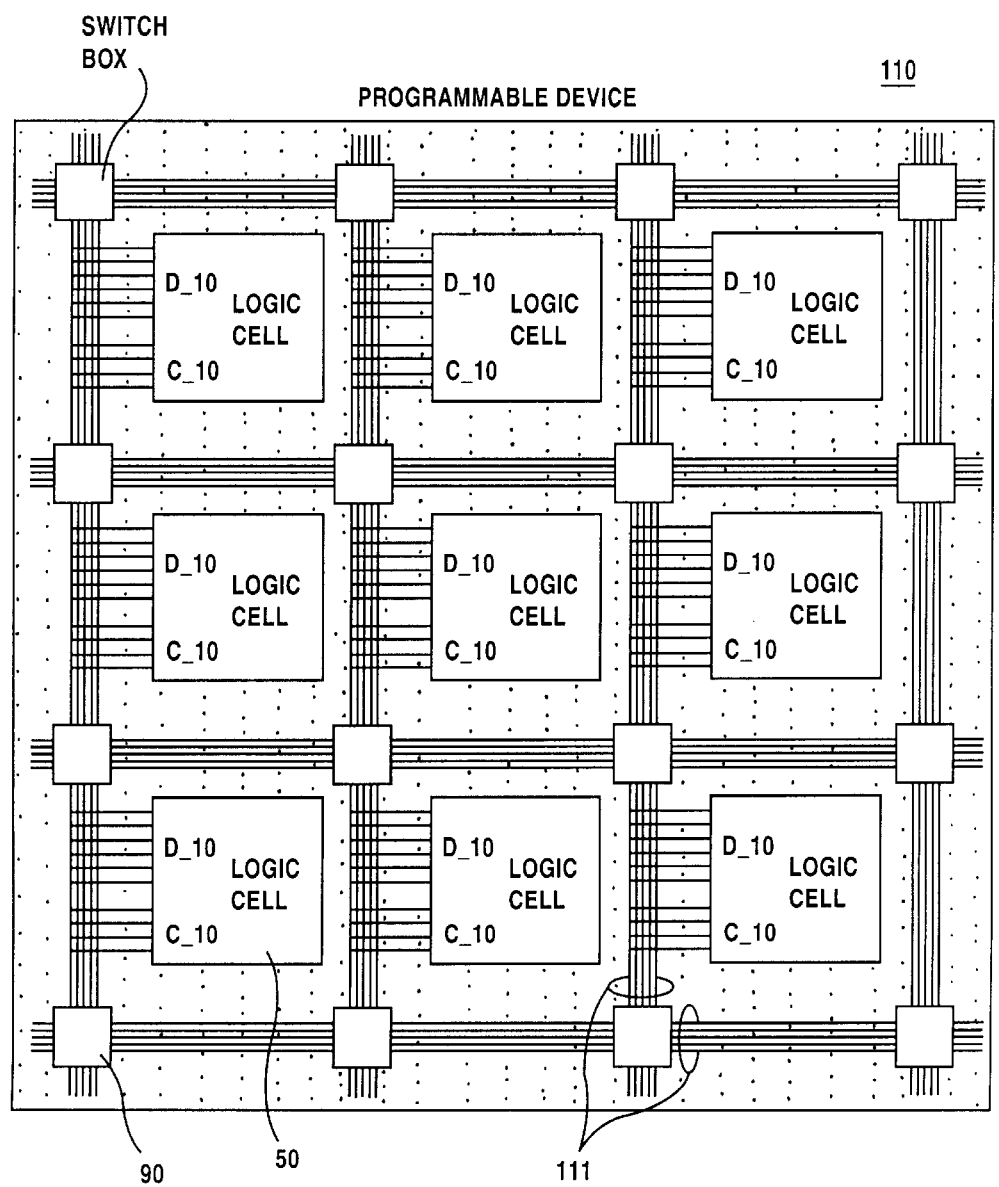
FIG. 35 shows a first configuration example of the programmable logic circuit according to the present invention.

FIG. 35 shows a first configuration example of the programmable logic circuit according to the present invention. In FIG. 35, a programmable logic circuit 110 (represented by "Programmable Device" in the drawing) has a plurality of logic cells 50 shown in FIG. 22, a plurality of switch boxes 90 shown in FIG. 33 for connecting the logic cells, and a plurality of I/O modules 80 (not shown). Each of these configuration elements may be dynamically re-programed.

The logic cell 50 includes the programmable function unit 51, the control unit 52, and the configuration memory 53. The configuration memory 53 may be constructed with the shift register according to the present invention in which the state of the circuit cells may be partially set, as well as a conventional memory. By the control unit 52, the state of the logic cell 50 may be re-determined during operation of the programmable logic circuit. In FIG. 35, a signal from the configuration input C_IO of the logic cell 50 is provided to the configuration memory 53 through the control unit 52 (see FIG. 22).

Further, the switch box 90 may be constructed with transmission gates and transistors.

In FIG. 35, the configuration input C_IO of the logic cell 50 is connected to wire lines 111 arranged between the logic cells 50. Therefore, even when the programmable logic circuit is operating, an output signal of another logic cell or an output signal of the own logic cell may be provided to a desired logic cell as the configuration data. Accordingly, by an instruction produced from a given logic cell, the logic function of the programmable function unit of the desired logic cell may be changed at any time.

Further, by controlling the switch box 90 using the output signal of the logic cell 50, the connection state between the logic cells may be also changed. As discussed above, by the dynamical re-programming of the logic cells, the switch boxes, etc., a large number of circuits more than the realizable number of circuits determined by the number of gates may be obtained.

Further, when a hardware emulator is constructed with a plurality of the above-discussed programmable logic circuits, it becomes possible to emulate a large-size logic circuit by a smaller number of programmable logic circuits, as compared to the prior-art hardware emulator. In addition, since a required number of programmable logic circuits may be extremely reduced, emulation cost also may be extremely reduced.

Figure 36:
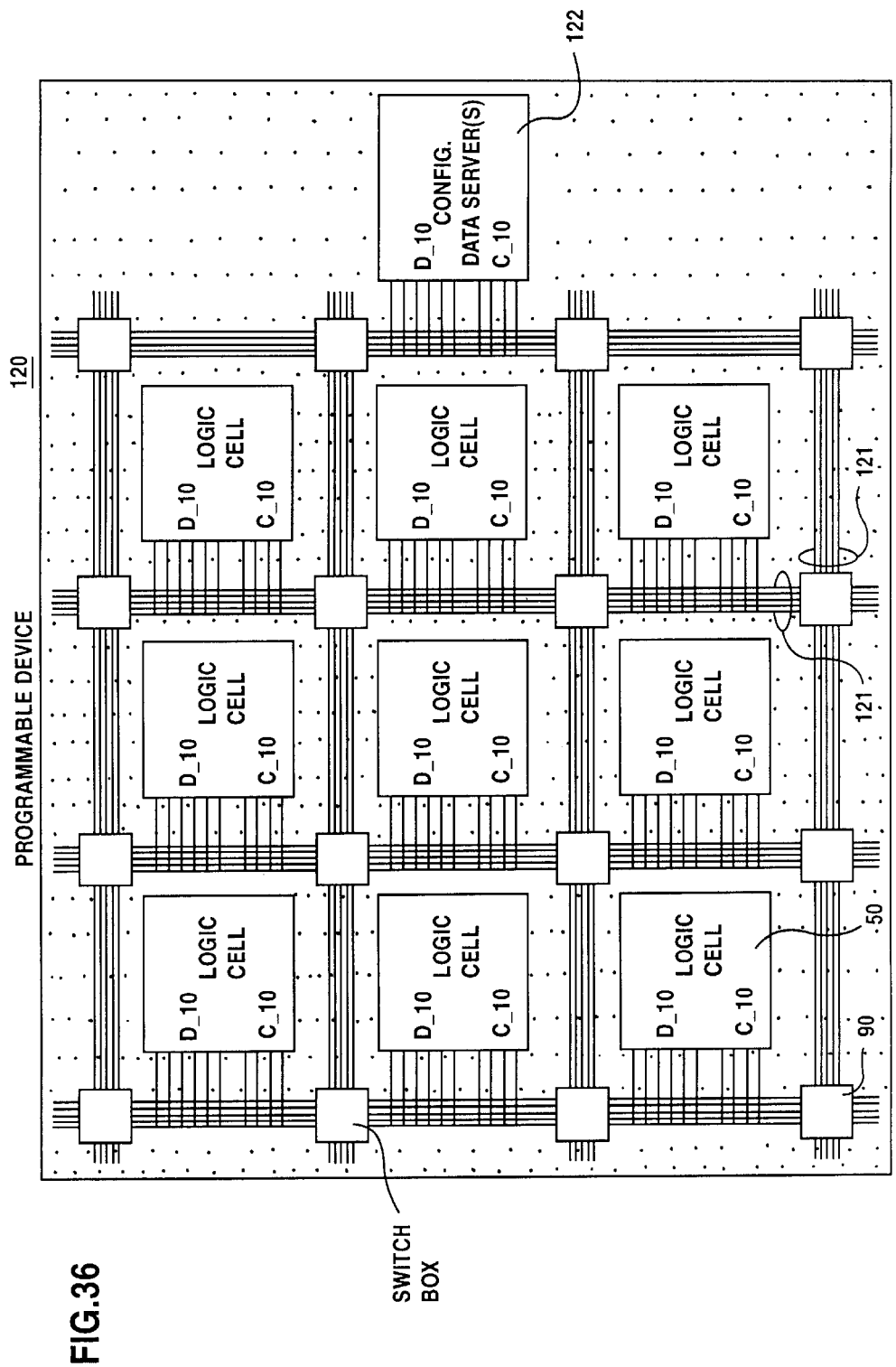
FIG. 36 shows a second configuration example of the programmable logic circuit according to the present invention.

FIG. 36 shows a second configuration example of the programmable logic circuit according to the present invention. In FIG. 36, a programmable logic circuit 120 has a plurality of logic cells 50 shown in FIG. 22, a plurality of switch boxes 90 shown in FIG. 33 for connecting the respective logic cells, a plurality of I/O modules 80 (not shown), and a configuration-data server 122.

The configuration input C_IO of the logic cell 50 is connected to wire lines 121 arranged between the logic cells 50. Also, a configuration input C_IO of the configuration-data server 122 is connected to the wire lines 121.

Therefore, even when the programmable logic circuit is operating, an output signal of another logic cell, an output signal of the own logic cell, or an output signal of the configuration-data server 122 may be provided to a desired logic cell as the configuration data. Accordingly, by an instruction produced from a given logic cell or the configuration-data server 122, the logic function of the programmable function unit of the desired logic cell may be changed at any time.

Further, by simultaneously providing the configuration data from the configuration-data server 122 to a plurality of logic cells, a large part of the logic function of the programmable logic circuit may be updated.

Figure 37:
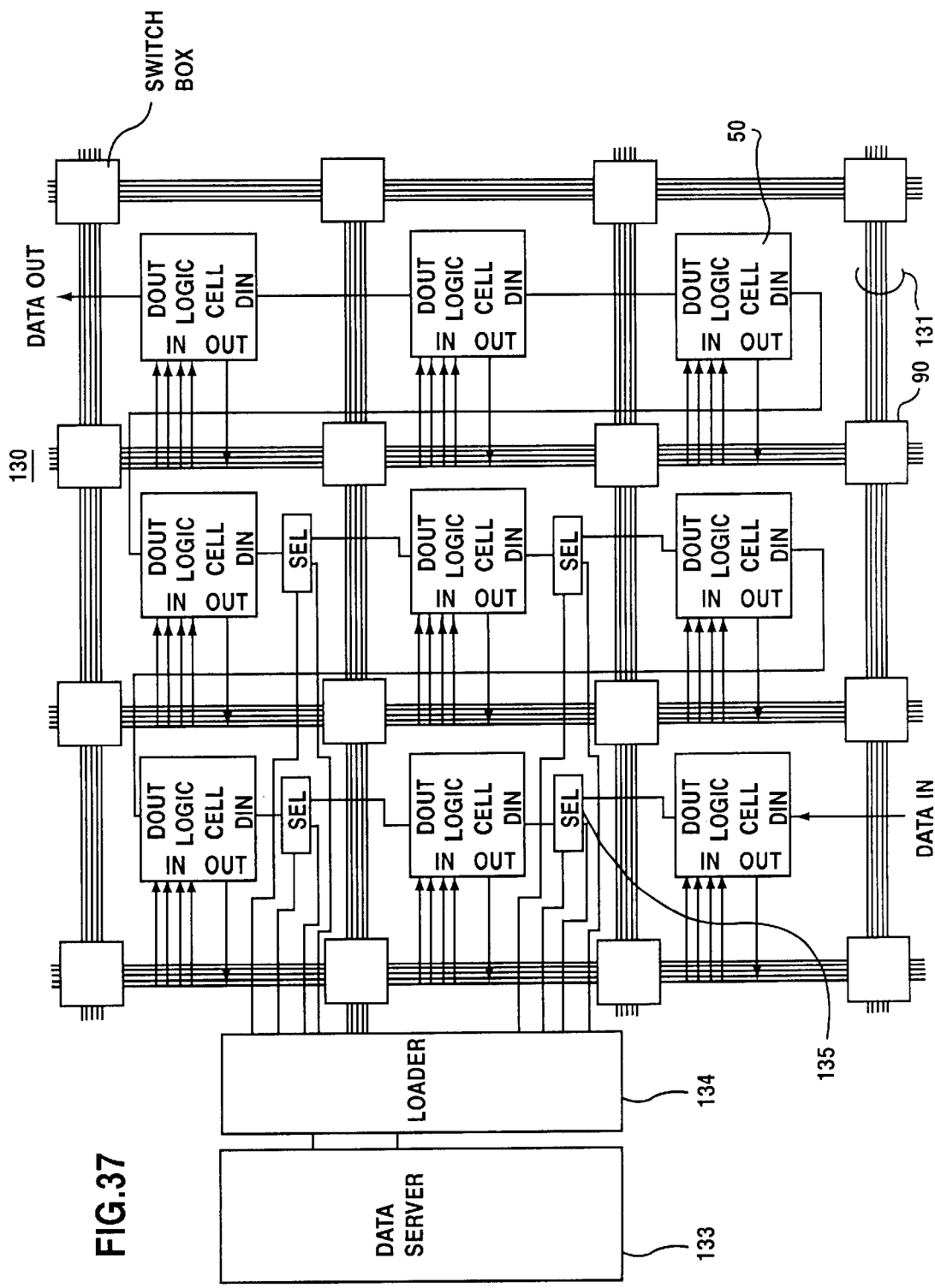
FIG. 37 shows a third configuration example of the programmable logic circuit according to the present invention.

FIG. 37 shows a third configuration example of the programmable logic circuit according to the present invention. In FIG. 37, a programmable logic circuit 130 has a plurality of logic cells 50 shown in FIG. 22, a plurality of switch boxes 90 shown in FIG. 33 for connecting the respective logic cells, a plurality of I/O modules 80 (not shown), a configuration-data server 133, a loader 134, and a plurality of selection circuits 135.

The configuration-data server 133 and the loader 134 provide external data to the configuration memories of selected ones of the logic cells. Therefore, in the same way as the second configuration example shown in FIG. 36, each logic cell does not need to have dedicated configuration data and loader.

In the third configuration example of the programmable logic circuit, after the configuration data is loaded, the external data from the configuration-data server 133 may be selectively loaded to the configuration memories of the logic cells selected by the selection circuit 135.

Therefore, in the programmable logic circuit shown in FIG. 37, when the programmable logic circuit is operating, the logic function of the programmable function unit of the desired logic cell may be selectively changed. Accordingly, a large number of circuits more than the realizable number of circuits determined by the number of gates may be obtained.

Figure 38:
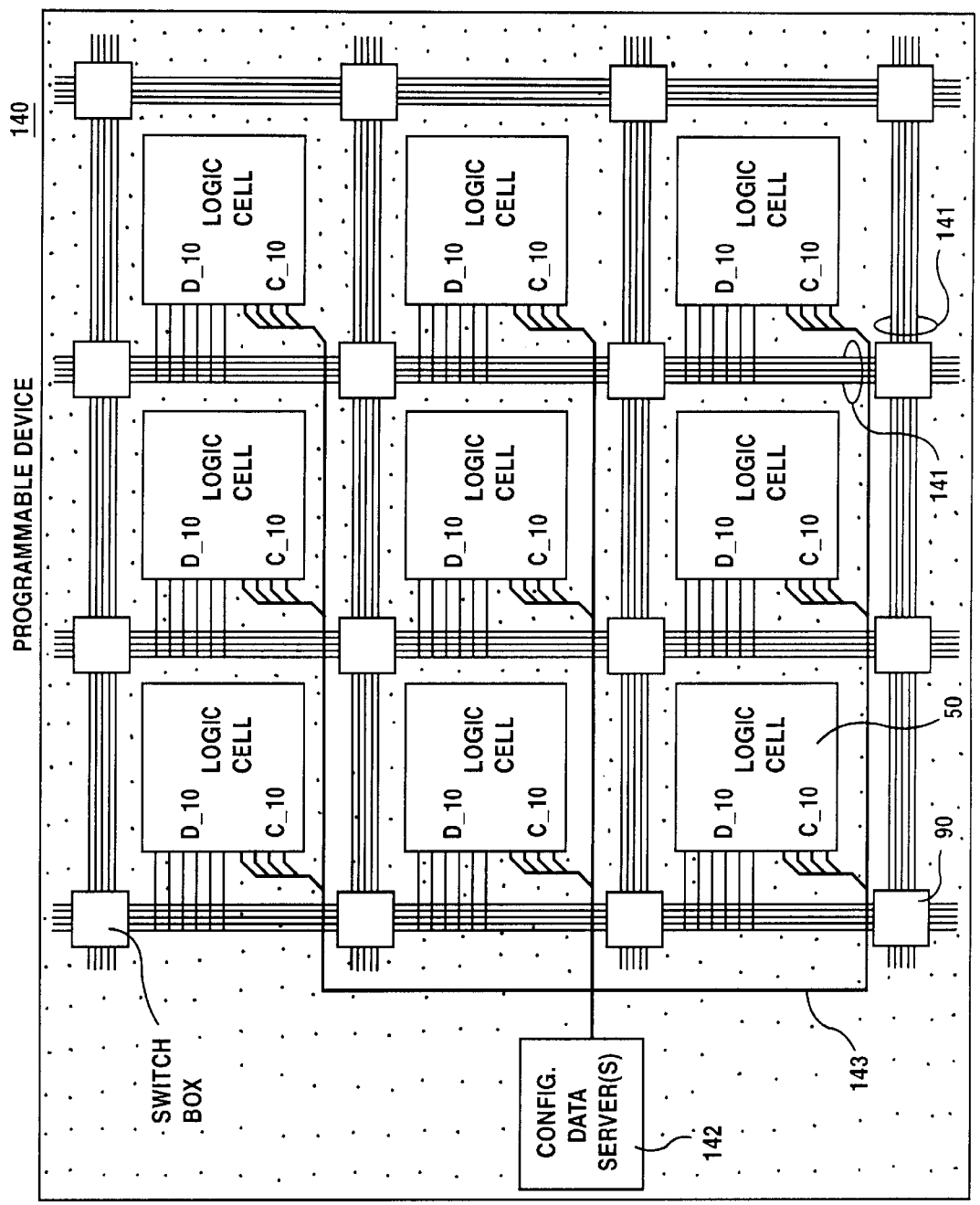
FIG. 38 shows a fourth configuration example of the programmable logic circuit according to the present invention.

FIG. 38 shows a fourth configuration example of the programmable logic circuit according to the present invention. In FIG. 38, a programmable logic circuit 140 has a plurality of logic cells 50 shown in FIG. 22, a plurality of switch boxes 90 shown in FIG. 33 for connecting the respective logic cells, a plurality of I/O modules 80 (not shown), a configuration-data server 142, and a configuration-data transmission dedicated line 143. A configuration input C_IO of the configuration-data server 142 is connected to the respective configuration inputs C_IO of the logic cells 50 through the dedicated line 143.

Therefore, even when the programmable logic circuit is operating, the configuration data from the configuration-data server 142 may be provided to the desired logic cell. Accordingly, by an-instruction produced from the own logic cell or the configuration-data server 142, the logic function of the programmable function unit of the desired logic cell may be changed at any time.

Further, by simultaneously providing the configuration data from the configuration-data server 142 to a plurality of logic cells, a large part of the logic function of the programmable logic circuit may be updated.

Figure 39:
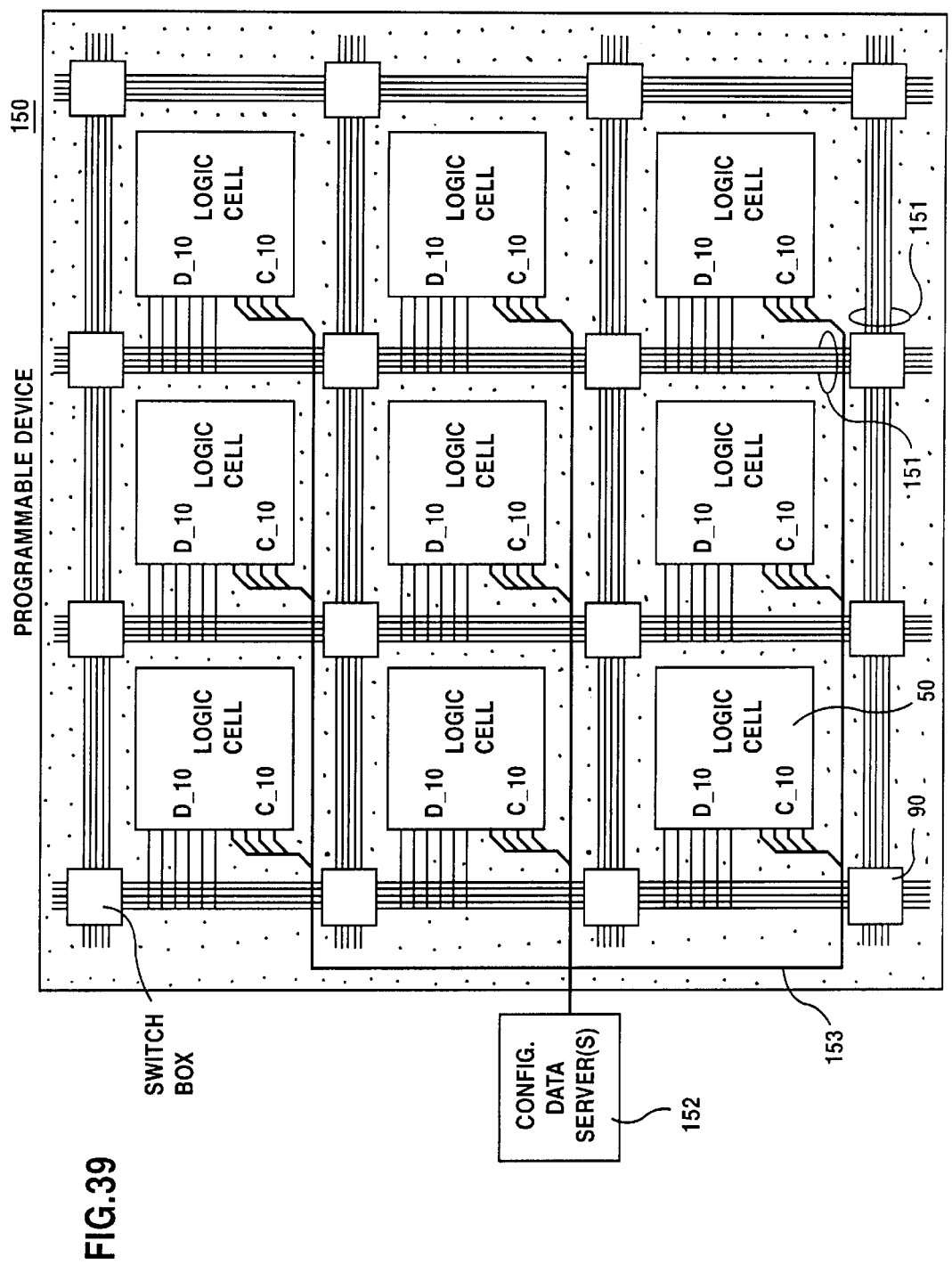
FIG. 39 shows a fifth configuration example of the programmable logic circuit according to the present invention.

FIG. 39 shows a fifth configuration example of the programmable logic circuit according to the present invention. In FIG. 39, a programmable logic circuit 150 has a plurality of logic cells 50 shown in FIG. 22, a plurality of switch boxes 90 shown in FIG. 33 for connecting the respective logic cells, a plurality of I/O modules 80 (not shown), and a configuration-data transmission dedicated line 153. Different from the fourth configuration example shown in FIG. 38, a configuration-data server 152 is provided outside of the programmable logic circuit, and may be connected to the dedicated line 153 through an interface circuit. A configuration input C_IO of the outside configuration-data server 152 may be connected to the respective configuration inputs C_IO of the logic cells 50 through the dedicated line 153.

Therefore, even when the programmable logic circuit is operating, the configuration data from the configuration-data server 152 may be provided to the desired logic cell. Accordingly, by an instruction produced from the own logic cell or the configuration-data server 152, the logic function of the programmable function unit of the desired logic cell may be changed at any time.

Further, by simultaneously providing the configuration data from the configuration-data server 152 to a plurality of logic cells, a large part of the logic function of the programmable logic circuit may be updated.

In the above-discussed fifth configuration example, since the configuration-data server 152 is provided outside of the programmable logic circuit, the programmable logic circuit may be miniaturized, and flexibility of total structure design may be improved.

Figure 40:
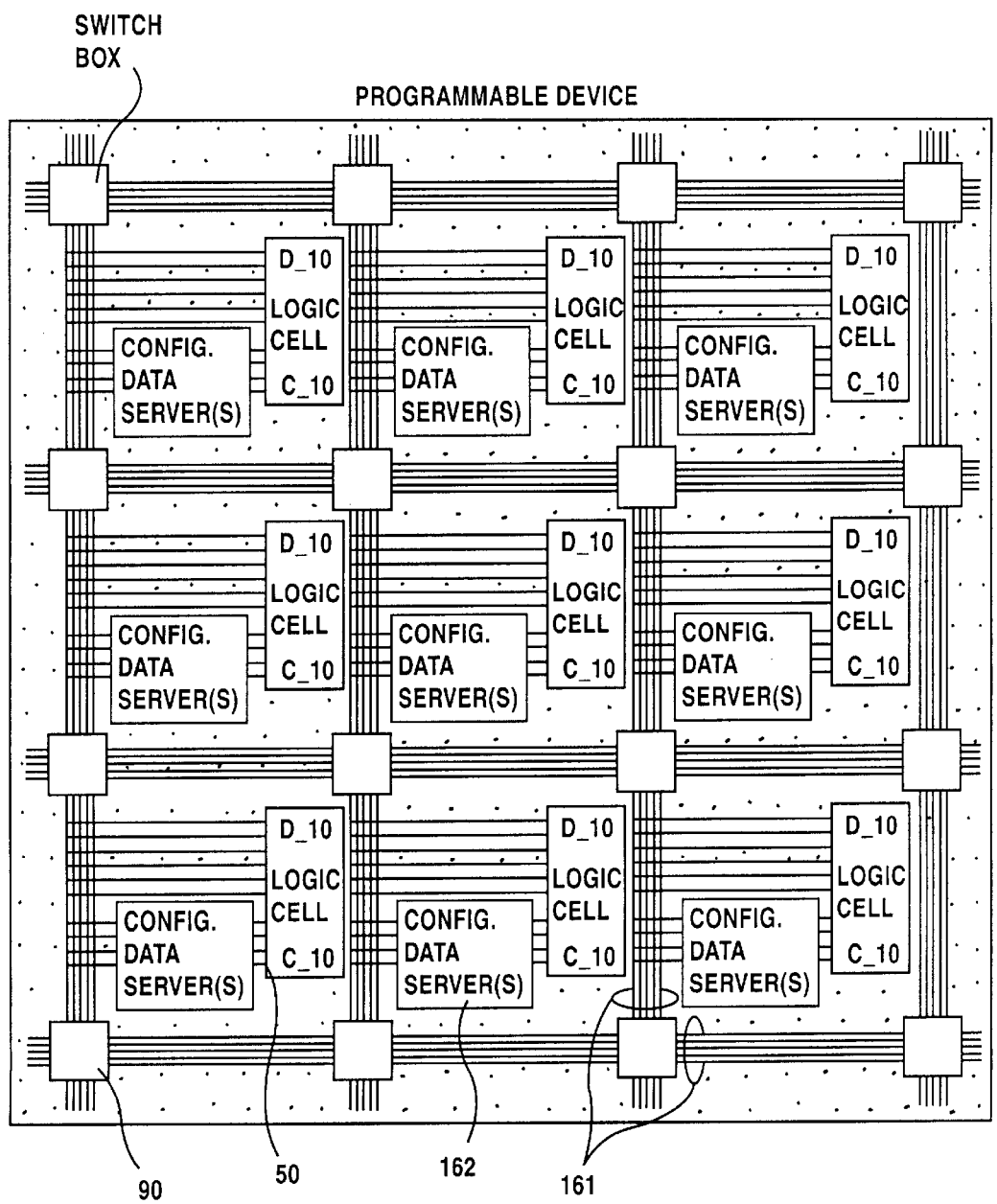
FIG. 40 shows a sixth configuration example of the programmable logic circuit according to the present invention.

FIG. 40 shows a sixth configuration example of the programmable logic circuit according to the present invention. In FIG. 40, a programmable logic circuit 160 has a plurality of logic cells 50 shown in FIG. 22, a plurality of switch boxes 90 shown in FIG. 33 for connecting the respective logic cells, a plurality of I/O modules 80 (not shown), and a plurality of configuration-data servers 162. A configuration-data server 162 is provided for each logic cell 50, and is connected to a configuration input C_IO of the logic cell 50 and wire lines 161 arranged between the logic cells 50.

Therefore, even when the programmable logic circuit is operating, an output signal of another logic cell, an output signal of the own logic cell, an output signal of the configuration-data server 162 connected to the own logic cell, or an output signal of the configuration-data server 162 connected to another logic cell may be provided to a desired logic cell as the configuration data. Accordingly, by an instruction produced from a given logic cell or the configuration-data servers 162, the logic function of the programmable function unit of the desired logic cell may be changed at any time.

In the sixth configuration example shown in FIG. 40, different from the fifth configuration example shown in FIG. 39, there is no need for providing a relatively thick dedicated line. Therefore, flexibility of the signal line design may be improved.

Figure 41:
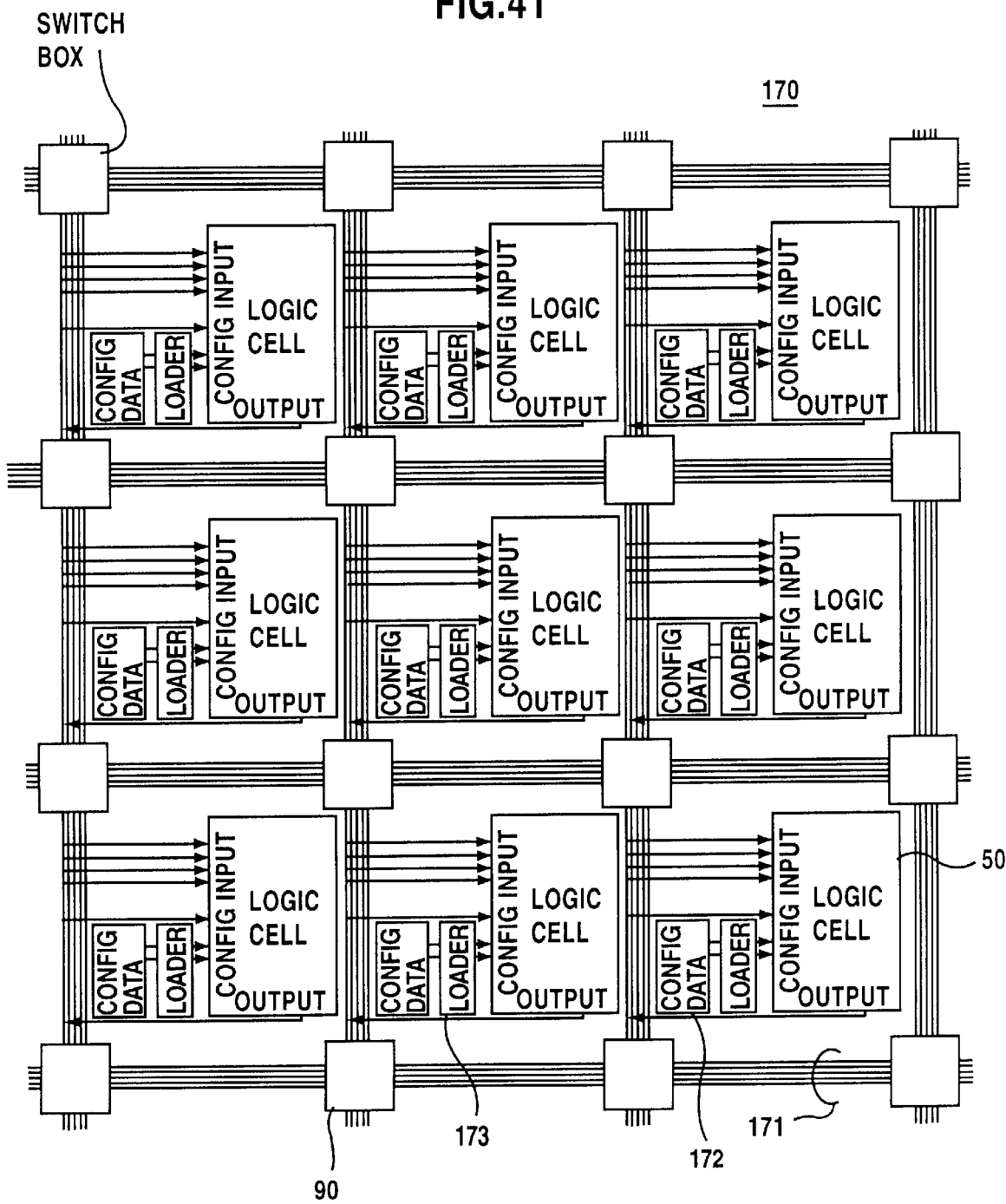
FIG. 41 shows a seventh configuration example of the programmable logic circuit according to the present invention.

FIG. 41 shows a seventh configuration example of the programmable logic circuit according to the present invention. In FIG. 41, a programmable logic circuit 170 has a plurality of logic cells 50 shown in FIG. 22, a plurality of switch boxes 90 shown in FIG. 33 for connecting the respective logic cells, a plurality of I/O modules 80 (not shown), a plurality of configuration-data servers 172, and a plurality of loaders 173. A configuration-data server 172 and a loader 173 are provided for each logic cell 50, and are connected to the configuration input C_IO of the respective logic cell 50. Further, each configuration input C_IO of the logic cell 50 is also connected to wire lines 171 arranged between the logic cells 50.

Therefore, even when the programmable logic circuit is operating, an output signal of another logic cell, an output signal of the own logic cell, an output signal of the configuration-data server 172 connected to the own logic cell, or an output signal of the configuration-data server 172 connected to another logic cell may be provided to a desired logic cell as the configuration data. Accordingly, by an instruction produced from a given logic cell or the configuration-data servers 172, the logic function of the programmable function unit of the desired logic cell may be changed at any time.

In the seventh configuration example shown in FIG. 41, different from the fifth configuration example shown in FIG. 39, there is no need for providing a relatively thick dedicated line. Therefore, flexibility of the signal line design may be improved.

Figure 42:
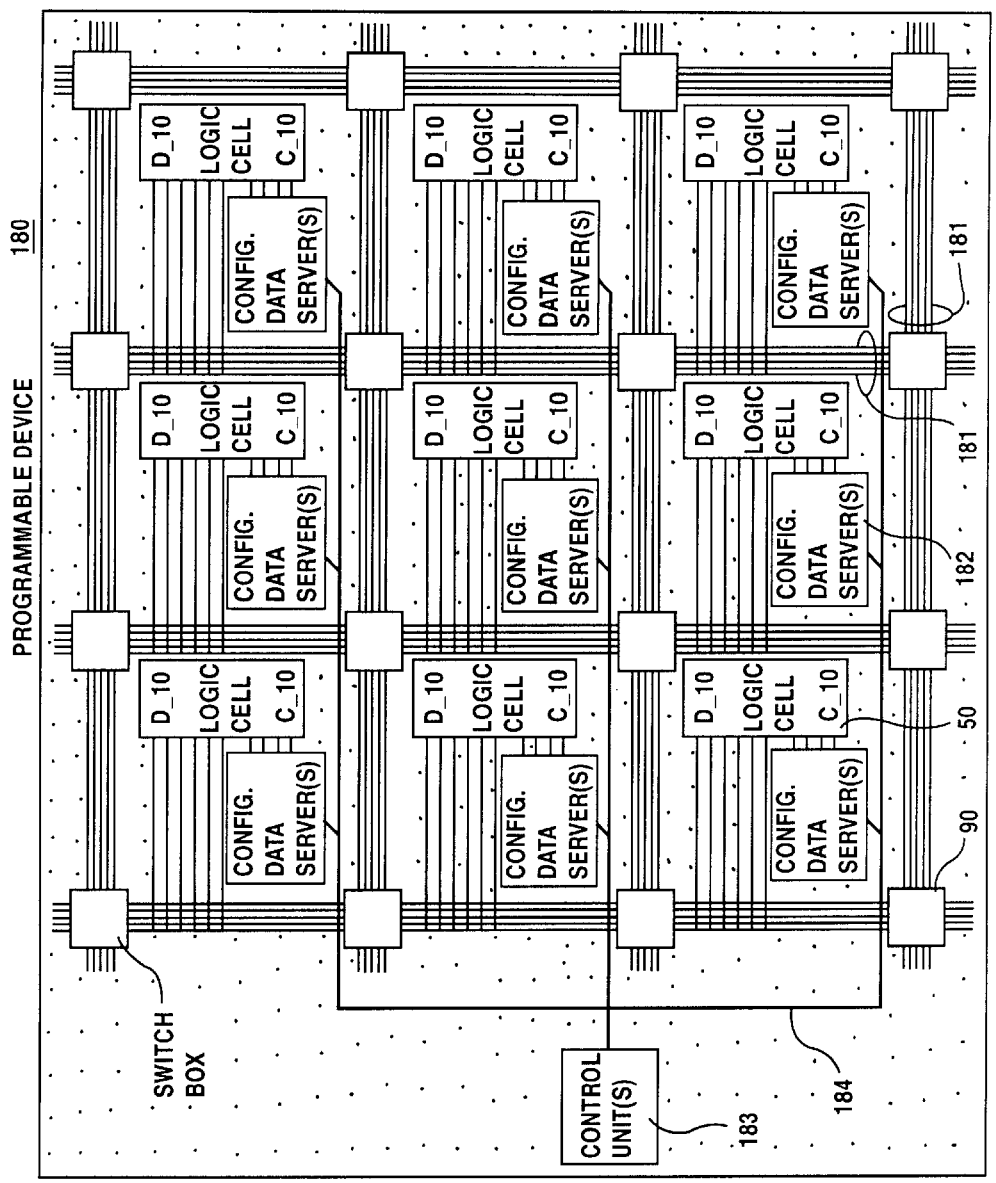
FIG. 42 shows an eighth configuration example of the programmable logic circuit according to the present invention.

FIG. 42 shows an eighth configuration example of the programmable logic circuit according to the present invention. In FIG. 42, a programmable logic circuit 180 has a plurality of logic cells 50 shown in FIG. 22, a plurality of switch boxes 90 shown in FIG. 33 for connecting the respective logic cells, a plurality of I/O modules 80 (not shown), a plurality of configuration-data servers 182, a control unit 183, and a dedicated control line 184.

A configuration-data server 182 is provided for each logic cell 50, and is connected to the configuration input C_IO of the logic cell 50. The control unit 183 is connected to the respective configuration-data servers 182 through the dedicated control line 184, and controls all the respective configuration-data servers 182 like a central control operation. Also, the control unit 183 may include the configuration-data server 142 shown in FIG. 38.

Therefore, even when the programmable logic circuit is operating, an output signal of the configuration-data server 182 connected to the own logic cell, or an output signal of the control unit 183 may be provided to a desired logic cell as the configuration data. Accordingly, by an instruction produced from the own logic cell, the configuration-data servers 182, or the control unit 183, the logic function of the programmable function unit of the desired logic cell may be changed at any time.

Figure 43:
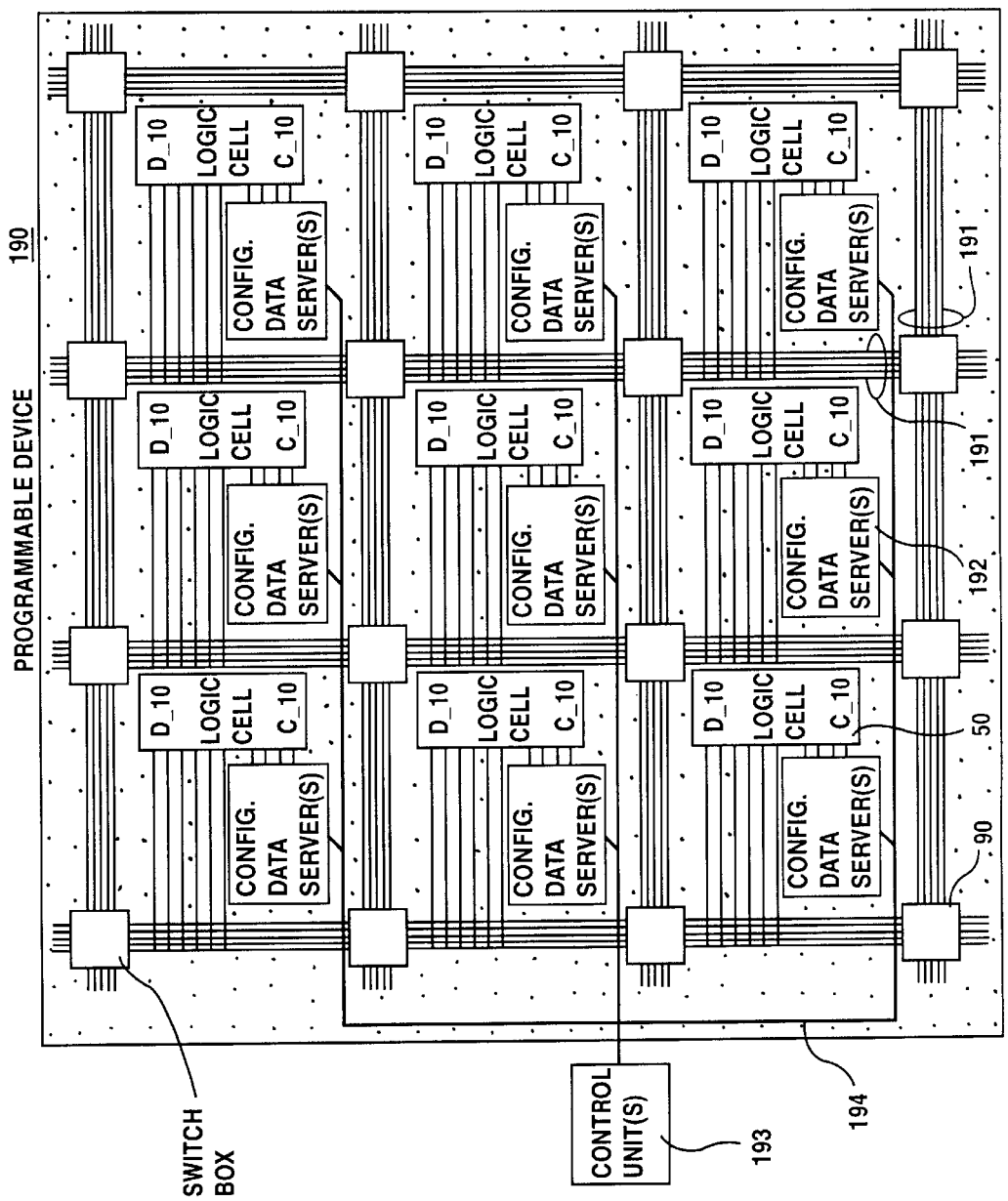
FIG. 43 shows a ninth configuration example of the programmable logic circuit according to the present invention.

FIG. 43 shows a ninth configuration example of the programmable logic circuit according to the present invention. In FIG. 43, a programmable logic circuit 190 has a plurality of logic cells 50 shown in FIG. 22, a plurality of switch boxes 90 shown in FIG. 33 for connecting the respective logic cells, a plurality of I/O modules 80 (not shown), and a dedicated control line 194. Different from the eighth configuration example shown in FIG. 42, a control unit 193 is provided outside of the programmable logic circuit, and may be connected to the dedicated control line 194 through an interface circuit.

A configuration-data server 192 is provided for each logic cell 50, and is connected to the configuration input C_IO of the logic cell 50. The outside control unit 193 is connected to the respective configuration-data servers 192 through the dedicated control line 194, and controls all the respective configuration-data servers 192 like a central control operation. Also, the control unit 193 may include the configuration-data server 142 shown in FIG. 38.

Therefore, even when the programmable logic circuit is operating, an output signal of the configuration-data server 192 connected to the own logic cell, or an output signal of the control unit 193 may be provided to a desired logic cell as the configuration data. Accordingly, by an instruction produced from the own logic cell, the configuration-data servers 192, or the control unit 193, the logic function of the programmable function unit of the desired logic cell may be changed at any time.

Figure 44:
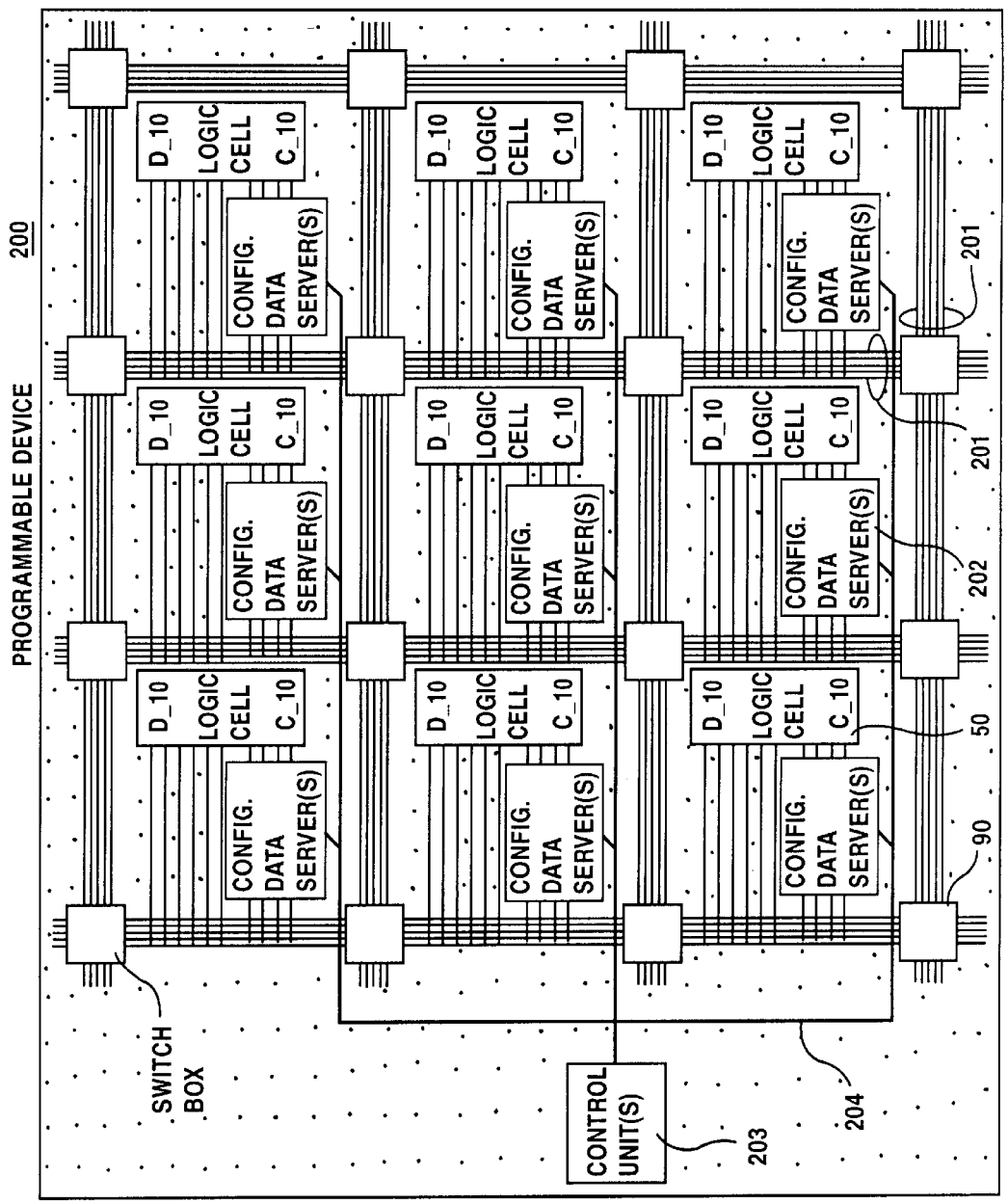
FIG. 44 shows a tenth configuration example of the programmable logic circuit according to the present invention.

FIG. 44 shows a tenth configuration example of the programmable logic circuit according to the present invention. In FIG. 44, a programmable logic circuit 200 has substantially the same configuration as that of the eighth configuration example shown in FIG. 42. However, in the programmable logic circuit 200 shown in FIG. 44, different from the eighth configuration example shown in FIG. 42, a configuration-data server 202 provided for each logic cell is connected not only to the configuration input C_IO of the logic cell 50, but also to wire lines 201 arranged between the logic cells 50.

Therefore, in the tenth configuration example, even when the programmable logic circuit is operating, an output signal of another logic cell, an output signal of the own logic cell, an output signal of the configuration-data server 202 connected to the own logic cell, an output signal of the-configuration-data server 202 connected to another logic cell, or an output signal of the control unit 203 may be provided to a desired logic cell as the configuration data. Accordingly, by an instruction produced from a given logic cell (including the own logic cell), the configuration-data server 202, or the control unit 203, the logic function of the programmable function unit of the desired logic cell may be changed at any time.

Figure 45:
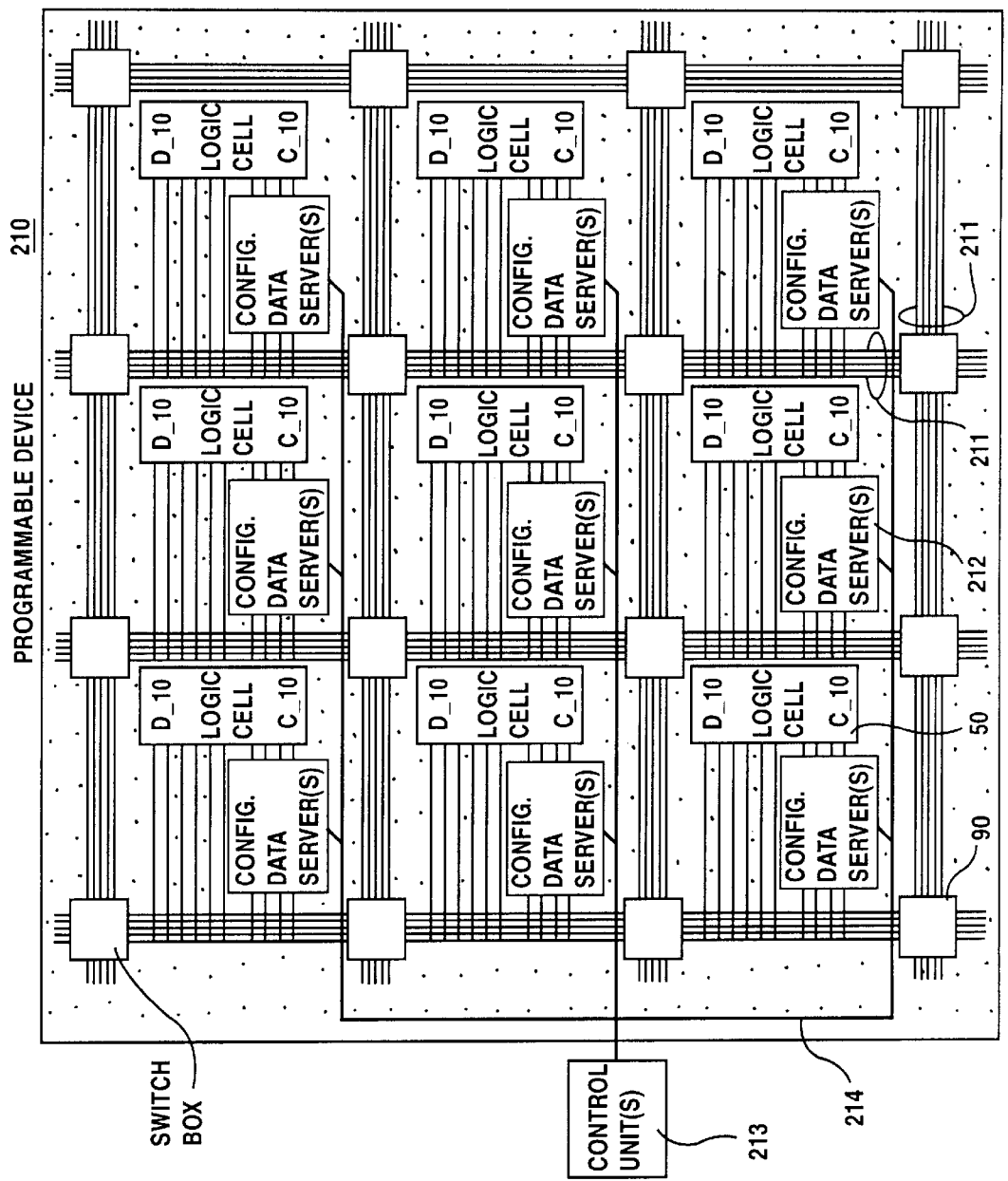
FIG. 45 shows an eleventh configuration example of the programmable logic circuit according to the present invention.

FIG. 45 shows an eleventh configuration example of the programmable logic circuit according to the present invention. In FIG. 45, a programmable logic circuit 210 has substantially the same configuration as that of the ninth configuration example shown in FIG. 43. However, in the programmable logic circuit 210 shown in FIG. 45, different from the ninth configuration example shown in FIG. 43, a configuration-data server 212 provided for each logic cell is connected not only to the configuration input C_IO of the logic cell 50, but also to wire lines 211 arranged between the logic cells 50.

Therefore, in the eleventh configuration example, even when the programmable logic circuit is operating, an output signal of another logic cell, an output signal of the own logic cell, an output signal of the configuration-data server 212 connected to the own logic cell, an output signal of the configuration-data server 212 connected to another logic cell, or an output signal of an outside control unit 213 may be provided to a desired logic cell as the configuration data. Accordingly, by an instruction produced from a given logic cell (including the own logic cell), the configuration-data server 212, or the outside control unit 213, the logic function of the programmable function unit of the desired logic cell may be changed at any time.

Figure 46:
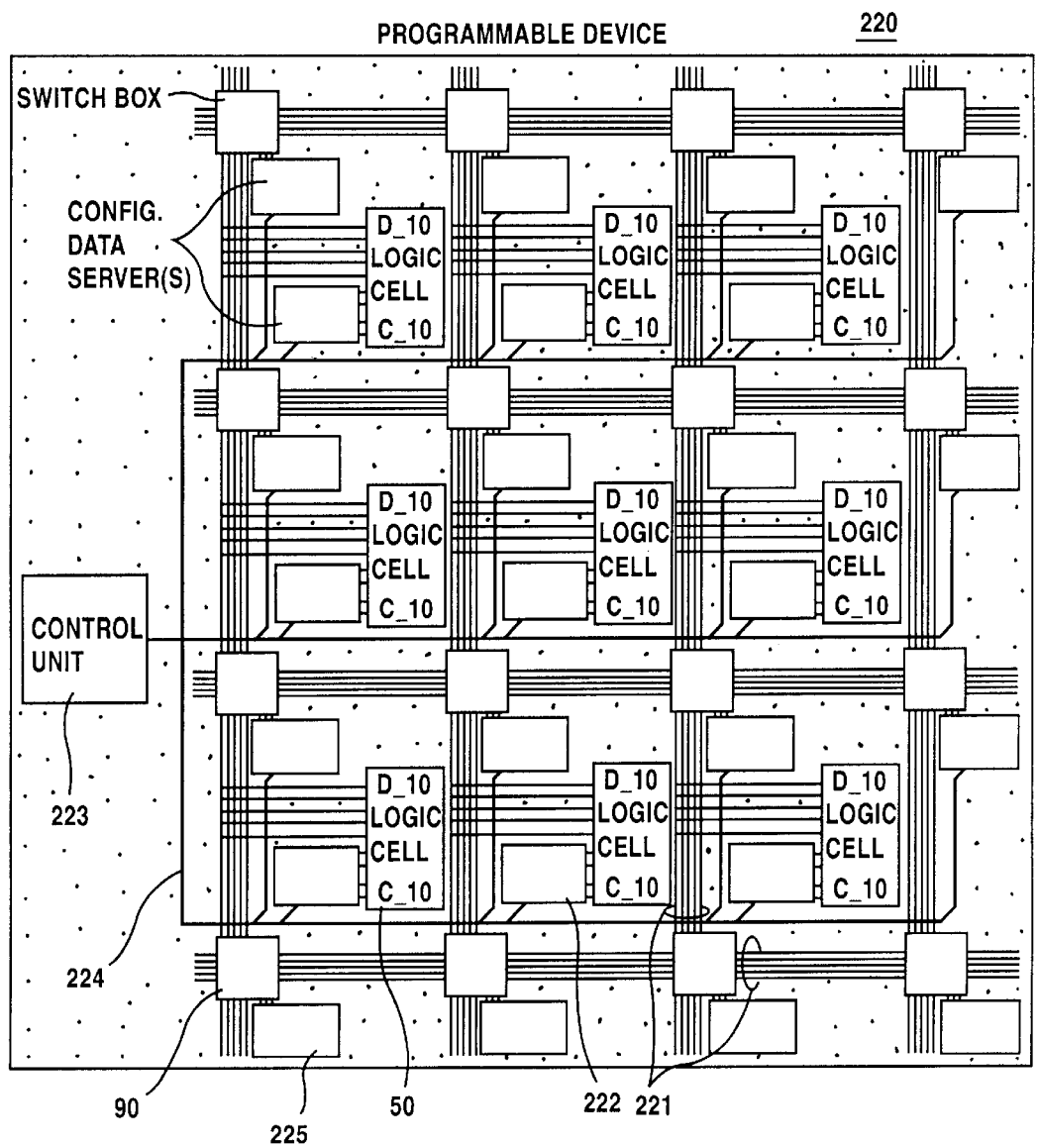
FIG. 46 shows a twelfth configuration example of the programmable logic circuit according to the present invention.

FIG. 46 shows a twelfth configuration example of the programmable logic circuit according to the present invention. In FIG. 46, a programmable logic circuit 220 has substantially the same configuration as that of the eighth configuration example shown in FIG. 42. However, in the programmable logic circuit 220 shown in FIG. 46, different from the eighth configuration example shown in FIG. 42, configuration-data servers 225 are respectively connected to the switch boxes 90. Further, a control unit 223 is connected to the respective configuration-data servers 222 provided in the logic cells 50 and the respective configuration-data servers 225 provided in the switch boxes 90 through a dedicated control line 224, and controls all the respective configuration-data servers 222, 225 like a central control operation.

Therefore, in the thirteenth configuration example, even when the programmable logic circuit is operating, an output signal of the configuration-data server 222 may be provided to the corresponding logic cell 50 as the configuration data. An output signal of the configuration-data server 225 may be provided to the corresponding switch box 90 as the configuration data. An output signal of the control unit 223 may be provided to the desired logic cell 50 and the desired switch box 90 as the configuration data.

Accordingly, by an instruction produced from the own logic cell, the configuration-data servers 222, 225, or the control unit 223, the logic function of the programmable function unit of the desired logic cell and the connection structure of the desired switch box may be changed at any time.

Figure 47:
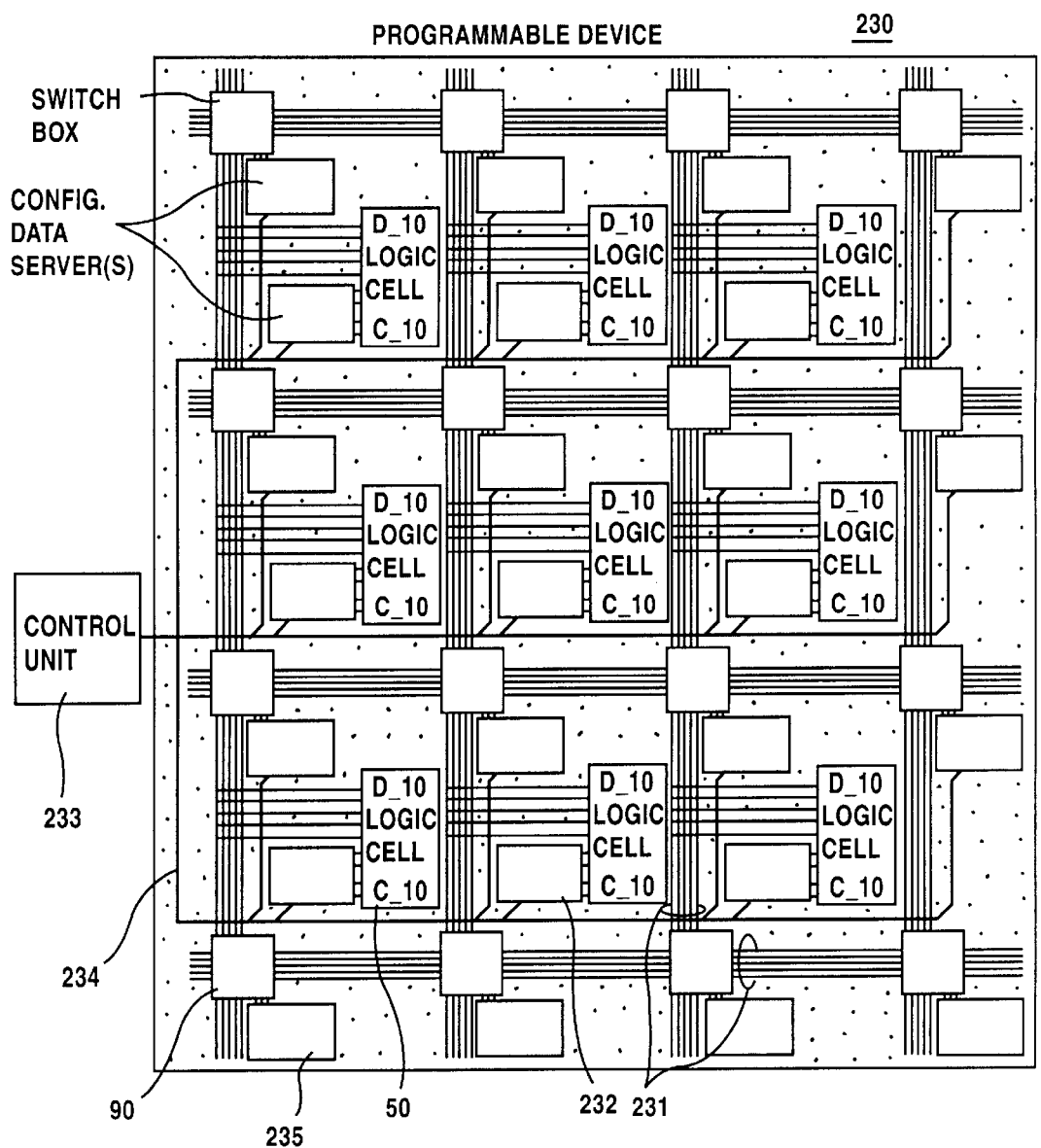
FIG. 47 shows a thirteenth configuration example of the programmable logic circuit according to the present invention.

FIG. 47 shows a thirteenth configuration example of the programmable logic circuit according to the present invention. In FIG. 47, a programmable logic circuit 230 has substantially the same configuration as that of the ninth configuration example shown in FIG. 43. However, in the programmable logic circuit 230 shown in FIG. 47, different from the ninth configuration example shown in FIG. 43, configuration-data servers 235 are respectively connected to the switch boxes 90. Further, a control unit 233 is connected to the respective configuration-data servers 232 provided in the logic cells 50 and the respective configuration-data servers 235 provided in the switch boxes 90 through a dedicated control line 234, and controls all the respective configuration-data servers 232, 235 like a central control operation.

Therefore, in the twelfth configuration example, even when the programmable logic circuit is operating, an output signal of the configuration-data server 232 may be provided to the corresponding logic cell 50 as the configuration data. An output signal of the configuration-data server 235 may be provided to the corresponding switch box 90 as the configuration data. An output signal of an outside control unit 233 may be provided to the desired logic cell 50 and the desired switch box 90 as the configuration data.

Accordingly, by an instruction produced from the own logic cell, the configuration-data servers 232, 235, or the outside control unit 233, the logic function of the programmable function unit of the desired logic cell and the connection structure of the desired switch box may be changed at any time.

Next, a description will be given of a variety of configuration examples of the programmable-logic-circuit system which is constructed with a plurality of programmable logic circuits according to the present invention.

Figure 48:
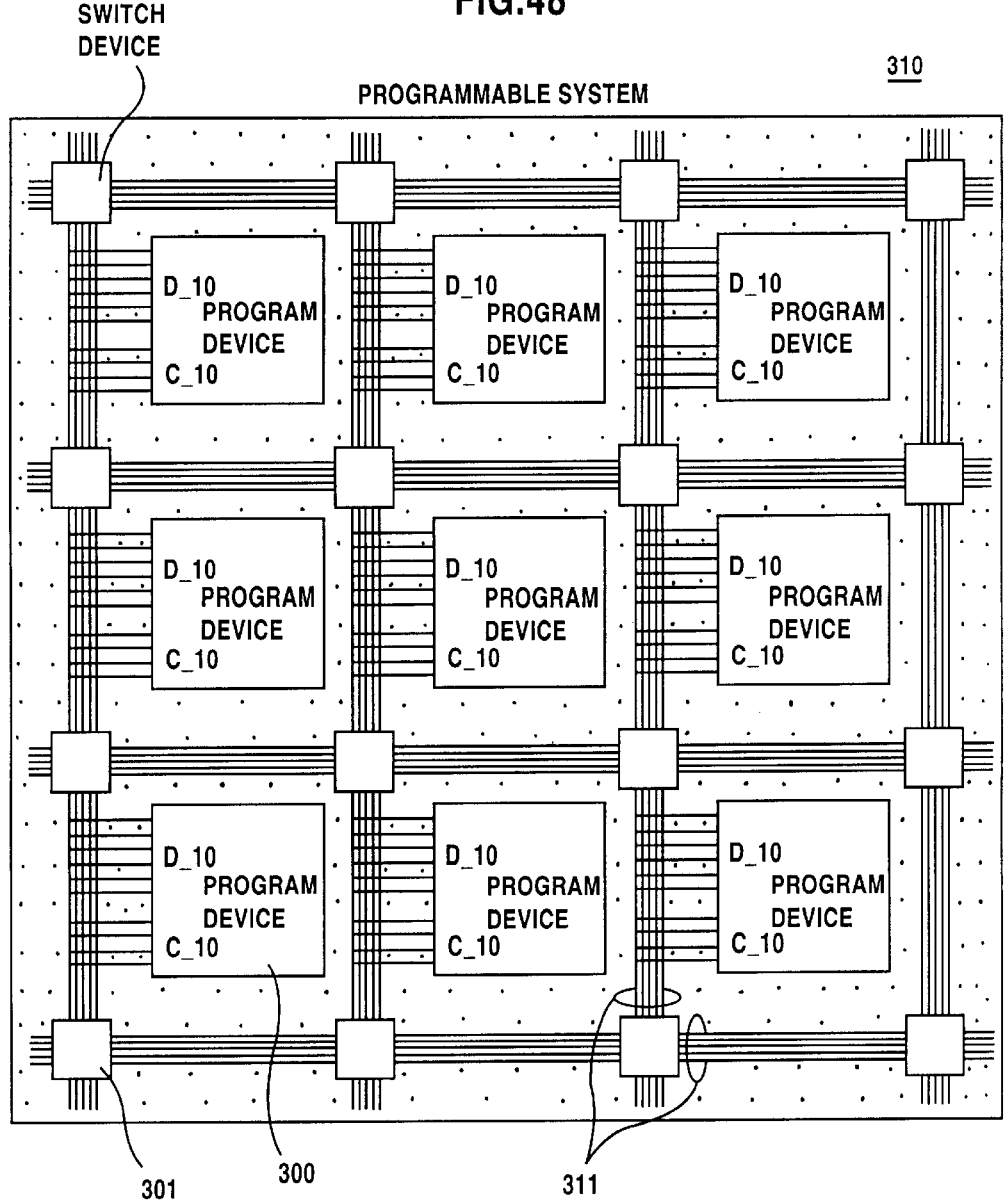
FIG. 48 shows a first configuration example of a programmable-logic-circuit system according to the present invention.

FIG. 48 shows a first configuration example of the programmable-logic-circuit system according to the present invention. In FIG. 48, a programmable-logic-circuit system 310 (represented by "Programmable System" in the drawing) has a plurality of dynamically re-programmable logic circuits 300 (represented by "Program device" in the drawing), a plurality of switch devices 301 for connecting the programmable logic circuits, and a plurality of I/O modules 302 (not shown).

For the dynamically re-programmable logic circuit 300, one of the programmable logic circuits shown in FIG. 35 to FIG. 47 may be used. The switch device 301 may have substantially the same configuration as that of the switch box 90 shown in FIG. 33. Further, the I/O module 302 may have substantially the same configuration as that of the I/O module 80 shown in FIG. 32. Each of these configuration elements is a dynamically re-programmable device.

Therefore, when the programmable-logic-circuit system is operating, the logic function of the programmable logic circuit 300 may be changed. In FIG. 48, a signal from a configuration input C_IO of the programmable logic circuit 300 is provided to the configuration memory 53 through the control unit 52 (see FIG. 22).

In FIG. 48, the configuration input C_IO of the programmable logic circuit 300 is connected to inter-logic-circuit wire lines 311 arranged between the programmable logic circuits 300. Therefore, even when the programmable-logic-circuit system 310 is operating, an output signal of another programmable logic circuit or an output signal of the own programmable logic circuit may be provided to a desired programmable logic circuit as the configuration data. Accordingly, by an instruction produced from a given programmable logic circuit, a part or all of logic functions of the desired programmable logic circuit may be changed at any time.

Further, by controlling the switch device 301 using the output signal of the programmable logic circuit 300, the connection state between the programmable logic circuits may be also changed. As discussed above, by the dynamical re-programming of the programmable logic circuits, the switch devices, etc., a large number of circuits more than the realizable number of circuits determined by the number of gates may be obtained.

Further, when a hardware emulator is constructed with a plurality of the above-discussed programmable logic circuits, it becomes possible to emulate a large-size logic circuit by a smaller number of programmable logic circuits, as compared to the prior-art hardware emulator. In addition, since a required number of programmable logic circuits may be extremely reduced, emulation cost also may be extremely reduced.

Figure 49:
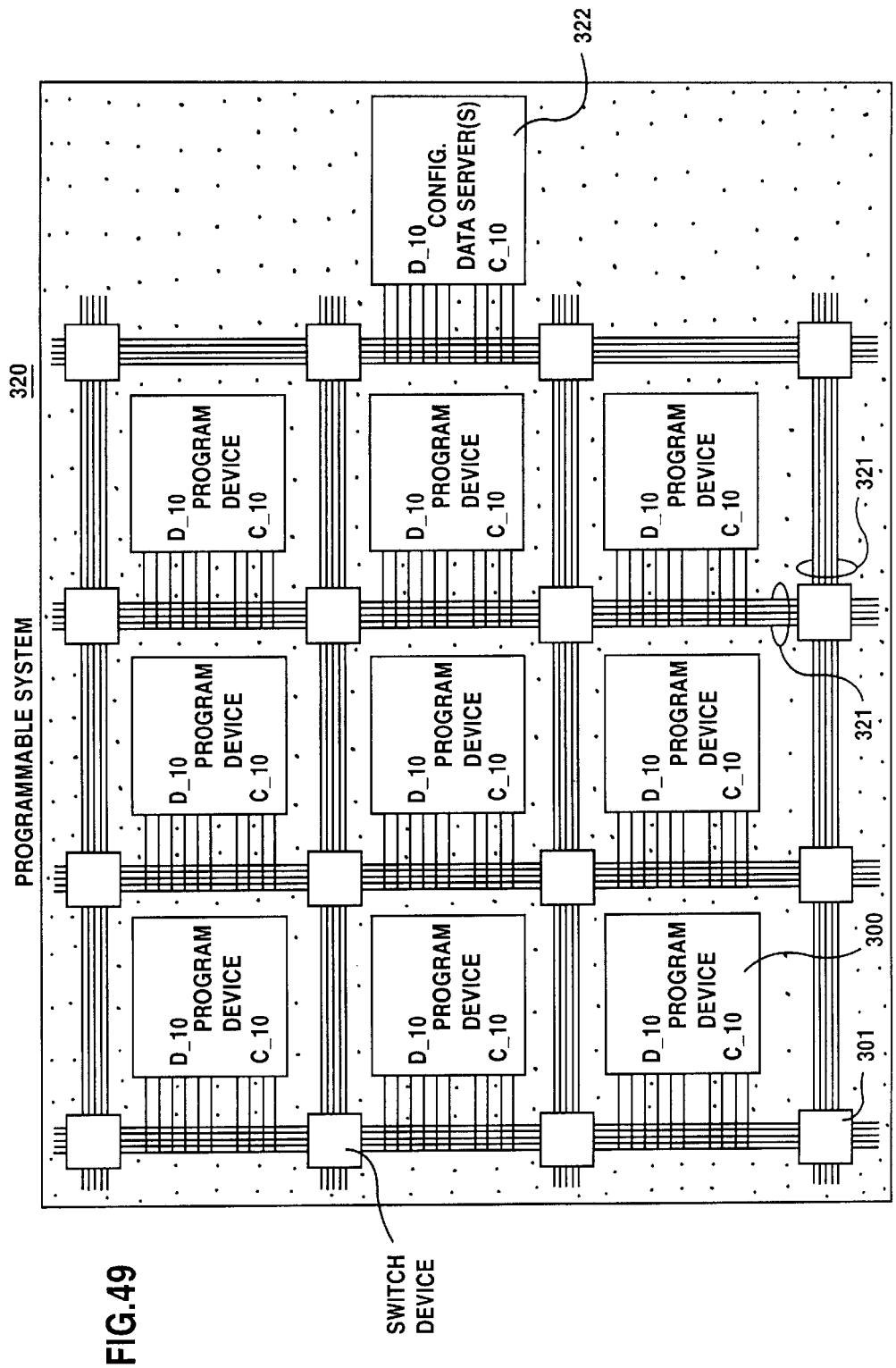
FIG. 49 shows a second configuration example of the programmable-logic-circuit system according to the present invention.

FIG. 49 shows a second configuration example of the programmable-logic-circuit system according to the present invention. In FIG. 49, a programmable-logic-circuit system 320 has a plurality of programmable logic circuits 300, a plurality of switch devices 301 for connecting the respective programmable logic circuits, a plurality of I/O modules 302 (not shown), and a configuration-data server 322.

The configuration input C_IO of the programmable logic circuit 300 is connected to the wire lines 321 arranged between the programmable logic circuits 300. Also, a configuration input C_IO of the configuration-data server 322 is connected to the wire lines 321.

Therefore, even when the programmable-logic-circuit system is operating, an output signal of another programmable logic circuit, an output signal of the own programmable logic circuit, or an output signal of the configuration-data server 322 may be provided to a desired programmable logic circuit as the configuration data. Accordingly, by an instruction produced from a given programmable logic circuit or the configuration-data server 322, some or all of the logic functions of the desired programmable logic circuit may be changed at any time.

Further, by simultaneously providing the configuration data from the configuration-data server 322 to a plurality of programmable logic circuits, a large part of the logic function of the programmable-logic-circuit system may be updated.

Figure 50:
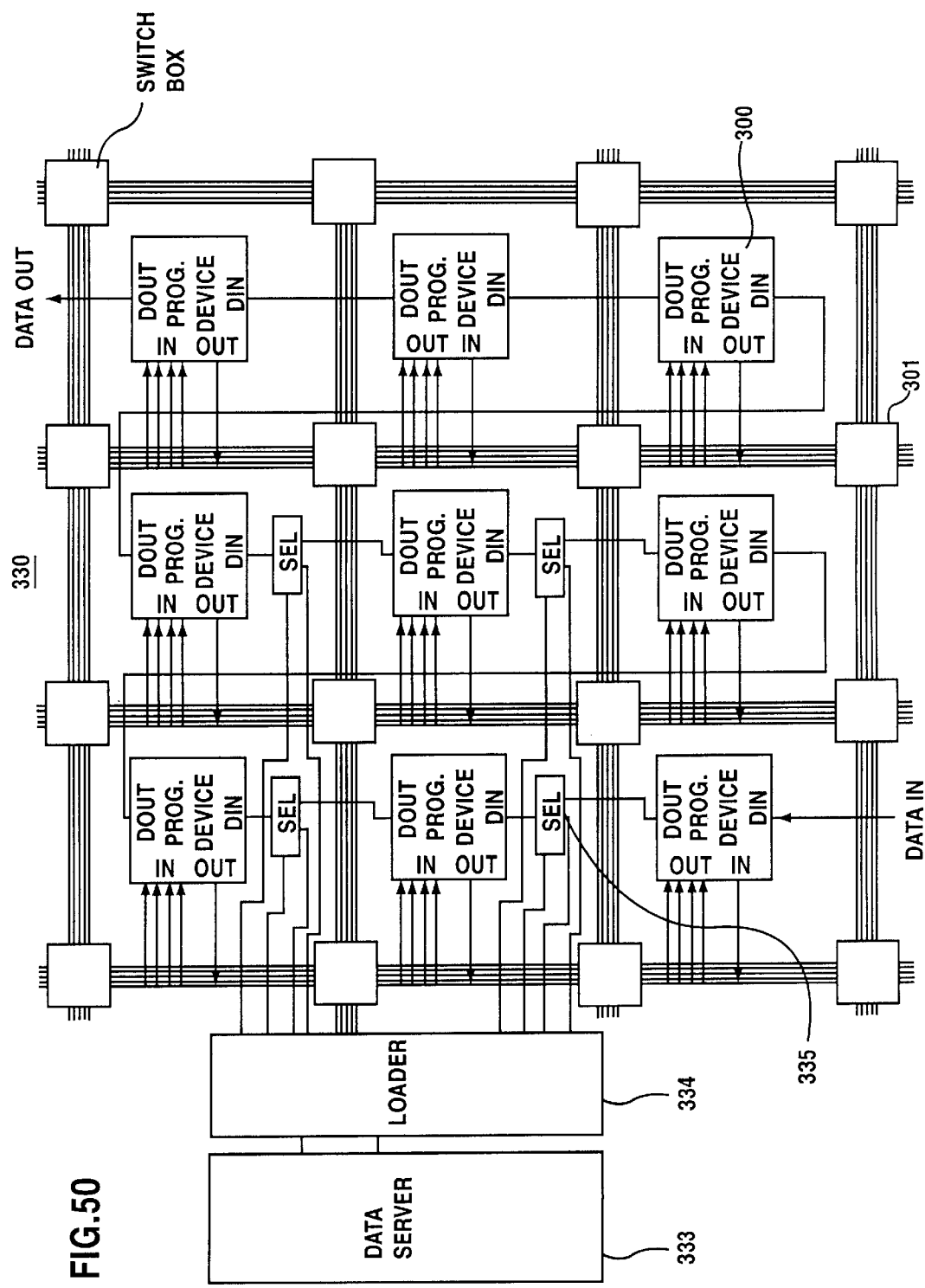
FIG. 50 shows a third configuration example of the programmable-logic-circuit system according to the present invention.

FIG. 50 shows a third configuration example of the programmable-logic-circuit system according to the present invention. In FIG. 50, a programmable-logic-circuit system 330 has a plurality of programmable logic circuits 300, a plurality of switch devices 301 for connecting the respective programmable logic circuits, a plurality of I/O modules 302 (not shown), a configuration-data server 333, a loader 334, and a plurality of selection circuits 335.

The configuration-data server 333 and the loader 334 provide external data to the configuration memories of selected ones of the programmable logic circuits. Therefore, in the same way as the second configuration example shown in FIG. 49, each programmable logic circuit does not need to have the dedicated configuration data and loader.

In the third configuration example of the programmable-logic-circuit system, after the configuration data is loaded, the external data from the configuration-data server 333 may be selectively loaded to the configuration memories of the programmable logic circuits selected by the selection circuit 335. Therefore, in the programmable-logic-circuit system shown in FIG. 50, when the programmable-logic-circuit system is operating, some or all of the logic functions of the desired programmable logic circuit may be selectively changed. Accordingly, a large number of circuits more than the realizable number of circuits determined by the number of gates may be obtained.

Figure 51:
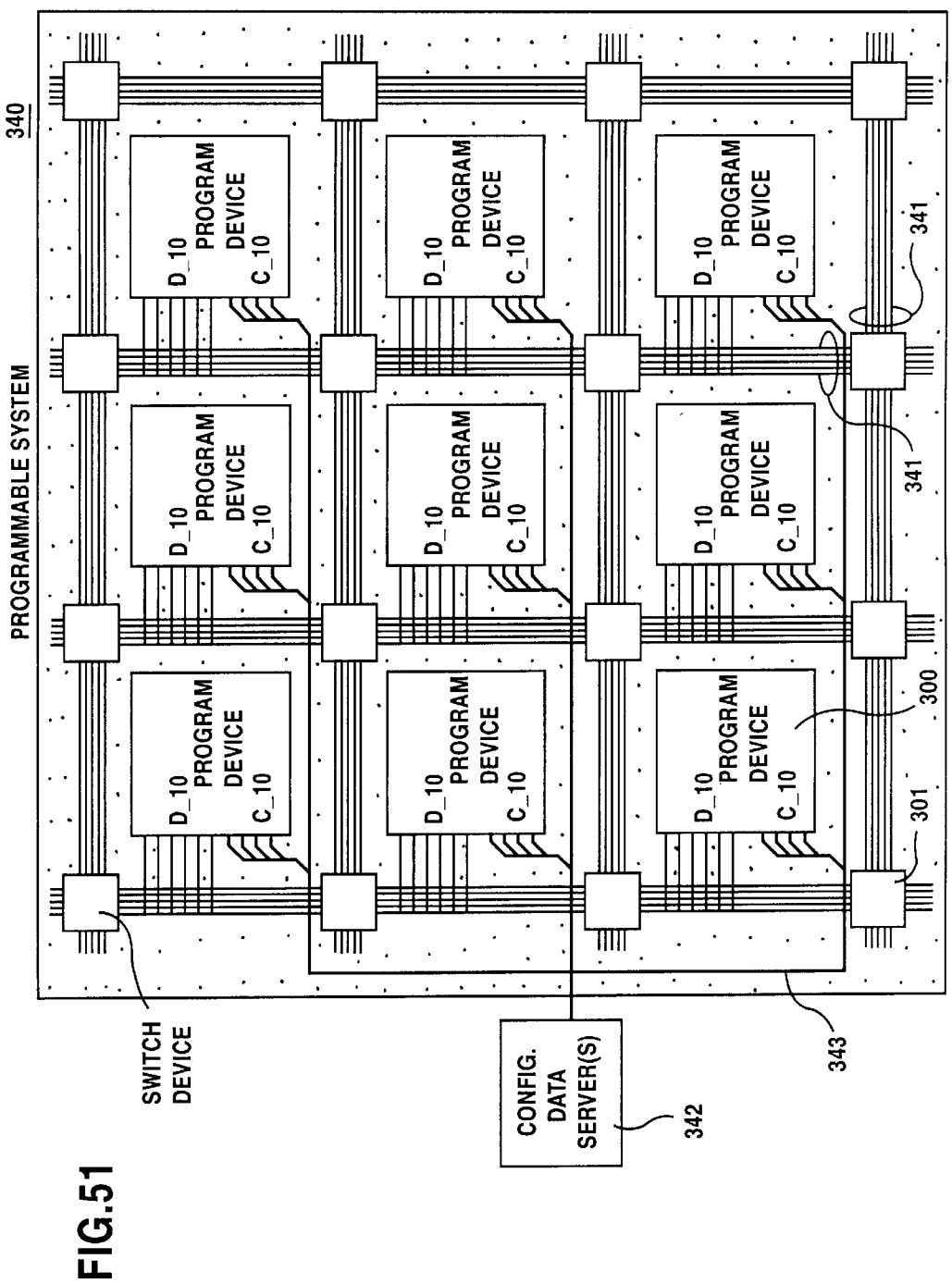
FIG. 51 shows a fourth configuration example of the programmable-logic-circuit system according to the present invention.

FIG. 51 shows a fourth configuration example of the programmable-logic-circuit system according to the present invention. In FIG. 51, a programmable-logic-circuit system 340 has a plurality of programmable logic circuits 300, a plurality of switch devices 301 for connecting the respective programmable logic circuits, a plurality of I/O modules 302 (not shown), a configuration-data server 342, and a configuration-data transmission dedicated line 343. The configuration-data server 342 is connected to the respective configuration inputs C_IO of the programmable logic circuits 300 through the dedicated line 343.

Therefore, even when the programmable-logic-circuit system is operating, the configuration data from the configuration-data server 342 may be provided to the desired programmable logic circuit. Accordingly, by an instruction produced from the own programmable logic circuit or the configuration-data server 342, some or all of the logic functions of the desired programmable logic circuit may be changed at any time.

Further, by simultaneously providing the configuration data from the configuration-data server 342 to a plurality of programmable logic circuits, a large part of the logic function of the programmable-logic-circuit system may be updated.

Figure 52:
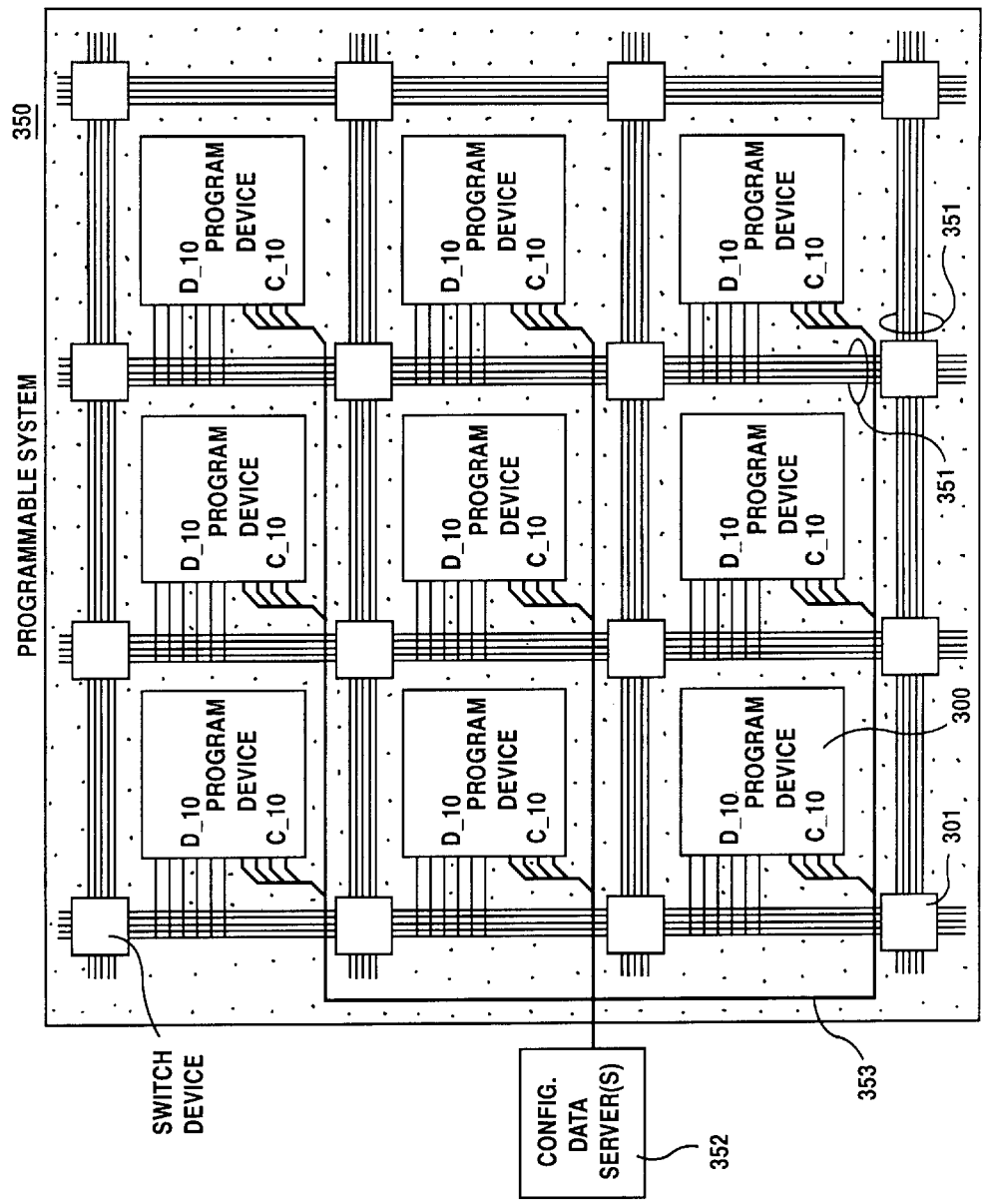
FIG. 52 shows a fifth configuration example of the programmable-logic-circuit system according to the present invention.

FIG. 52 shows a fifth configuration example of the programmable-logic-circuit system according to the present invention. In FIG. 52, a programmable-logic-circuit system 350 has a plurality of programmable logic circuits 300, a plurality of switch devices 301 for connecting the respective programmable logic circuits, a plurality of I/O modules 302 (not shown), and a configuration-data transmission dedicated line 353. Different from the fourth configuration example shown in FIG. 51, a configuration-data server 352 is provided outside of the programmable-logic-circuit system, and may be connected to the dedicated line 353 through an interface circuit. The outside configuration-data server 352 is connected to the respective configuration inputs CHI of the programmable logic circuits 300 through the dedicated line 353.

Therefore, even when the programmable-logic-circuit system is operating, the configuration data from the configuration-data server 352 may be provided to the desired programmable logic circuit. Accordingly, by an instruction produced from the own programmable logic circuit or the configuration-data server 352, some or all of the logic functions of the desired programmable logic circuit may be changed at any time.

Further, by simultaneously providing the configuration data from the configuration-data server 352 to a plurality of programmable logic circuits, a large part of the logic function of the programmable-logic-circuit system may be updated.

In the above-discussed fifth configuration example, since the configuration-data server 352 is provided outside of the programmable-logic-circuit system, the programmable-logic-circuit system may be simplified, and flexibility of total structure design may be improved.

Figure 53:
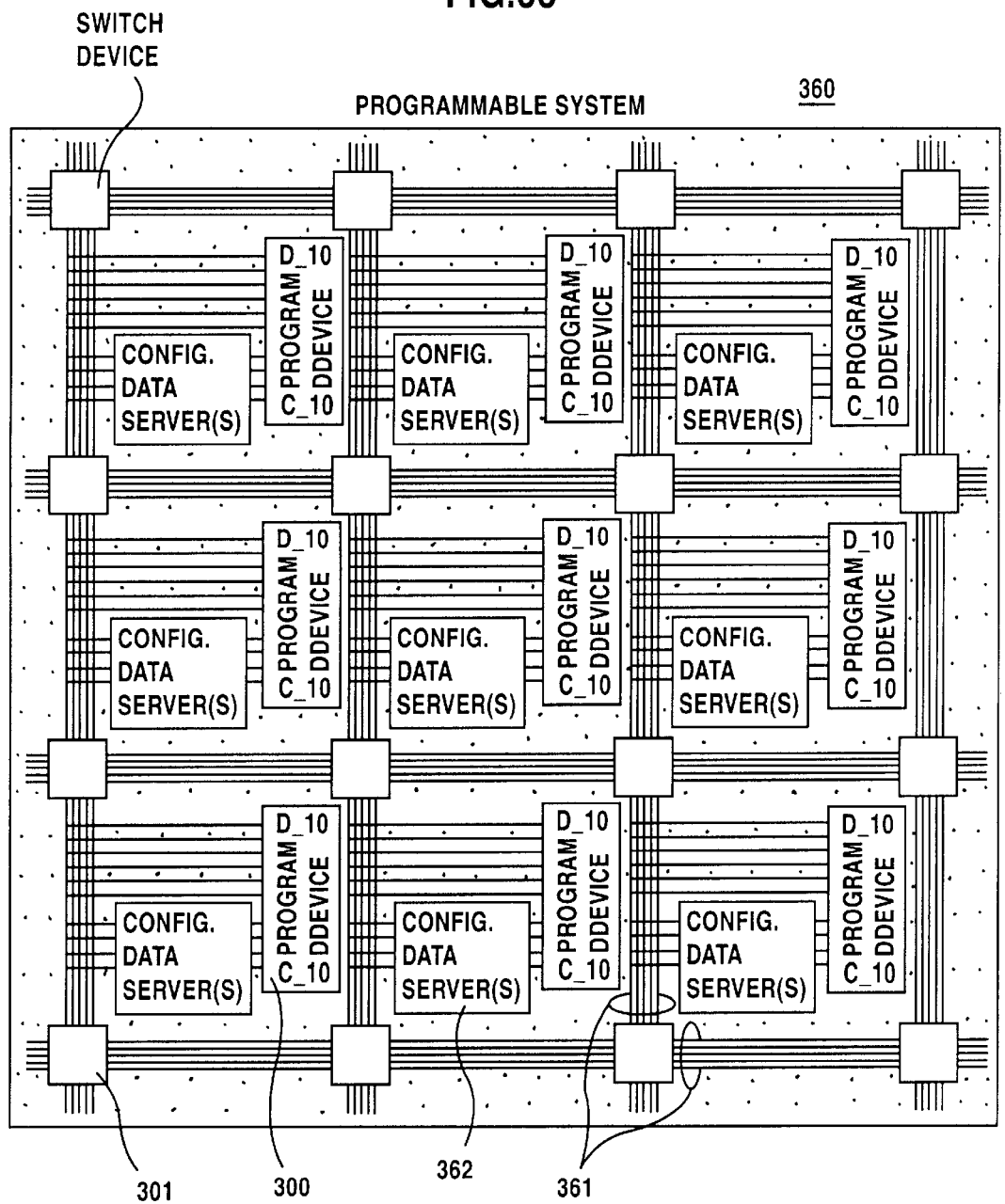
FIG. 53 shows a sixth configuration example of the programmable-logic-circuit system according to the present invention.

FIG. 53 shows a sixth configuration example of the programmable-logic-circuit system according to the present invention. In FIG. 53, a programmable-logic-circuit system 360 has a plurality of programmable logic circuits 300, a plurality of switch devices 301 for connecting the respective programmable logic circuits, a plurality of I/O modules 302 (not shown), and a plurality of configuration-data servers 362. A configuration-data server 362 is provided for each programmable logic circuit 300, and is connected to the configuration input C_IO of the programmable logic circuit 300 and wire lines 361 arranged between the programmable logic circuits 300.

Therefore, even when the programmable-logic-circuit system is operating, an output signal of another programmable logic circuit, an output signal of the own programmable logic circuit, an output signal of the configuration-data server 362 connected to the own programmable logic circuit, or an output signal of the configuration-data server 362 connected to another programmable logic circuit may be provided to a desired programmable logic circuit as the configuration data. Accordingly, by an instruction produced from a given programmable logic circuit or the configuration-data servers 162, some or all of the logic functions of the desired programmable logic circuit may be changed at any time.

In the sixth configuration example shown in FIG. 53, different from the fifth configuration example shown in FIG. 52, there is no need for providing a relatively thick dedicated line. Therefore, flexibility of the signal line design may be improved.

Figure 54:
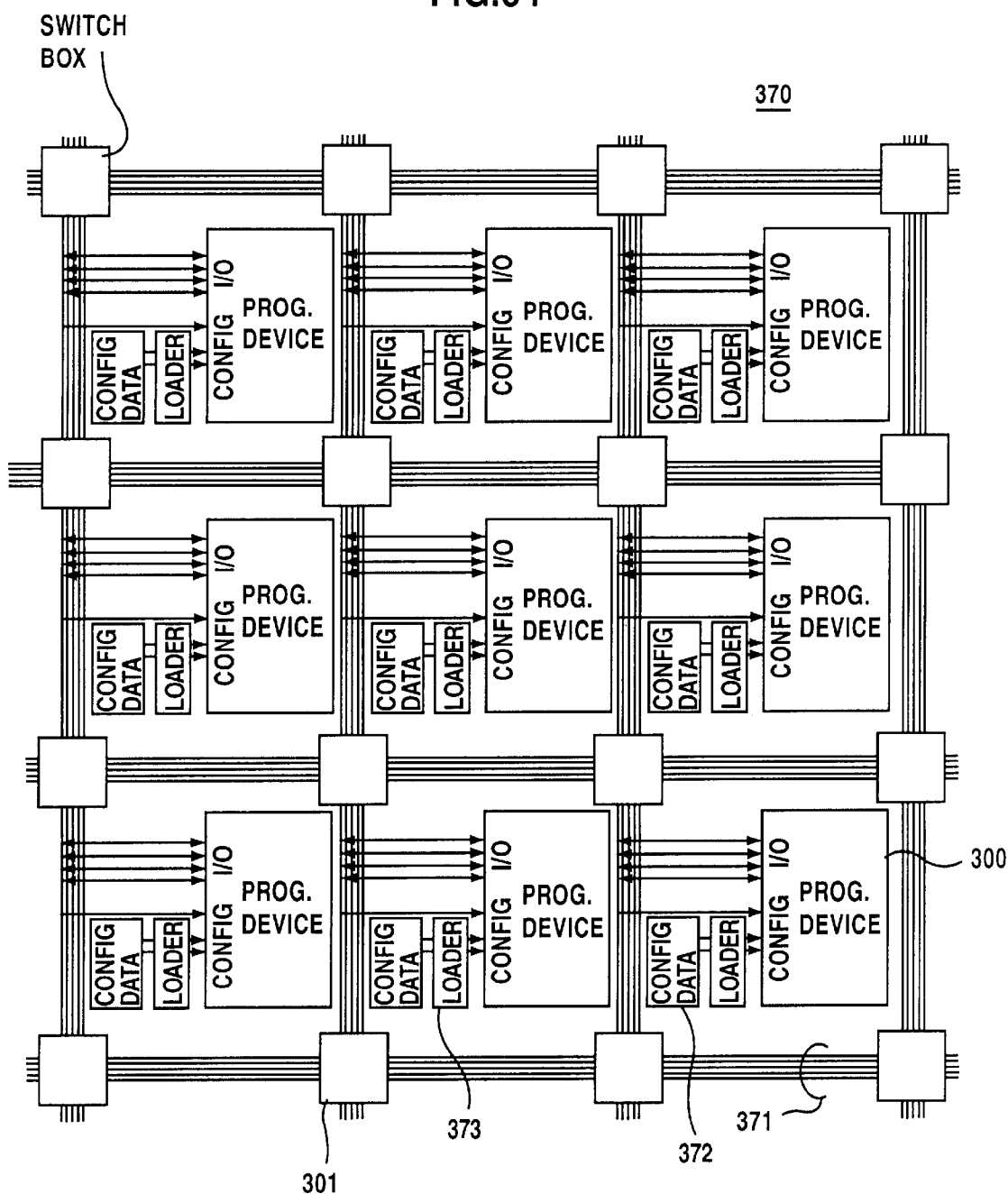
FIG. 54 shows a seventh configuration example of the programmable-logic-circuit system according to the present invention.

FIG. 54 shows a seventh configuration example of the programmable-logic-circuit system according to the present invention. In FIG. 54, a programmable-logic-circuit system 370 has a plurality of programmable logic circuits 300, a plurality of switch devices 301 for connecting the respective programmable logic circuits, a plurality of I/O modules 302 (not shown), a plurality of-configuration-data servers 372, and a plurality of loaders 373. A configuration-data server 372 and a loader 373 are provided for each programmable logic circuit 300, and are connected to the configuration input C_IO of the respective programmable logic circuit 300. Further, each configuration input C_IO of the programmable logic circuit 300 is also connected to wire lines 371 arranged between the programmable logic circuits 300.

Therefore, even when the programmable-logic-circuit system is operating, an output signal of another programmable logic circuit, an output signal of the own programmable logic circuit, an output signal of the configuration-data server 372 connected to the own programmable logic circuit, or an output signal of the configuration-data server 372 connected to another programmable logic circuit may be provided to a desired programmable logic circuit as the configuration data. Accordingly, by an instruction produced from a given programmable logic circuit or the configuration-data servers 372, some or all of the logic functions of the desired programmable logic circuit may be changed at any time.

In the seventh configuration example shown in FIG. 54, different from the fifth configuration example shown in FIG. 52, there is no need for providing a relatively thick dedicated line. Therefore, flexibility of the signal line design may be improved.

Figure 55:
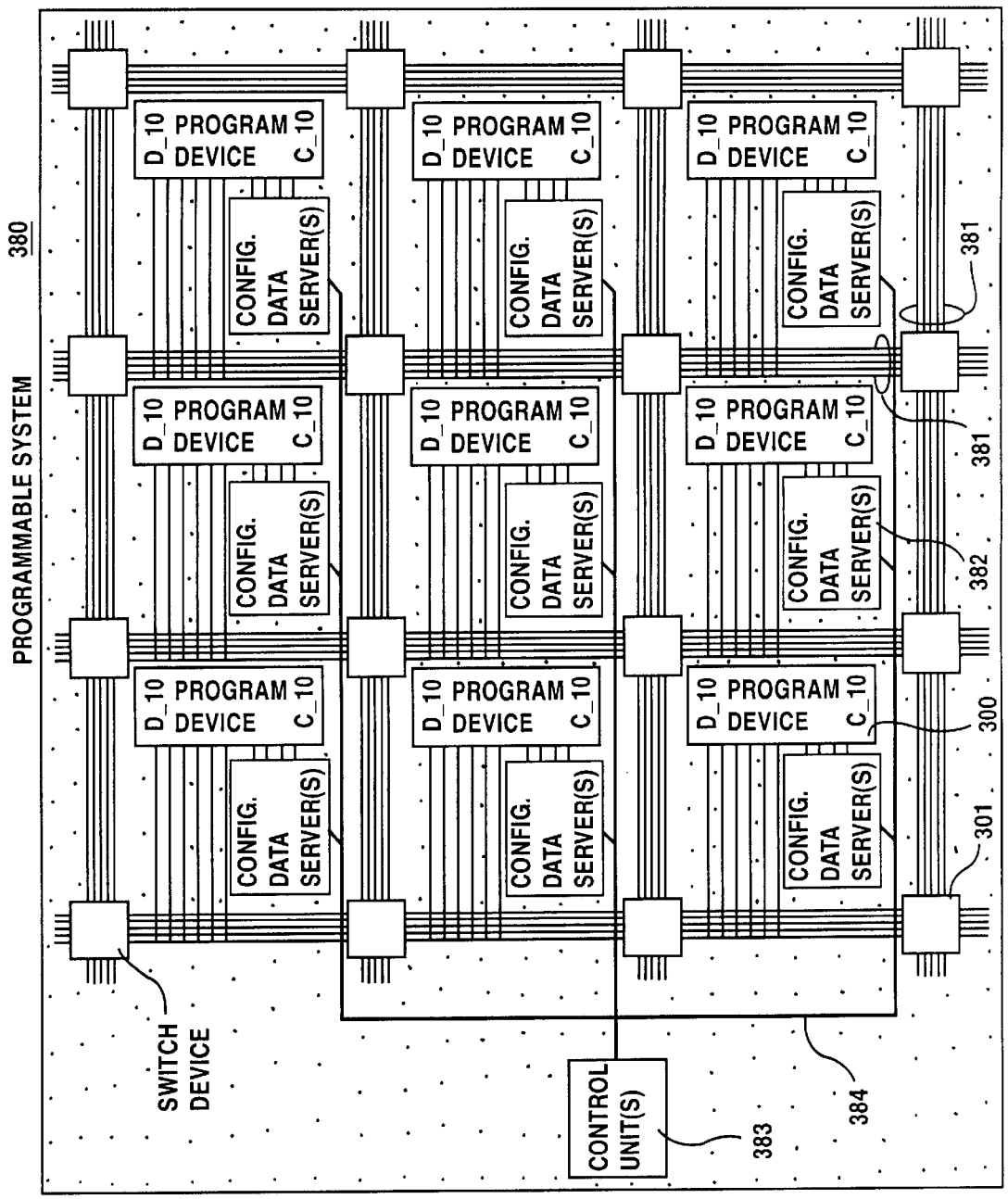
FIG. 55 shows an eighth configuration example of the programmable-logic-circuit system according to the present invention.

FIG. 55 shows an eighth configuration example of the programmable-logic-circuit system according to the present invention. In FIG. 55, a programmable-logic-circuit system 380 has a plurality of programmable logic circuits 300, a plurality of switch devices 301 for connecting the respective programmable logic circuits, a plurality of I/O modules 302 (not shown), a plurality of configuration-data servers 382, a control unit 383, and a dedicated control line 384.

A configuration-data server 382 is provided for each programmable logic circuit 300, and is connected to the configuration input C_IO of the programmable logic circuit 300. The control unit 383 is connected to the respective configuration-data servers 382 through the dedicated control line 384, and controls all the respective configuration-data servers 382 like a central control operation. Also, the control unit 383 may include the configuration-data server 342 shown in FIG. 51.

Therefore, even when the programmable-logic-circuit system is operating, an output signal of the configuration-data server 382 connected to the own programmable logic circuit, or an output signal of the control unit 383 may be provided to a desired programmable logic circuit as the configuration data. Accordingly, by an instruction produced from the own programmable logic circuit, the configuration-data servers 382, or the control unit 383, some or all of the logic functions of the desired programmable logic circuit may be changed at any time.

Figure 56:
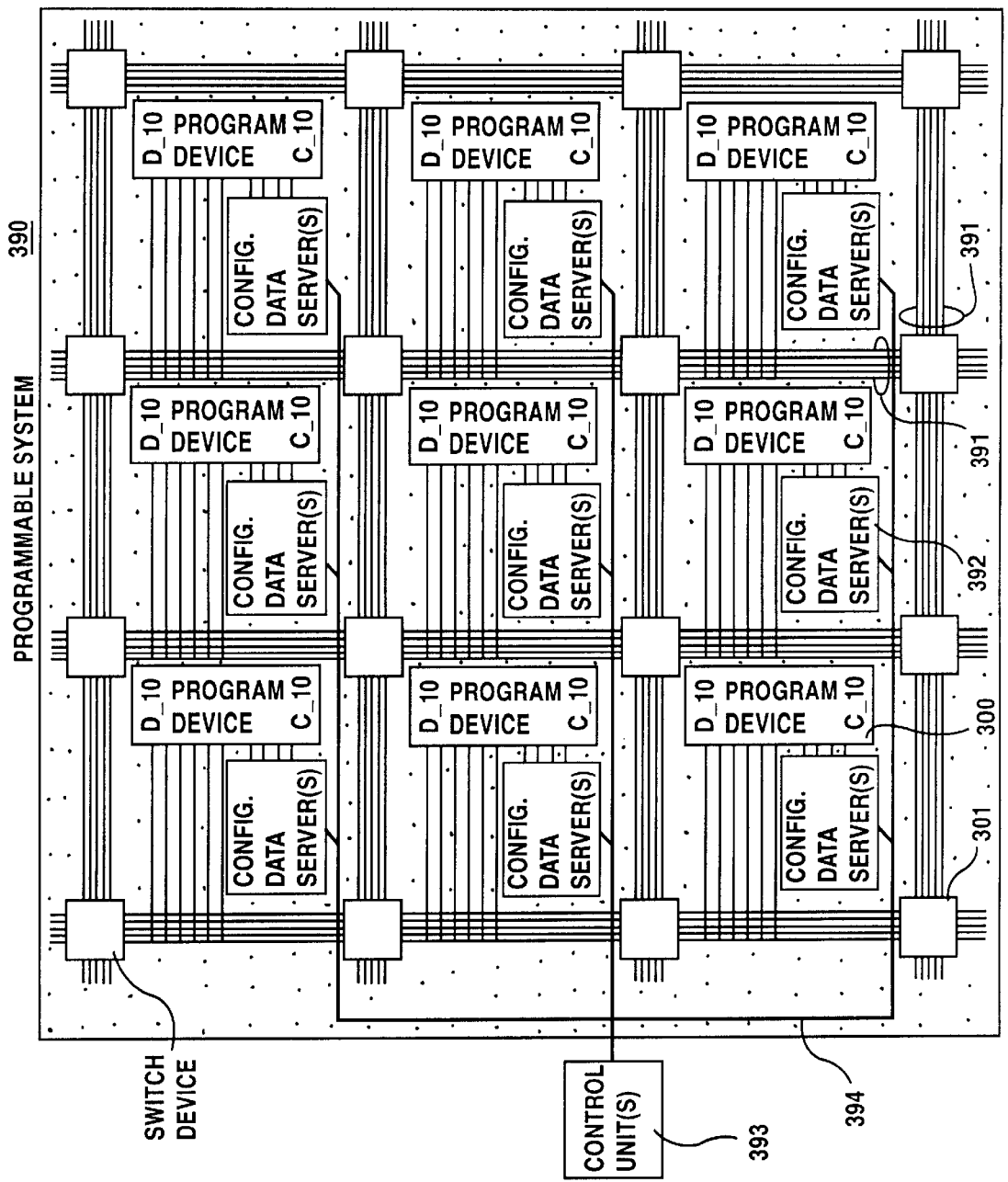
FIG. 56 shows a ninth configuration example of the programmable-logic-circuit system according to the present invention.

FIG. 56 shows a ninth configuration example of the programmable-logic-circuit system according to the present invention. In FIG. 56, a programmable-logic-circuit system 390 has a plurality of programmable logic circuits 300, a plurality of switch devices 301 for connecting the respective programmable logic circuits, a plurality of I/O modules 302 (not shown), and a dedicated control line 394. Different from the eighth configuration example shown in FIG. 55, a control unit 393 is provided outside of the programmable-logic-circuit system, and may be connected to the dedicated control line 394 through an interface circuit.

A configuration-data server 392 is provided for each programmable logic circuit 300, and is connected to the configuration input C_IO of the programmable logic circuit 300. The outside control unit 393 is connected to the respective configuration-data servers 392 through the dedicated control line 394, and controls all the respective configuration-data servers 392 like a central control operation. Also, the control unit 393 may include the configuration-data server 342 shown in FIG. 51.

Therefore, even when the programmable-logic-circuit system is operating, an output signal of the configuration-data server 392 connected to the own programmable logic circuit, or an output signal of the control unit 393 may be provided to a desired programmable logic circuit as the configuration data. Accordingly, by an instruction produced from the own programmable logic circuit, the configuration-data servers 392, or the control unit 393, some or all of the logic functions of the desired programmable logic circuit may be changed at any time.

Figure 57:
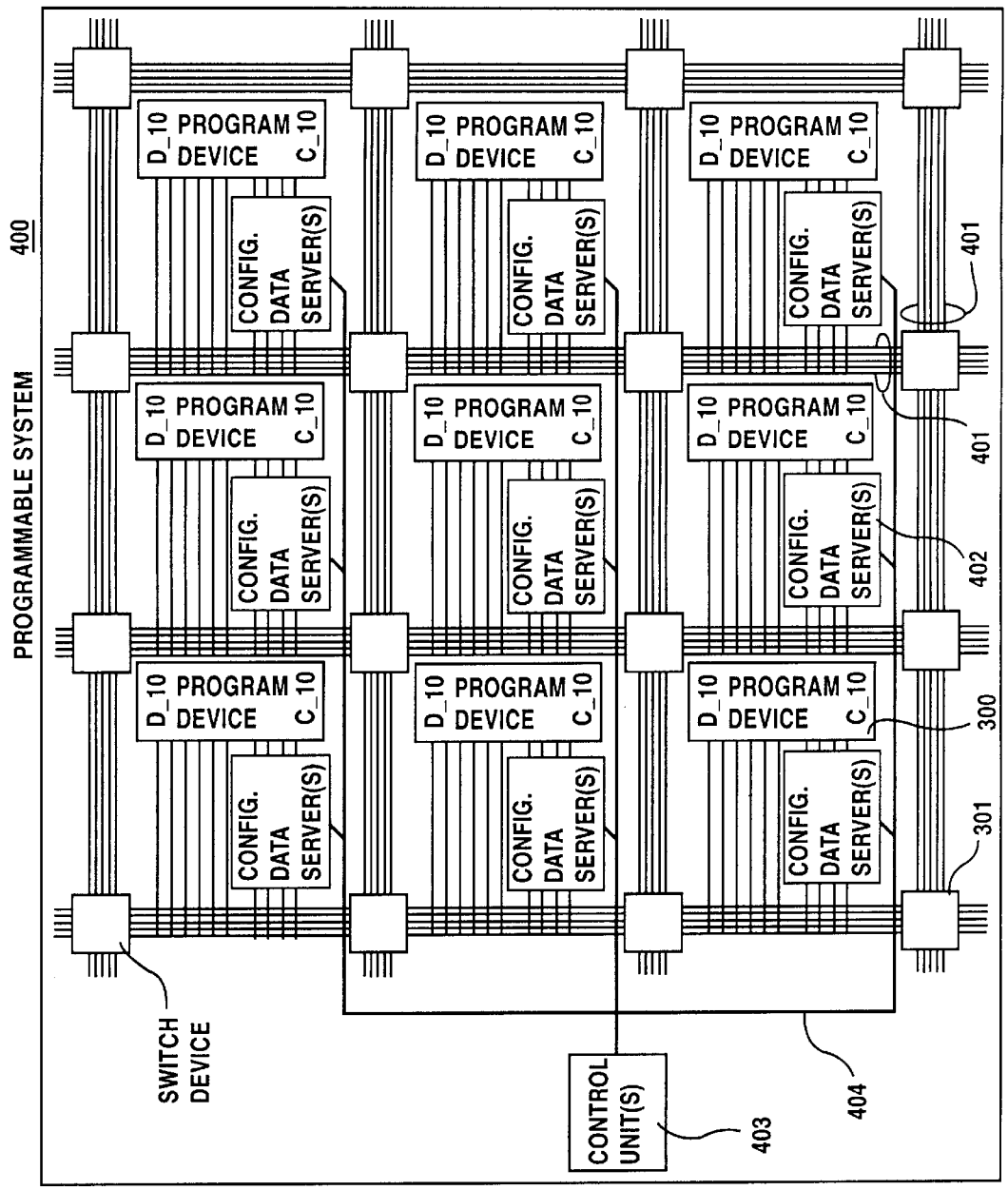
FIG. 57 shows a tenth configuration example of the programmable-logic-circuit system according to the present invention.

FIG. 57 shows a tenth configuration example of the programmable-logic-circuit system according to the present invention. In FIG. 57, a programmable-logic-circuit system 400 has substantially the same configuration as that of the eighth configuration example shown in FIG. 55. However, in the programmable-logic-circuit system 400 shown in FIG. 57, different from the eighth configuration example shown in FIG. 55, a configuration-data server 402 provided for each programmable logic circuit 300 is connected not only to the configuration input C_IO of the programmable logic circuit 300, but also to wire lines 401 arranged between the programmable logic circuits 300.

Therefore, in the tenth configuration example, even when the programmable-logic-circuit system is operating, an output signal of another programmable logic circuit, an output signal of the own programmable logic circuit, an output signal of the configuration-data server 402 connected to the own programmable logic circuit, an output signal of the configuration-data server 402 connected to another programmable logic circuit, or an output signal of the control unit 403 may be provided to a desired programmable logic circuit as the configuration data. Accordingly, by an instruction produced from a given programmable logic circuit (including the own programmable logic circuit), the configuration-data server 402, or the control unit 403, some or all of the logic functions of the desired programmable logic circuit may be changed at any time.

Figure 58:
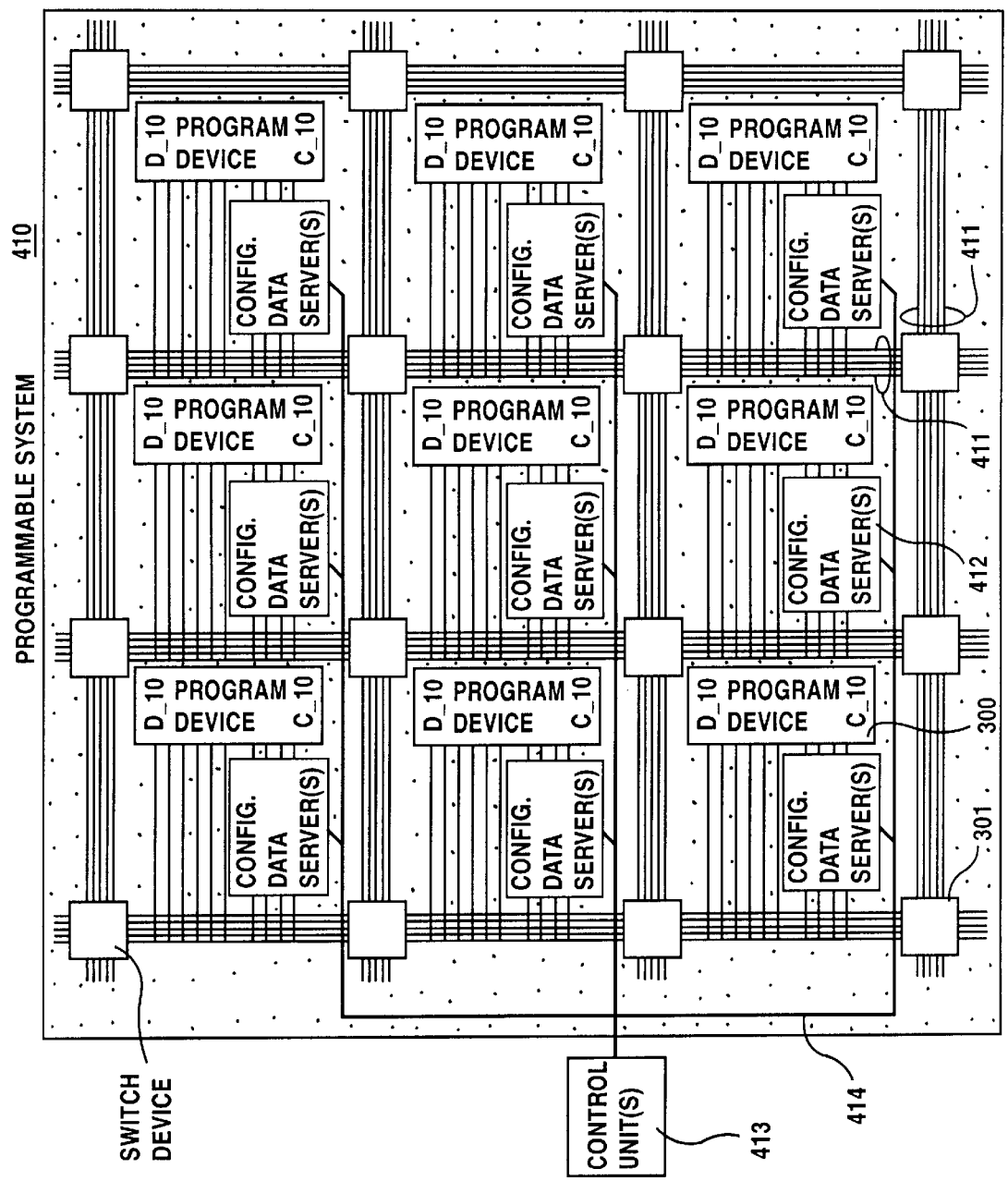
FIG. 58 shows an eleventh configuration example of the programmable-logic-circuit system according to the present invention.

FIG. 58 shows an eleventh configuration example of the programmable-logic-circuit system according to the present invention. In FIG. 58, a programmable-logic-circuit system 410 has substantially the same configuration as that of the ninth configuration example shown in FIG. 56. However, in the programmable-logic-circuit system 410 shown in FIG. 58, different from the ninth configuration example shown in FIG. 56, a configuration-data server 412 provided for each programmable logic circuit is connected not only to the configuration input C_IO of the programmable logic circuit 300, but also to wire lines 411 arranged between the programmable logic circuits 300.

Therefore, in the eleventh configuration example, even when the programmable-logic-circuit system is operating, an output signal of another programmable logic circuit, an output signal of the own programmable logic circuit, an output signal of a configuration-data server 412 connected to the own programmable logic circuit, an output signal of the configuration-data server 412 connected to another programmable logic circuit, or an output signal of an outside control unit 413 may be provided to a desired programmable logic circuit as the configuration data. Accordingly, by an instruction produced from a given programmable logic circuit (including the own programmable logic circuit), the configuration-data server 412, or the outside control unit 413, some or all of the logic functions of the desired programmable logic circuit may be changed at any time.

Figure 59:
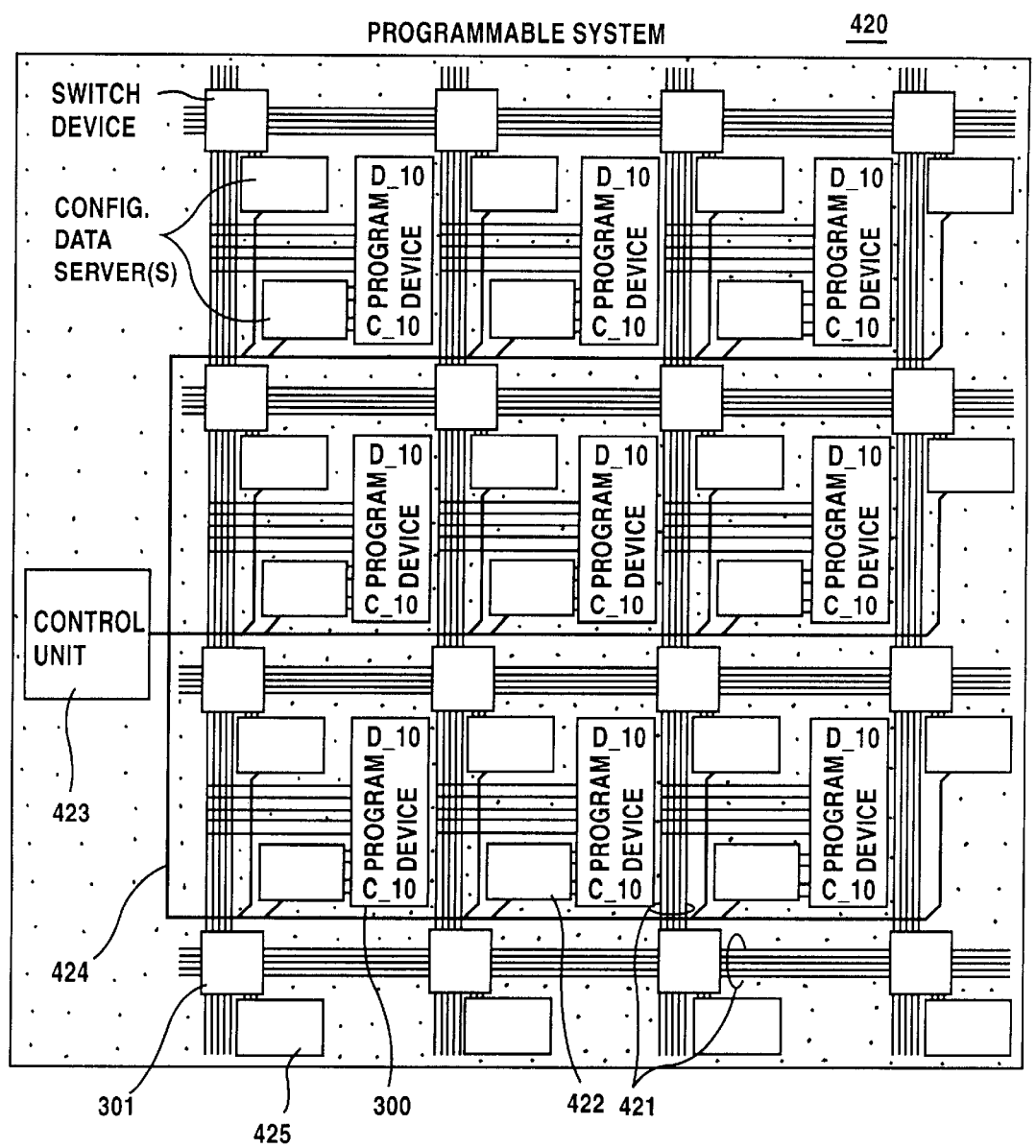
FIG. 59 shows a twelfth configuration example of the programmable-logic-circuit system according to the present invention.

FIG. 59 shows a twelfth configuration example of the programmable-logic-circuit system according to the present invention. In FIG. 59, a programmable-logic-circuit system 420 has substantially the same configuration as that of the eighth configuration example shown in FIG. 55. However, with the programmable-logic-circuit system 420 shown in FIG.59, different from the eighth configuration example shown in FIG. 55, configuration-data servers 425 are respectively connected to the switch devices 301. Further, a control unit 423 is connected to the respective configuration-data servers 422 provided in the programmable logic circuits 300 and the respective configuration-data servers 425 provided with the switch devices 301 through a dedicated control line 424, and controls all the respective configuration-data servers 422, 425 like a central control operation.

Therefore, in the twelfth configuration example, even when the programmable-logic-circuit system is operating, an output signal of the configuration-data server 422 may be provided to the corresponding programmable logic circuit 300 as the configuration data. An output signal of the configuration-data server 425 may be provided to the corresponding switch device 301 as the configuration data. An output signal of the control unit 423 may be provided to the desired programmable logic circuit 300 and the desired switch device 301 as the configuration data.

Accordingly, by an instruction produced from the own programmable logic circuit, the configuration-data servers 422, 425, or the control unit 423, some or all of the logic function of the programmable function unit of the desired programmable logic circuit and the connection structure of the desired switch device may be changed at any time.

Figure 60:
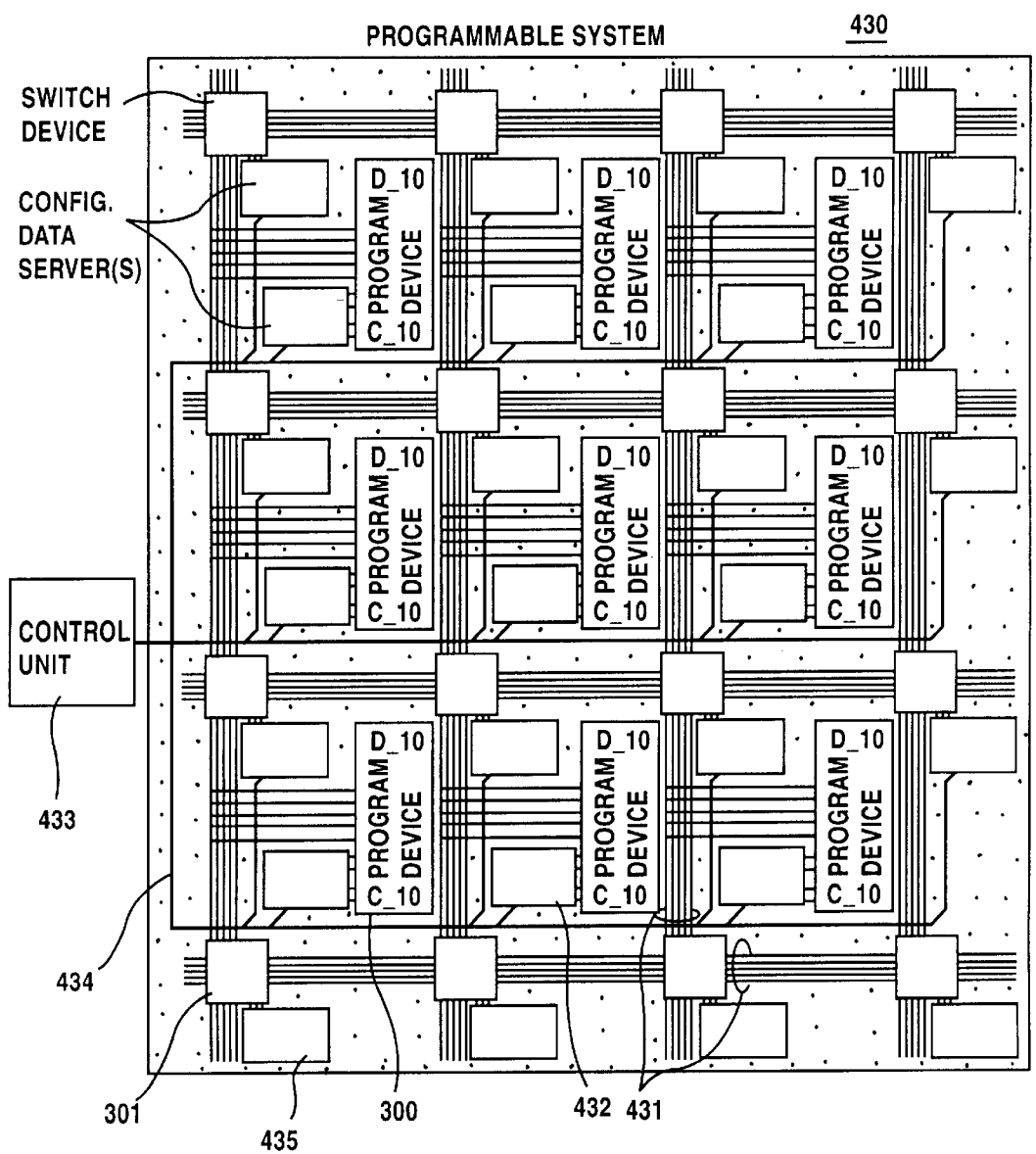
FIG. 60 shows a thirteenth configuration example of the programmable-logic-circuit system according to the present invention.

FIG. 60 shows a thirteenth configuration example of the programmable-logic-circuit system according to the present invention. In FIG. 60, a programmable-logic-circuit system 430 has substantially the same configuration as that of the ninth configuration example shown in FIG. 56. However, in the programmable-logic-circuit system 430 shown in FIG. 60, different from the ninth configuration example shown in FIG. 56, configuration-data servers 435 are respectively connected to the switch devices 301. Further, a control unit 433 is connected to the respective configuration-data servers 432 provided with the programmable logic circuits 300 and the respective configuration-data servers 435 provided with the switch devices 301 through a dedicated control line 434, and controls all the respective configuration-data servers 432, 435 like a central control operation.

Therefore, in the twelfth configuration example, even when the programmable-logic-circuit system is operating, an output signal of the configuration-data server 432 may be provided to the corresponding programmable logic circuit 300 as the configuration data. An output signal of the configuration-data server 435 may be provided to the corresponding switch device 301 as the configuration data. An output signal of an outside control unit 433 may be provided to the desired programmable logic circuit 300 and the desired switch device 301 as the configuration data.

Accordingly, by an instruction produced from the own programmable logic circuit, the configuration-data servers 432, 435, or the outside control unit 433, some or all of the logic functions of the desired programmable logic circuit and the connection structure of the desired switch device may be changed at any time.

In the above-discussed programmable logic circuits and programmable-logic-circuit systems shown in FIG. 35 to FIG. 60, for the configuration memory of each programmable logic circuit, a conventional set-reset shift register as well as the shift register according to the present invention is usable.

Figure 61:
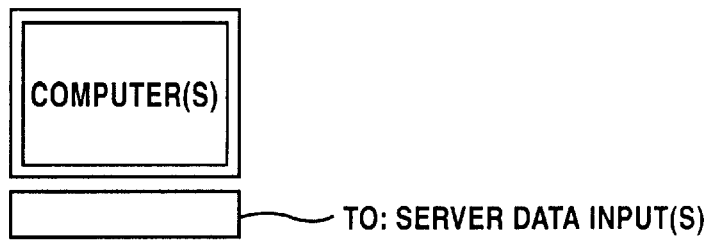
FIG. 61 shows a first configuration example of the configuration data server used in the programmable logic circuits and the programmable-logic-circuit systems shown in FIG. 35 to FIG. 60.

FIG. 61 shows a first configuration example of the configuration data server used in the programmable logic circuits and the programmable-logic-circuit systems shown in FIG. 35 to FIG. 60. A configuration data server 500 shown in FIG. 61 is realized by a computer. Therefore, the configuration data may be easily generated, and may be produced at a desired time.

Figure 62:
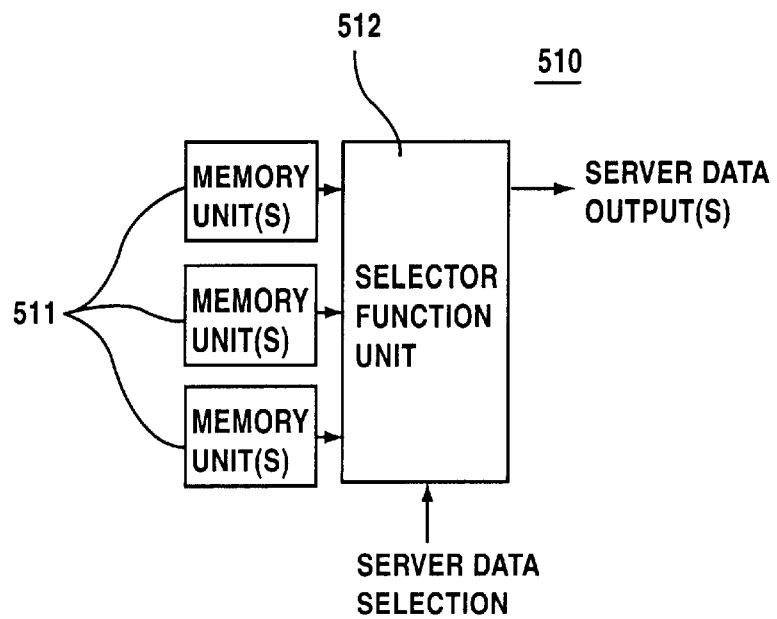
FIG. 62 shows a second configuration example of the configuration data server used in the programmable logic circuits and the programmable-logic-circuit systems shown in FIG. 35 to FIG. 60.

FIG. 62 shows a second configuration example of the configuration data server used in the programmable logic circuits and the programmable-logic-circuit systems shown in FIG. 35 to FIG. 60. A configuration data server 510 shown in FIG. 62 is constructed with a memory unit 511 for storing a plurality of configuration data sets, and a selector function unit 512 for selecting one from the plurality of configuration data sets in the memory unit 511. Therefore, the configuration data server 510 may be simplified.

Figure 63:
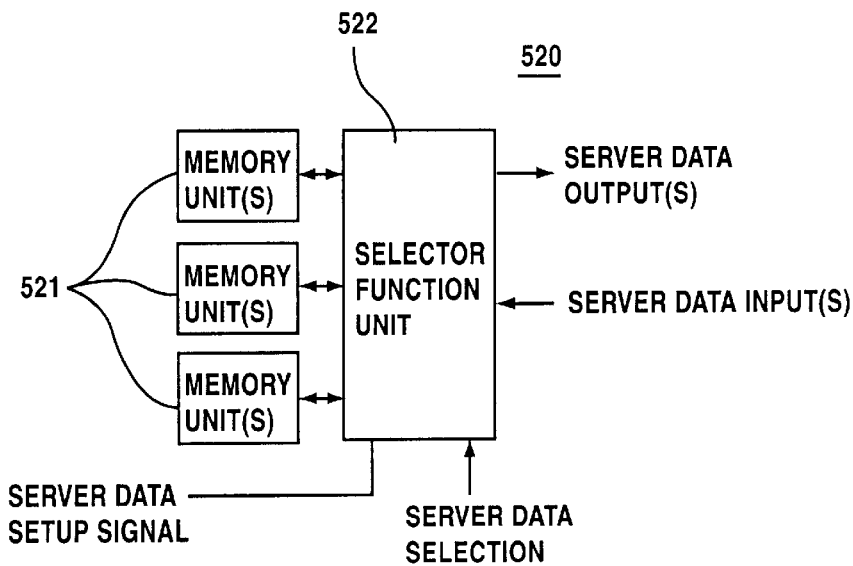
FIG. 63 shows a third configuration example of the configuration data server used in the programmable logic circuits and the programmable-logic-circuit systems shown in FIG. 35 to FIG. 60.

FIG. 63 shows a third configuration example of the configuration data server used in the programmable logic circuits and the programmable-logic-circuit systems shown in FIG. 35 to FIG. 60. A configuration data server 520 shown in FIG. 63 is constructed with a memory unit 521 for storing a plurality of configuration data sets, and a selector function unit 522 for selecting one from the plurality of configuration data sets in the memory unit 521. However, different from the configuration data server 510 shown in FIG. 62, by a server data setup signal, the configuration data (server data) may be selectively written into the memory unit 521 from an outside circuit through the selector function unit 522.

Figure 64:
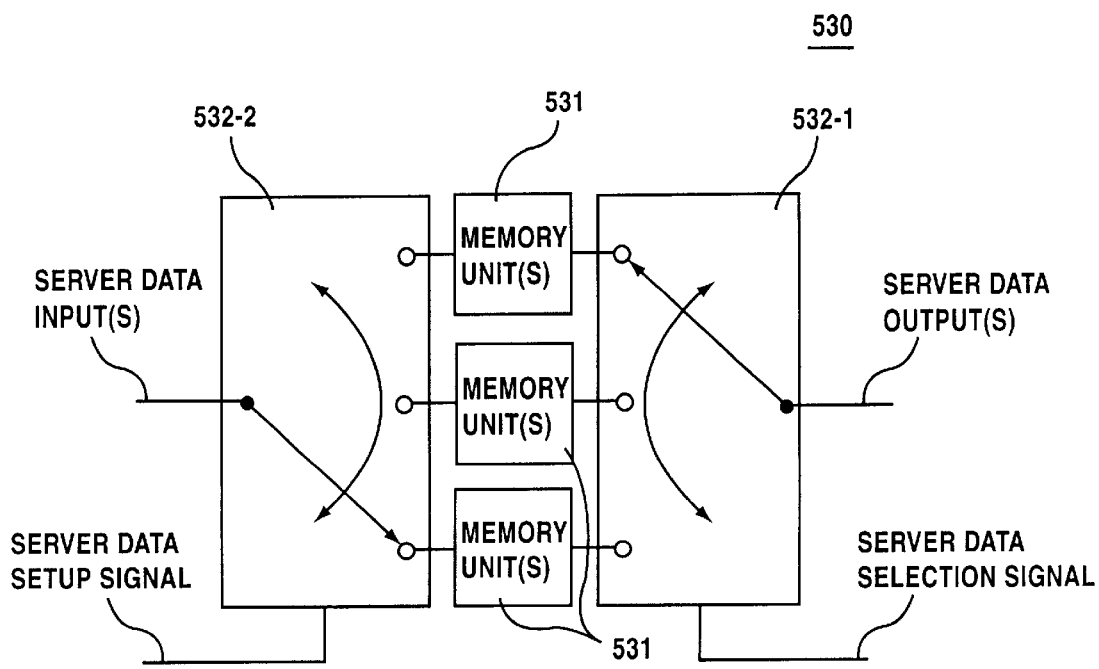
FIG. 64 shows a detailed configuration example of the configuration data server shown in FIG. 63.

FIG. 64 shows a detailed configuration example of the configuration data server shown in FIG. 63. A configuration data server 530 shown in FIG. 64 is constructed with a memory unit 531 for storing a plurality of configuration data sets, a read selection unit 532-1, and a write selection unit 532-2 for writing data into one of memories in the memory unit 531.

The read selection unit 532-1 has substantially the same function as that of the selector function unit 512 shown in FIG. 62, and selects one from a plurality of configuration data sets in the memory unit 531 to be externally produced by the server data selection signal.

The write selection unit 532-2 selects one of the memories in the memory unit 531 and stores the configuration data input (server data input) in the selected memory by the server data setup signal.

In the above-discussed configuration data server 530, as shown in FIG. 64, while the configuration data is read from one of the memories, new configuration data may be written into another memory. Therefore, different configuration data may be efficiently provided to the dynamically re-programmable logic circuit and the dynamically re-programmable-logic-circuit system at any time.

The above-discussed shift registers and programmable logic circuits may be easily formed in an gate array. Further, since a high speed operation of the shift register according to the present invention may be achieved, the shift register may be used for a conventional logic circuit using a shift register. Further, since the logic circuit may be re-programed during the operation of the programmable logic circuit, the programmable logic circuit according to the present invention may be used for all devices which can be modeled in a cell-structure automaton such as a fault tolerant system or a multiprocessor system.

Further, the present invention is not limited to these embodiments, but other variations and modifications may be made without departing from the scope of the present invention.

What is claimed is:

1. A programmable logic circuit programming a desired circuit function according to configuration data, said programmable logic circuit comprising a plurality of partial circuits, wherein during operation of said programmable logic circuit, when a control signal is applied to at least one partial circuit in said programmable logic circuit, a circuit function previously realized in said at least one partial circuit is changed to another circuit function without influencing an operation of other partial circuits in an operating condition, wherein said partial circuit comprises at least one of a logic cell generating a logic function, a switch box generating a connecting function of the plurality of partial circuits, and an I/O module generating a data input-and-output function, wherein said logic cell comprises an output-data holding circuit located at an output of said logic cell and provided with a feedback path, said output-data holding circuit holding output data of said logic cell for combinational and sequential circuits, and wherein when said programmable logic circuit is operating and when a programmed circuit function in said logic cell being changed, said output data of the circuit cell is held by the output-data holding circuit so as to prevent from influencing other partial circuits in an operating condition.

2. The programmable logic circuit as claimed in claim 1, wherein said partial circuit comprises at least one of a logic cell generating a logic function, a switch box generating a connecting function of the plurality of partial circuits, and an I/O module generating a data input-and-output function.

3. The programmable logic circuit as claimed in claim 1, further comprising at least one configuration-data server providing configuration data to at least one of said partial circuits through one of a dedicated wire line and a programmable wire line.

4. The programmable logic circuit as claimed in claim 3, wherein said configuration-data server comprises means capable of changing stored configuration data to other configuration data in response to a signal produced from one of another circuit cell and an external device.

5. The programmable logic circuit as claimed in claim 3, wherein said configuration-data server is provided for each partial circuit.

6. The programmable logic circuit as claimed in claim 1, wherein at least one of said partial circuits comprises a storage device storing a plurality of configuration data, wherein when said plurality of configuration data are switched by an external control signal, a previously programed circuit function in said partial circuit is instantaneously changed to another circuit function.

7. The programmable logic circuit as claimed in claim 6, further comprising means changing at least one of said plurality of configuration data stored in said storage device to other configuration data in response to a signal produced from one of another circuit cell and an external device.

8. The programmable logic circuit as claimed in claim 1, further comprising an interface connecting to said programmable logic circuit at least one external configuration-data server which provides configuration data to at least one of said plurality of partial circuits.

9. The programmable logic circuit as claimed in claim 1, further comprising a control device selecting a given partial circuit from said plurality of partial circuits through one of a dedicated wire line and a programmable wire line, and selectively changing a circuit function of said given partial circuit to another circuit function.

10. The programmable logic circuit as claimed in claim 1, further comprising an interface connecting to said programmable logic circuit an external control device which selects a given partial circuit from said plurality of partial circuits and selectively changes a circuit function of said given partial circuit to another circuit function.

11. The programmable logic circuit as claimed in claim 1, wherein said output-data holding circuit is programed in said logic cell during a time period when the circuit function of said logic cell is being changed.

12. The programmable logic circuit as claimed in claim 1, wherein said output-data holding circuit comprises one of a flip-flop circuit and a latch circuit.

13. A programmable logic circuit programming a desired circuit function according to configuration data, said programmable logic circuit comprising a plurality of partial circuits, wherein during operation of said programmable logic circuit, when a control signal is applied to at least one partial circuit in said programmable logic circuit, a circuit function previously realized in said at least one partial circuit is changed to another circuit function without influencing an operation of other partial circuits in an operating condition,
wherein said partial circuit comprises at least one of a logic cell generating a logic function, a switch box generating a connecting function of the plurality of partial circuits, an an I/O module generating a data input-and-output function,
wherein said logic cell comprises an output-data holding circuit for holding output data of said logic cell, and wherein when said programmable logic circuit is operating and when a programmed circuit function in said logic cell being changed, said output data of the circuit cell is held by the output-data holding circuit so as to prevent from influencing other partial circuits in an operating condition, said programmable logic circuit further comprising
a configuration memory storing first configuration data externally supplied with a clock and having a shift register in which second configuration data is directly set;
a programmable function unit determining logic function according to configuration data set in said configuration memory; and
a memory controller supplying said second configuration data to said configuration memory by an instruction from outside of said logic cell;
wherein when said programmable logic circuit is operating and when said second configuration data is supplied from said memory controller to said configuration memory, a logic function of said programmable function unit determined by said first configuration data is changed to another logic function determined by said second configuration data.

14. The programmable logic circuit as claimed in claim 13, wherein said shift register comprises a chain-latch-structure shift register.

15. The programmable logic circuit as claimed in claim 14, wherein said second configuration data supplied to said memory controller is generated based on an output signal from another logic cell.

16. A programmable-logic-circuit system programming a desired circuit function according to configuration data, said programmable-logic-circuit system comprising a plurality of second partial circuits which respectively include programmable logic system, when a control signal is applied to at least one second partial circuit in the programmable-logic-circuit system, a circuit function previously realized in said at least one second partial circuit is changed to another circuit function without influencing an operation of other second partial circuits in an operating condition,
wherein said at least one second partial circuit comprises at least one of a logic cell generating a logic function, a switch box generating a connecting function of the plurality of partial circuits, and an I/O module generating a data input-and-output function,
wherein said logic cell comprises an output-data holding circuit located at an output of said logic cell and provided with a feedback path, said output-data holding circuit holding output data of said logic cell for combinational and sequential circuits, and wherein when said programmable logic circuit is operating and when a programmed circuit function in said logic cell being changed, said output data of the circuit cell is held by the output-data holding circuit so as to prevent from influencing other partial circuits in an operating condition.

17. The programmable-logic-circuit system as claimed in claim 16, wherein said second partial circuit comprises a plurality of switch devices generating a connecting function of a plurality of programmable logic circuits, and a plurality of I/O modules generating data input-and-output function.

18. The programmable-logic-circuit system as claimed in claim 16, further comprising at least one configuration-data server providing configuration data to at least one of said second partial circuits through one of a dedicated wire line and a programmable wire line.

19. The programmable-logic-circuit system as claimed in claim 18, wherein said configuration-data server comprises means capable of changing stored configuration data to another configuration data in responses to a signal produced from one of another programmable logic circuit and an external device.

20. The programmable-logic-circuit system as claimed in claim 18, wherein said configuration-data server is provided for each second partial circuit.

21. The programmable-logic-circuit system as claimed in claim 16, wherein at least one of said second partial circuits comprises a storage device storing a plurality of configuration data, wherein when said plurality of configuration data are switched by an external control signal, a previously programed circuit function in said second partial circuit is instantaneously changed to another circuit function.

22. The programmable-logic-circuit system as claimed in claim 21, further comprising means changing at least one of said plurality of configuration data stored in said storage device to other configuration data in response to a signal produced from one of another second partial circuit and an external device.

23. The programmable-logic-circuit system as claimed in claim 16, further comprising an interface connecting to said programmable-logic-circuit system at least one external configuration-data server which provides configuration data to at least one of said plurality of second partial circuits.

24. The programmable-logic-circuit system as claimed in claim 16, further comprising a control device selecting a given second partial circuit from said plurality of second partial circuits through one of a dedicated wire line and a programmable wire line, and selectively changing a circuit function of said given second partial circuit to another circuit function.

25. The programmable-logic-circuit system as claimed in claim 16, further comprising an interface connecting to said programmable-logic-circuit system an external control device which selects a given second partial circuit from said plurality of second partial circuits and selectively changes a circuit to another circuit function.

* * * * *